United States Patent [19]

Kimura et al.

[11] Patent Number: 4,972,572
[45] Date of Patent: Nov. 27, 1990

[54] IC SHEET CUTTING PRESS AND IC SHEET PROCESSING APPARATUS USING THE SAME

[75] Inventors: Tatsuo Kimura, Yuki; Yukio Kato, Oyama; Sousuke Yamada, Yuki; Kunio Kato, Shimotsuga; Masao Matsumoto, Oyama; Shigeo Arai, Yuki; Michio Takebe, Yuki; Terukazu Kawarada, Yuki; Haruo Masaki, Oyama, all of Japan

[73] Assignee: Fujitsu Limited, Kawasaki, Japan

[21] Appl. No.: 929,781

[22] Filed: Nov. 13, 1986

[30] Foreign Application Priority Data

| Nov. 13, 1985 | [JP] | Japan | 60-252644 |
| Nov. 13, 1985 | [JP] | Japan | 60-252645 |
| Nov. 14, 1985 | [JP] | Japan | 60-253815 |
| Jan. 7, 1986 | [JP] | Japan | 61-182 |
| Jan. 20, 1986 | [JP] | Japan | 61-7944 |
| Jan. 20, 1986 | [JP] | Japan | 61-7945 |
| Jan. 20, 1986 | [JP] | Japan | 61-7947 |
| Jan. 20, 1986 | [JP] | Japan | 61-7949 |
| Mar. 18, 1986 | [JP] | Japan | 61-58210 |

[51] Int. Cl.$^5$ ............................................. H05K 13/02
[52] U.S. Cl. ................................. 29/564.3; 29/566.2; 83/278; 140/105
[58] Field of Search ............... 29/564.3, 564.6, 566.2, 29/335, 33 Q, 564.8, 565, 566; 140/105; 83/214, 225, 255, 228, 271, 405, 925 R

[56] References Cited

U.S. PATENT DOCUMENTS

| 764,851 | 7/1904 | Hutchins | 83/278 |
| 3,469,754 | 9/1969 | Parker | 83/278 X |
| 3,650,232 | 3/1972 | Heinlen | 113/1 |
| 3,722,060 | 3/1973 | Gaiser | 29/203 |
| 3,745,808 | 7/1973 | Hosaka | 72/405 |
| 3,866,471 | 2/1975 | Carroll et al. | 72/337 |
| 4,064,917 | 12/1977 | Diaz | 140/105 |
| 4,099,322 | 7/1978 | Tait | 29/623 |
| 4,236,301 | 12/1980 | Hug et al. | 29/564.6 X |
| 4,619,028 | 10/1986 | Neuenschwander | 29/33 Q X |

FOREIGN PATENT DOCUMENTS 1488830 7/1967 France .

Primary Examiner—Z. R. Bilinsky
Attorney, Agent, or Firm—Staas & Halsey

[57] ABSTRACT

An IC sheet cutting press performs a series of press cutting operations to separate ICs from an IC sheet while feeding the IC sheet stepwise. In the IC sheet cutting press, a series of press molds and an IC feed mechanism are mounted on a common die set to constitute a single press mold unit. When a different type of IC sheet is to be machined, the entire press mold unit can be exchanged with another one, so that various adjustments, e.g., adjustment of arrangement intervals of the press molds or a feed interval of the IC sheet can be omitted, and the operating efficiency of the cutting press and hence the compatibility are improved.

An IC sheet processing apparatus, in which the IC sheet cutting press described aboved is combined with an automatic IC sheet loading unit, an IC lead bending press, and an IC storage unit for storing ICs after the lead bending operation, allows automatic IC sheet processing including the cutting operation of ICs from the IC sheet over a long period to time.

4 Claims, 53 Drawing Sheets

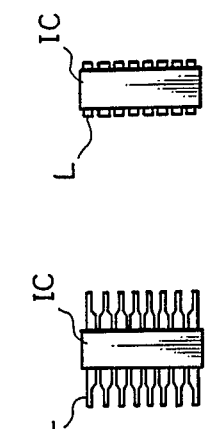
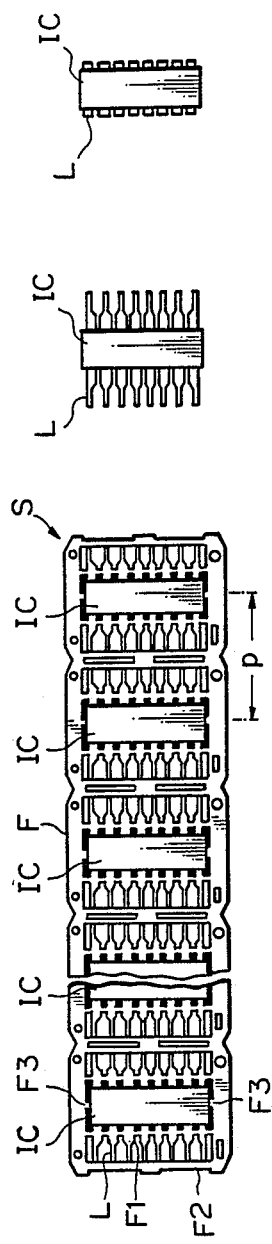
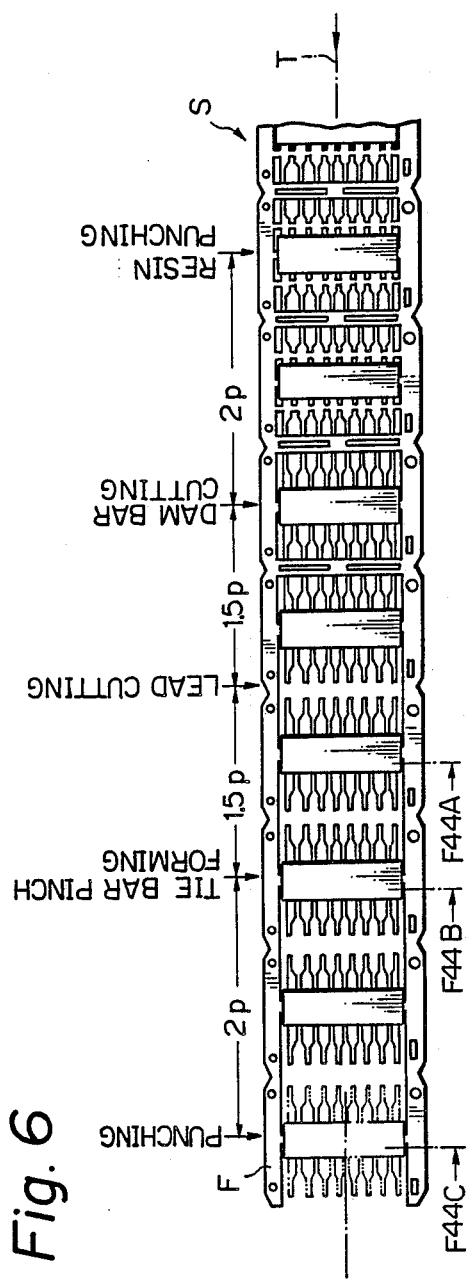

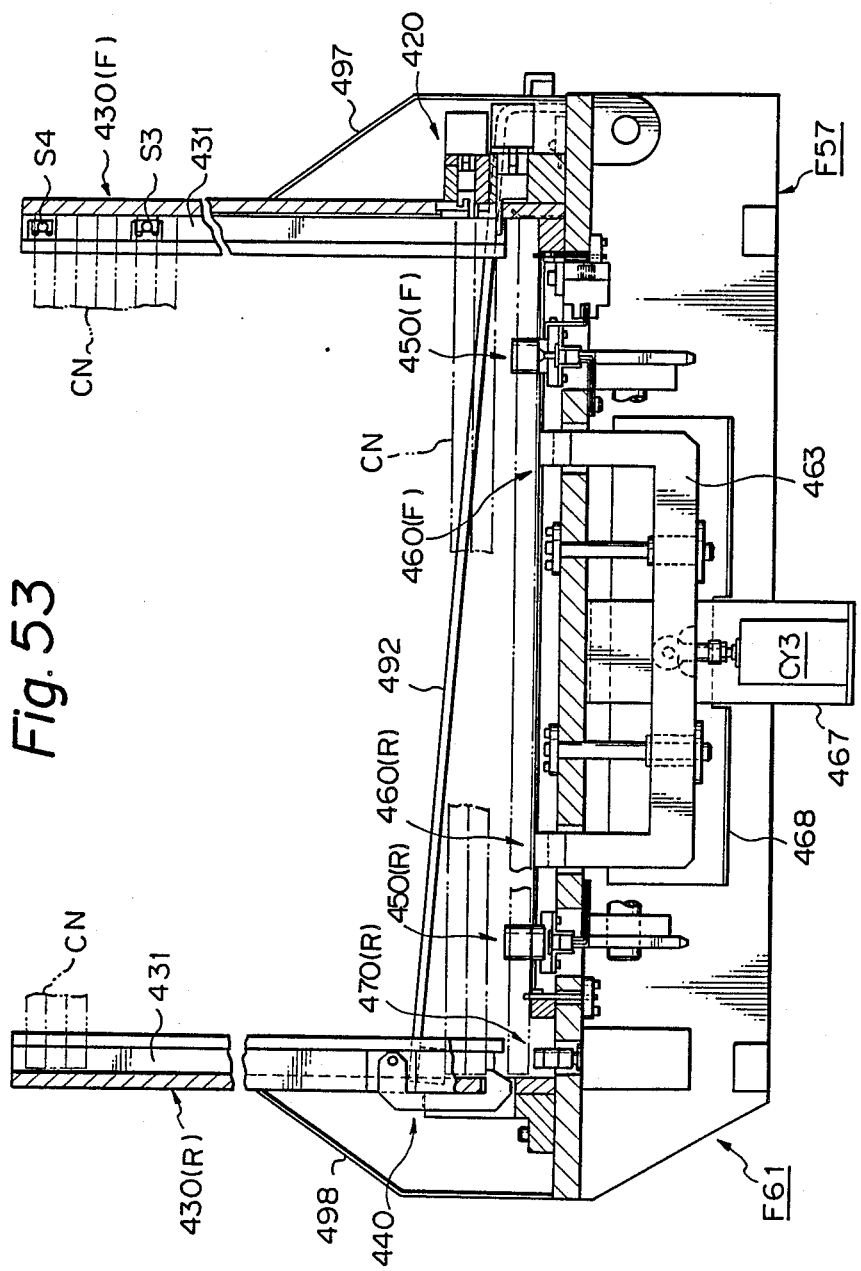

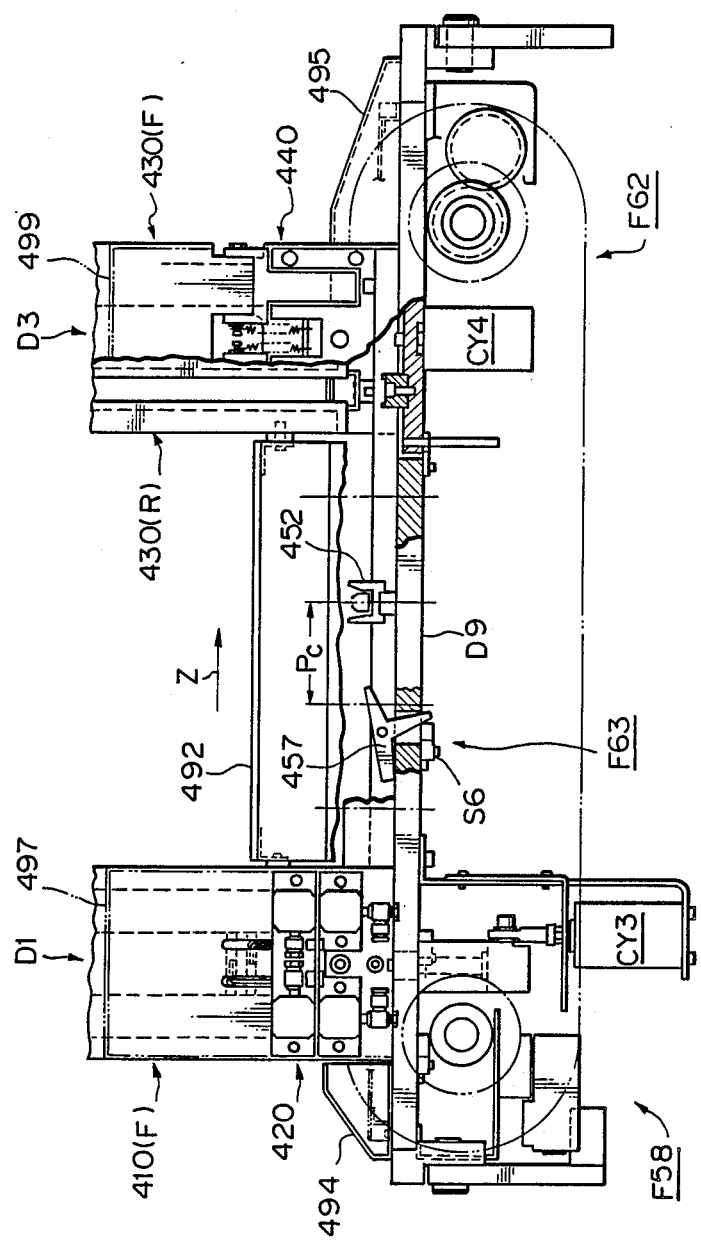

IC SHEET CUTTING PRESS AND IC SHEET PROCESSING APPARATUS USING THE SAME

BACKGROUND OF THE INVENTION

1. Field of the Invention

The present invention relates to an IC (Integrated Circuit) manufacturing apparatus, particularly, a machining apparatus for an IC sheet wherein a plurality of ICs are coupled through lead frames and, more particularly, to an IC sheet cutting press for cutting ICs from an IC sheet and an IC processing apparatus using the same.

A typical IC sheet manufacturing process includes a process for cutting ICs from an IC sheet, or a procedure of bending lead terminals of ICs after the ICs are cut from an IC sheet. An IC sheet cutting press is used for cutting ICs from an IC sheet in such an IC sheet manufacturing process.

2. Description of the Related Art

When an IC cutting process is performed using a press, it is difficult to cut ICs through a single press machining process due to the structure of an IC sheet, and thus a plurality of steps of press machining are generally required. For this reason, in an IC sheet cutting press, a series of a plurality of types of press molds (cutting molds) are arranged along an IC sheet feed path, and a series of press machining steps are performed while the IC sheets are fed stepwise.

In a conventional IC sheet cutting press, press molds for the respective press machining steps are independent of each other, and are individually positioned and mounted on a press table. An IC sheet feed mechanism is independent of the press molds, and is separately positioned and mounted on the frame of the press independently of the cutting molds.

As is well known, there are a large number of types of ICs and, hence, there are a large number of types of IC sheets. When an IC sheet cutting press is converted for machining another type of IC sheet, various adjustment operations, e.g., for changing of press molds, or changing feeding intervals between adjacent press molds or changing feeding interval of the IC sheet, and the like, are required.

However, in the conventional IC cutting press, since the respective press molds and the IC sheet feed mechanism are independent of each other, the above-mentioned adjustment operations are very complicated, and require much labor and time even for skilled workers. Therefore, the IC sheet cutting press must be stopped for a long period of time, thus lowering work efficiency and productivity. For this reason, even if the IC sheet cutting press is a general-purpose type, it often must be especially used for machining a given type of IC sheet, thus impairing practical compatibility.

Meanwhile, a so-called progressive mold (cut-and-feed mold or multistage transfer mold) is known as a type of press mold wherein a plurality of dies and punches and a workpiece feed mechanism are mounted on a single die set, and a series of press machinings can be successively performed while the workpieces are fed stepwise. The progressive mold advantageously requires no complex adjustment operation since the entire mold is replaced for machining another type of workpiece. However, the dies, the punches, and the workpiece feed mechanism cannot be separately mounted or removed or modified. Even when only some of them need be exchanged or modified, another mold must be prepared. Therefore, in an IC sheet cutting press for machining a large number of types of IC sheets, it is disadvantageous to adopt the progressive mold in terms of a mold manufacturing cost.

SUMMARY OF THE INVENTION

It is an object of the present invention to provide an IC sheet cutting press using a press mold which has advantageously employs a progressive mold and is advantageous in terms of manufacturing cost.

It is another object of the present invention to provide an IC sheet processing apparatus for processing various types of IC sheets using an IC sheet cutting press.

In an IC sheet cutting press of the present invention, a plurality of types of press molds for performing a series of press cutting operations and an IC sheet feed mechanism for feeding IC sheets stepwise are separately detachably mounted on a common die set to present a single press mold unit.

The press mold unit performs a series of press cutting operations while IC sheets are fed stepwise, thus cutting ICs from a lead frame.

When different types of IC sheets are to be machined, the press mold unit can be entirely exchanged with another press mold unit. Since the press molds and the IC sheet feed mechanism need not be positioned separately, replacement can be performed easily within a short period of time. In this case, if different press mold units are provided with standardized attachment means for fixing the unit to a press table and coupling the unit to a press ram, the exchange operation can be standardized and can be easily carried out by unskilled workers. As a result, the down time of the IC cutting press can be shortened, thus minimizing reduction of operation efficiency and permitting realization of high productivity. The IC sheet cutting press can be easily converted for machining another type of IC sheet, resulting in high flexibility.

In the press mold unit of the present invention, the press molds and the IC sheet feed mechanism are detachably mounted on the die set and can be individually exchanged. Therefore, if a plurality of types of die sets, press molds, and IC sheet feed mechanisms are prepared and are selectively combined, various press mold units can be assembled. Therefore, different press units need not be prepared for each different type of IC sheet, resulting in a low mold manufacturing cost.

In addition, when an apparatus for automatically loading IC sheets to the IC sheet cutting press, a press for bending lead terminals of separated ICs, and an apparatus for storing the ICs after the lead terminal bending process, are appropriately combined, an IC processing apparatus capable of automatically performing IC sheet processing including cutting of ICs from an IC sheet for a long period of time can be realized.

The present invention will be described hereinafter in detail based on the preferred embodiments with reference to the accompanying drawings.

BRIEF DESCRIPTION OF THE DRAWINGS

FIGS. 5 to 8 show an IC sheet and IC sheet processing steps, in which:

FIG. 5 is a plan view of an IC sheet;

FIG. 6 is a plan view showing an IC sheet after a cutting process;

FIG. 7 is a plan view of an IC cut from the IC sheet; and,

FIG. 8 is a plan view of an IC after a lead terminal bending process;

FIGS. 9 to 22 show an IC sheet loader, in which:

FIG. 9 is a perspective view of the outer appearance of the loader;

FIG. 10 is a side view of the loader;

FIG. 11 is a plan view of the loader;

FIG. 12 is a partially enlarged plan view of a magazine feed mechanism;

FIGS. 13 and 14 are plan views of two different types of magazines;

FIGS. 15, 16, and 17 are, respectively, a front view, a partially sectional plan view, and a partially sectional side view of an IC sheet feeding section;

FIG. 18 is a partially sectional front view of an IC sheet suction head;

FIG. 19 is a sectional view taken along a line F19—F19 in FIG. 18;

FIGS. 20 and 21 are, respectively, a front view and a partially sectional side view of a stopper disk; and FIG. 22 is an exploded view for explaining the operation of the IC sheet loader;

FIGS. 23 to 43 show an IC sheet cutting press, in which:

FIG. 23 is an exploded perspective view of a principal part of the press;

FIG. 24 is a plan view of a lower mold with a sheet guide assembly mounted thereon;

FIGS. 25, 26, and 27 are, respectively, a partially sectional front view, a partially cutaway left-side view, and a partially sectional right-side view of a lower mold;

FIG. 28 is a sectional view taken along a line F28—F28 in FIG. 25;

FIGS. 29, 30, 31, and 32 are, respectively, a plan view, a partially sectional front view, a partially sectional left-side view, and a partially sectional right-side view of an upper mold;

FIG. 33 is a plan view of a feed rod assembly and an ejector of an IC sheet feed mechanism;

FIG. 34 and 35 are, respectively, a partially cutaway front view and a right-side view of the feed rod assembly;

FIG. 36 is a partially sectional side view taken along a line F36—F36 in FIG. 34;

FIG. 37 is a partially sectional side view taken along a line F37—F37 in FIG. 34;

FIG. 38 is a left-side view of the feed rod assembly;

FIG. 39 is an enlarged sectional side view taken along a line F39—F39 in FIG. 34;

FIG. 40 is a front view of the ejector;

FIGS. 42 and 43 are, respectively, a partially sectional side view and a bottom view of a tie-bar pinch forming punch;

FIGS. 45 to 49 show an IC lead bending press, in which:

FIGS. 45 and 46 are, respectively, a partially sectional front view and a partially sectional side view of a press mold unit;

FIG. 47 is a top view of an upper mold of the press mold unit;

FIG. 48 is a top view of a lower mold by the press mold unit; and,

FIG. 49 is a view showing a principal part of the press mold unit and a lead bending operation; and, FIGS. 50 to 66, show an IC unloader, in which:

FIGS. 52A and 52B are plan views of the IC unloader in which FIG. 52A shows its rear half and FIG. 52B shows its front half;

FIG. 53 is a partially sectional or cutaway left-side view of the, IC unloader;

FIG. 54 is a partially sectional or cutaway front view of the IC unloader;

DESCRIPTION OF THE PREFERRED EMBODIMENTS

The preferred embodiments of the present invention will be described with reference to an IC sheet processing apparatus which automatically performs cutting of ICs from an IC sheet and bending of lead terminals of the cut ICs for extended periods of time.

FIGS. 1 to 4 show an IC sheet processing apparatus, which basically comprises an IC sheet loader A, an IC sheet cutting press B, an IC sheet bending press C, and an IC unloader D.

In the IC sheet loader A, a large number of magazines M each storing a large number of the IC sheets S shown in FIG. 5 are stocked in a magazine stock section A1, and the IC sheets S are picked up from each magazine M one by one and fed to the IC sheet cutting press B by an IC sheet feeding section A2.

The IC sheet cutting press B performs a series of press machining operations with respect to the IC sheet S to separate ICs therefrom, as shown in FIG. 6.

The IC lead bending press C bends lead terminals L of the ICs separated from the IC sheet shown in FIG. 7, as shown in FIG. 8.

The IC unloader D stores and stocks a large number of ICs after the lead bending process shown in FIG. 8 in a container CN.

Figure 1:
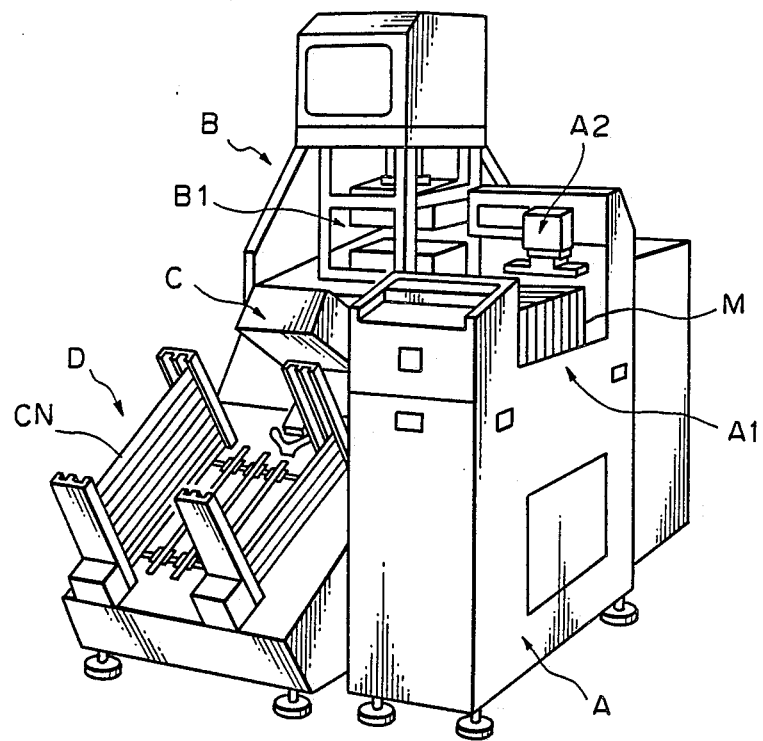
FIGS. 1, 2, 3, and 4 are, respectively, a perspective view, a plan view, a front view, and a partially cutaway left-side view of an IC sheet processing apparatus according to an embodiment of the present invention.
Figure 2:
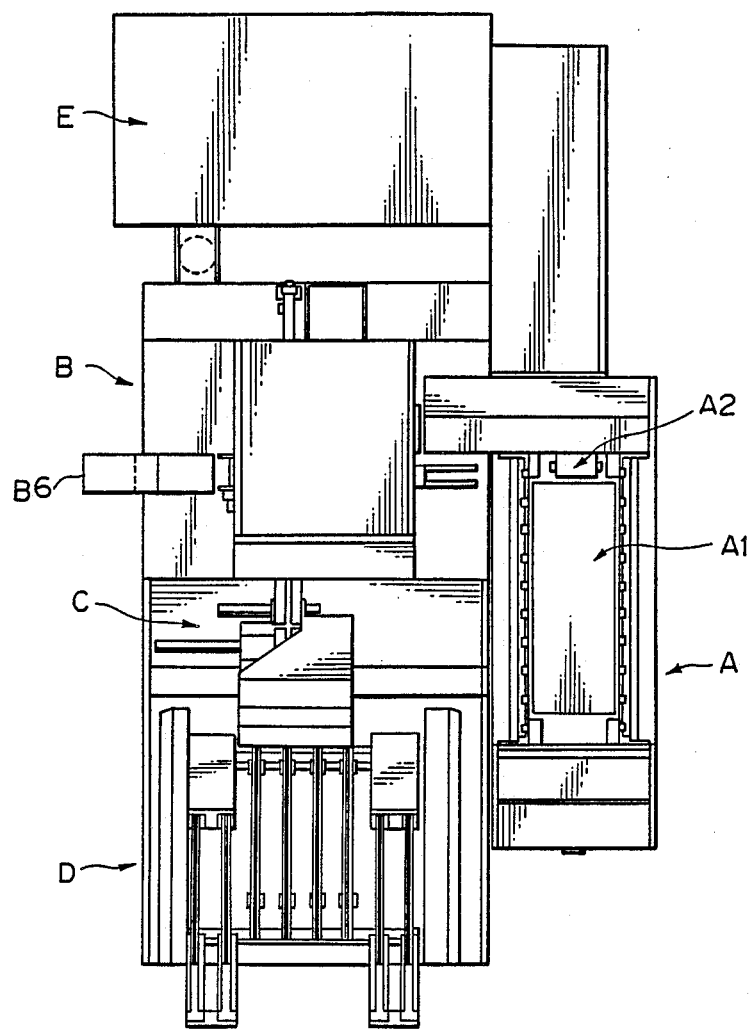
Figure 4:
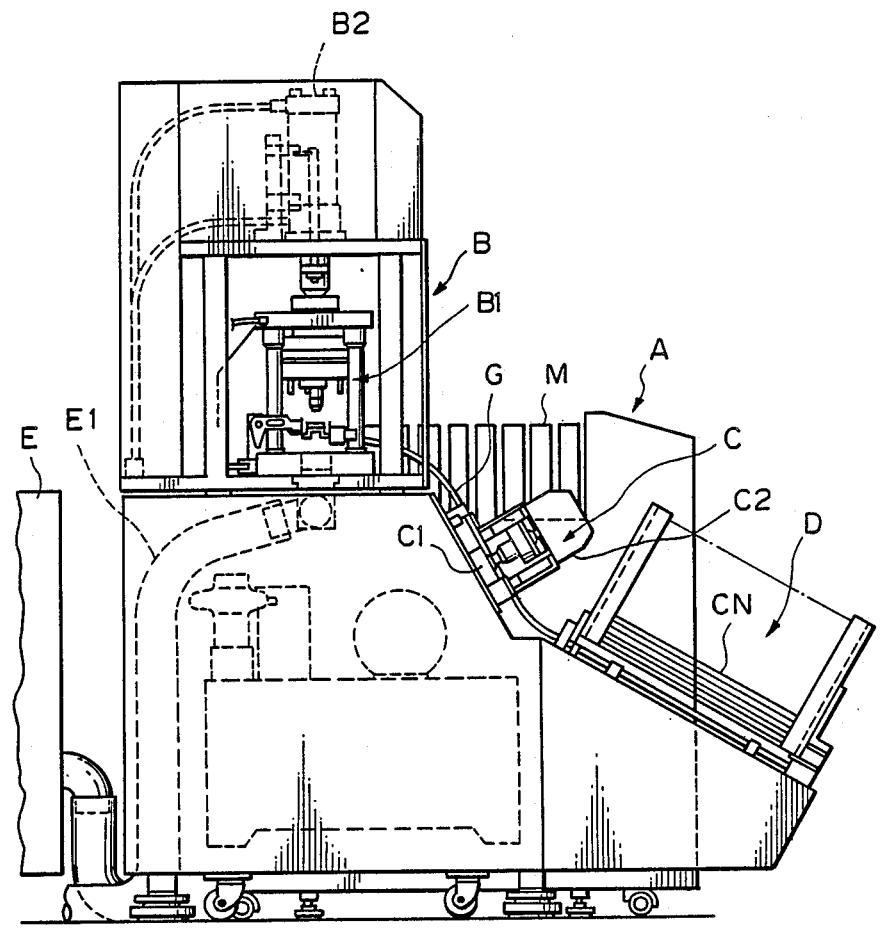

Note that reference symbol E in FIGS. 2 and 4 denotes a dust collector for collecting punched refuse or cutting dust produced during IC sheet cutting in the cutting press B.

The arrangements and operations of the IC sheet S and the respective components A, B, C, and D of the IC sheet processing apparatus will be described separately.

I. IC Sheet

In the IC sheet S shown in FIG. 5, a plurality of DIP (Dual-Inline-Package) type ICs are coupled to each other through a lead frame F. The lead frame F is formed integrally with the lead terminals L, cross bars F1, dam bars F2, and tie bars F3. The dam bar F2 invents flowing of resin leaked from a mold during resin molding to the distal end portions of the lead terminals. The tie bar F3 directly couples the IC package to the lead frame F, and serves to hold the ICs until the last step of the IC sheet cutting process, as will be described later. A large number of holes having different shapes and sizes are formed in the lead frame F to be used for feeding the IC sheet or for position detection.

The ICs are cut from the IC sheet S in such a manner that the IC sheet S is fed stepwise along an IC sheet feed path T at a distance equal to an arrangement interval p of the ICs (FIG. 5) to be subjected to a series of press machining steps, i.e., resin punching, dam bar cutting, lead cutting, tie bar pinch forming, and punching steps.

(i) Resin punching step: Resins leaked to fill regions surrounded by the lead terminals L and the dam bar F2 (indicated by solid portions in FIGS. 5 and 6) are punched.

(iii) Lead cutting step: The frame cross bars F1 are removed to cut off the lead terminals L from the lead frame F. In an IC sheet wherein lead terminals L of adjacent ICs are coupled without being attached through the frame cross bar F1, the lead terminals are cut to be simply separated from each other. In the case of such an IC sheet, since the lead terminals L at the front and rear end portions of the IC sheet are already separated from the frame F, they need not be subjected to the lead cutting step. If cutting is performed, the distal end portions of the lead terminals may be burred, but preferably, the lead cutting step is not performed at the front and rear end portions of the IC sheet S.

(iv) Tie bar pinch forming step: A pinch is formed in the tie bar F3 coupling the IC to the frame F. However, this step is not indispensable and can be omitted.

(v) Punching step: The IC connected to the frame F through the tie bars F3 is punched from the frame F. In this case, when the tie bar pinch forming step is performed, the tie bar F3 can be cut by a small punching force, so that the tie bar F3 will not be burred so that damage to the resin mold can be prevented.

Note that the respective press machining steps are performed at intervals of 1.5p or 2p (p is an arrangement interval of ICs or a feed interval of an IC sheet), as shown in FIG. 6.

II. IC sheet loader

The IC sheet loader A basically has a magazine stock section (to be referred to simply as a "stock section" hereinafter) A1 for storing the magazines M, an IC sheet feeding section A2 for picking up the IC sheets S one by one from a magazine MA located at an IC sheet pickup position TP on one end side of the stock section A1 and feeding the same to the cutting press B, and a magazine returning section A3 for returning an empty magazines, from which the IC sheets S have been picked up, to the end position of the magazine array on the other end side of the stock section A1. Note that reference numeral A4 denotes an operation panel. The arrangement and the operation of the respective sections will be described hereinafter in detail.

(a) Magazine

Figure 13:
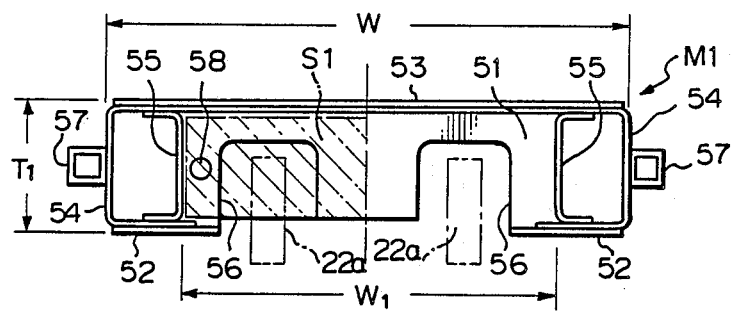
Figure 14:
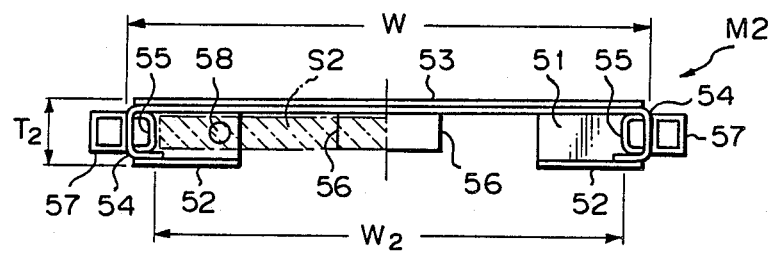
Figure 22:
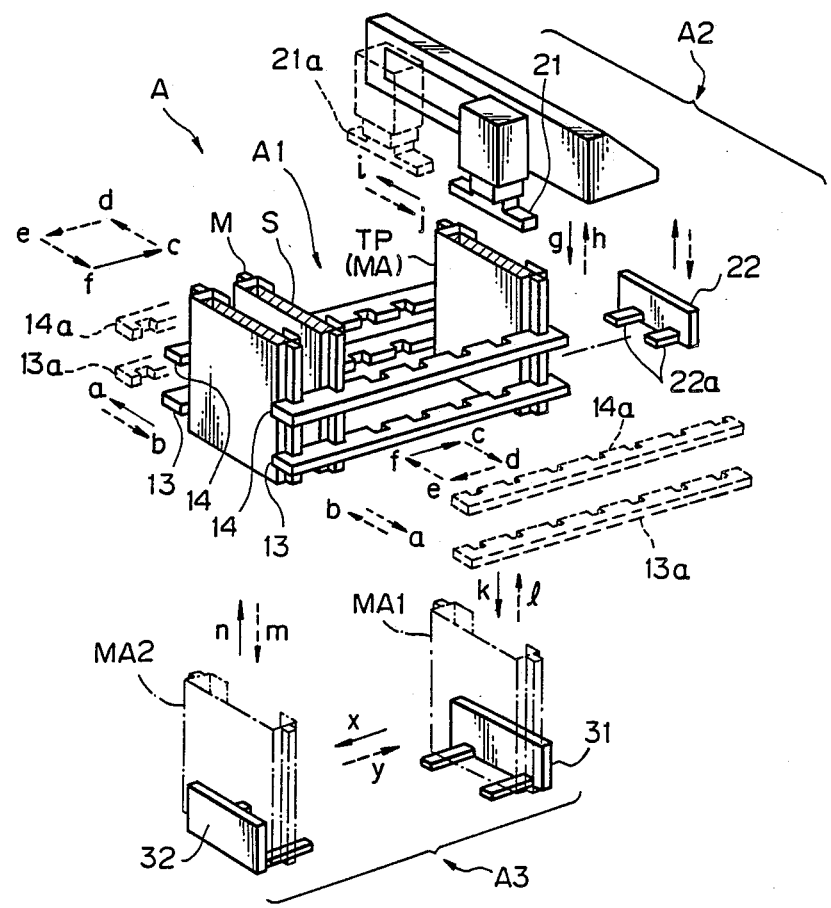

The magazine M has a rectangular parallelpiped shape having a smaller thickness than its height and width, as can be seen from FIG. 22. Since there are various types of IC sheets having different lengths and widths, a number of types of magazines are prepared accordingly. FIGS. 13 and 14 exemplify two types of magazines M1 and M2. However, the basic structure of the magazine M (M1 and M2) is the same, and comprises a bottom plate 51, a front plate 52, a rear plate 53, outer plates 54, and inner plates 55. The magazine M can store the IC sheets S (indicated by reference symbols S1 and S2 in FIGS. 13 and 14 and by imaginary line hatching) to be vertically stacked in a horizontal state. The upper portion of the magazine M has an opening to serve as an IC sheet entrance/exit port, through which the IC sheets S are stored or picked up. The front plate 52 is arranged only at two side portions to open the central portion. Two notches 56 are formed at right and left positions of the bottom plate 51, so that the IC sheets in the magazine M can be lifted up toward the entrance and exit port by pawls 22a of a lift 22 (FIGS. 10, 11, and 22), as will be described later.

In addition, thicknesses T1 and T2 and inner widths W1 and W2 of the magazines M (M1 and M2) are different in accordance with the outer dimensions of the IC sheets S (S1 and S2). However, the magazines M have a common outer width W and a common height, so that any type of magazine can be stored in the stock section A1, as will be described later.

(b) Magazine stock section

Figure 9:
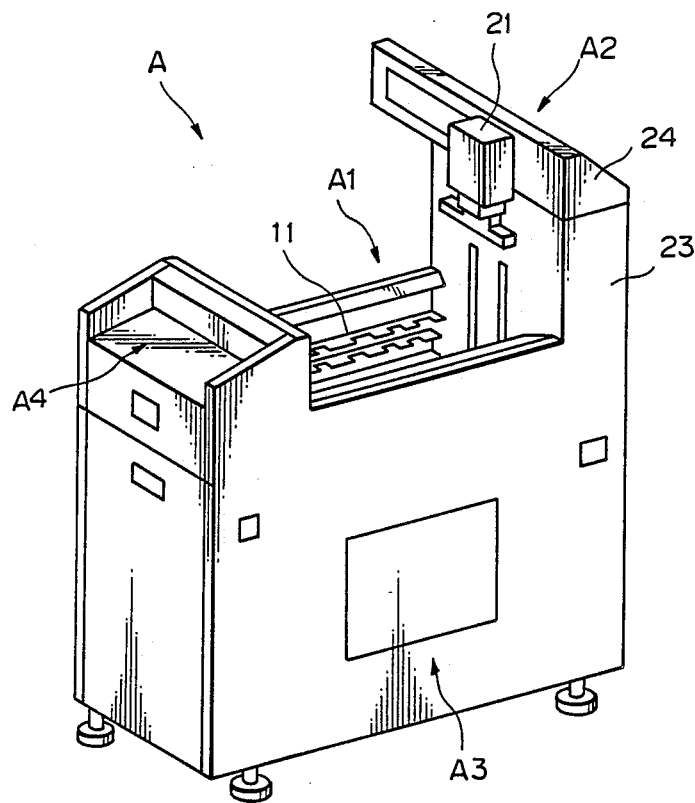
Figure 10:
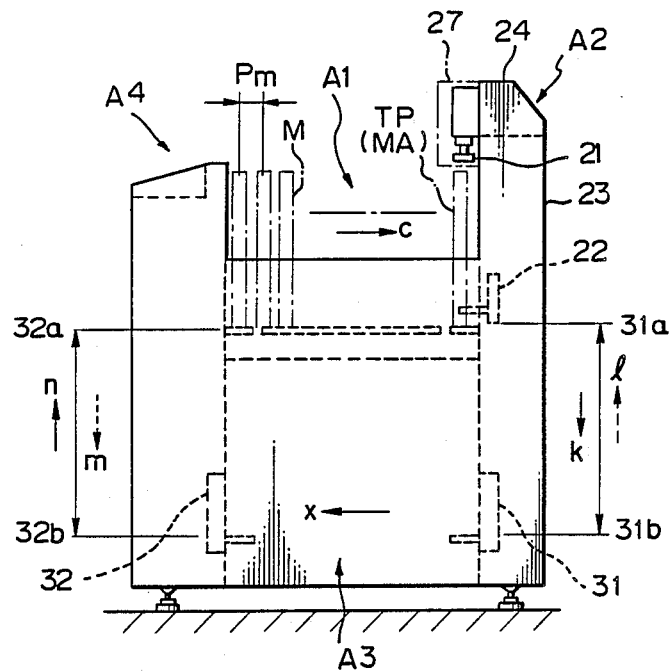
Figure 11:
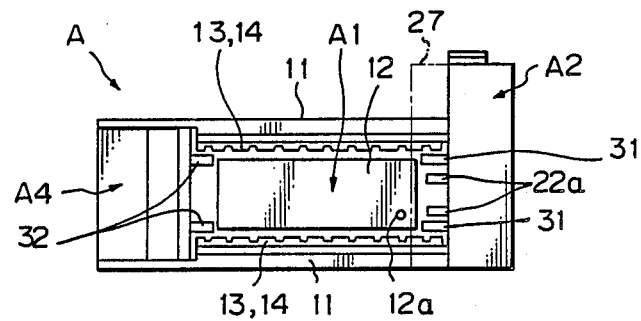

As can be seen from FIGS. 9 to 11, the stock section A1 is a chamber having an upper opening, defined by right and left side walls 11 and a bottom wall 12. As shown in FIGS. 10 and 22, a plurality of magazines M are vertically stocked in the section A1 to be parallel to each other at a constant arrangement interval Pm (FIG. 10) along the horizontal direction. The stock section A1 has a magazine feed mechanism. Thus, the magazine array is fed stepwise by a distance corresponding to the arrangement interval Pm while keeping the arrangement interval Pm between adjacent magazines, and the respective magazines M are sequentially fed to an IC sheet pickup position TP (FIGS. 10 and 22) corresponding to the IC sheet feeding section A2 on one end side of the stock section A1.

Magazine feed mechanism

Figure 12:
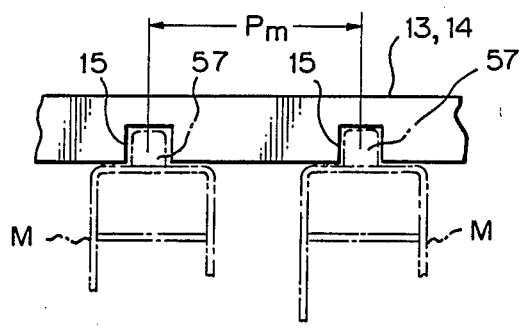

As clearly shown in FIGS. 11 and 22, magazine holding rods 13 and magazine feeding rods 14 (to be referred to simply as "holding rods" and "feeding rods" hereinafter, respectively) are arranged on the right and left side walls 11 of the stock section A1. As shown in FIG. 12, the holding and feeding rods 13 and 14 have the same basic shape, and comprise a flat-plate like member, in an inner edge of which a plurality of guide grooves 15 are formed. These guide grooves 15 are formed to have the same interval as the arrangement interval Pm of the magazines M, and engage with guide rails 57 arranged at two side edges of the magazines M (FIGS. 13 and 14). The dimensions of the guide rails 57 of the magazines M are common to each other regardless of the types of magazines and, hence, any type of magazine can be engaged with the guide grooves 15 of the holding and feeding rods 13 and 14.

As shown in FIG. 22, the holding rods 13 can be reciprocated in lateral directions a and b with respect to the magazine M, and the feeding rods 14 can be reciprocated in lateral direction d and f with respect to the magazine M and in magazine arrangement directions c and e. When the holding and feeding rods 13 and 14 are driven by, e.g., an air cylinder or a hydraulic cylinder, in a given order, the magazines M are fed stepwise by a distance corresponding to the arrangement interval Pm in the direction indicated by arrow c.

Stepwise feeding of the magazines is performed as follows:

(i) Normally, the holding and feeding rods 13 and 14 are located at positions engaging with the magazines M, as indicated by solid lines in FIG. 22.

(ii) When the magazines are to be fed, the holding rods 13 are first moved in the direction indicated by arrow a (dotted line 13a) to be released from the magazines M.

(iii) Next, the feeding rods 14 are moved by the distance Pm in the direction indicated by arrow c while being engaged with the magazines M, thereby feeding all the magazines M in the direction indicated by arrow c.

(iv) Then, the holding rods 13 are moved in the direction indicated by arrow b to be again engaged with the magazines M.

(v) Thereafter, the feeding rods 14 are moved in the direction indicated by arrow d to be released from the magazines M, are then moved in the direction indicated by arrow e (dotted line 14a), and are further moved in the direction indicated by arrow f to be again engaged with the magazines M, thus recovering the state (i).

When a series of operations (i) to (v) are repeated, the magazines M are fed stepwise by the distance Pm while keeping the distance Pm between adjacent magazines constant, and are sequentially fed to the IC sheet pickup position TP. Note that stepwise feeding of the magazines is interlocked with the return of empty magazines by the magazine returning section A3 (to be described later).

It is more preferable that two feeding rods 14 are provided for one holding rod 13 to vertically sandwich it therebetween. More specifically, when two vertically aligned feeding rods are provided, the magazines can be reliably prevented from falling.

(c) IC sheet feeding section

The IC sheet feeding section A2 basically consists of an IC sheet feeding head 21 and the lift 22, as shown in FIGS. 10 and 22.

(1) IC sheet feeding head

Figure 15:
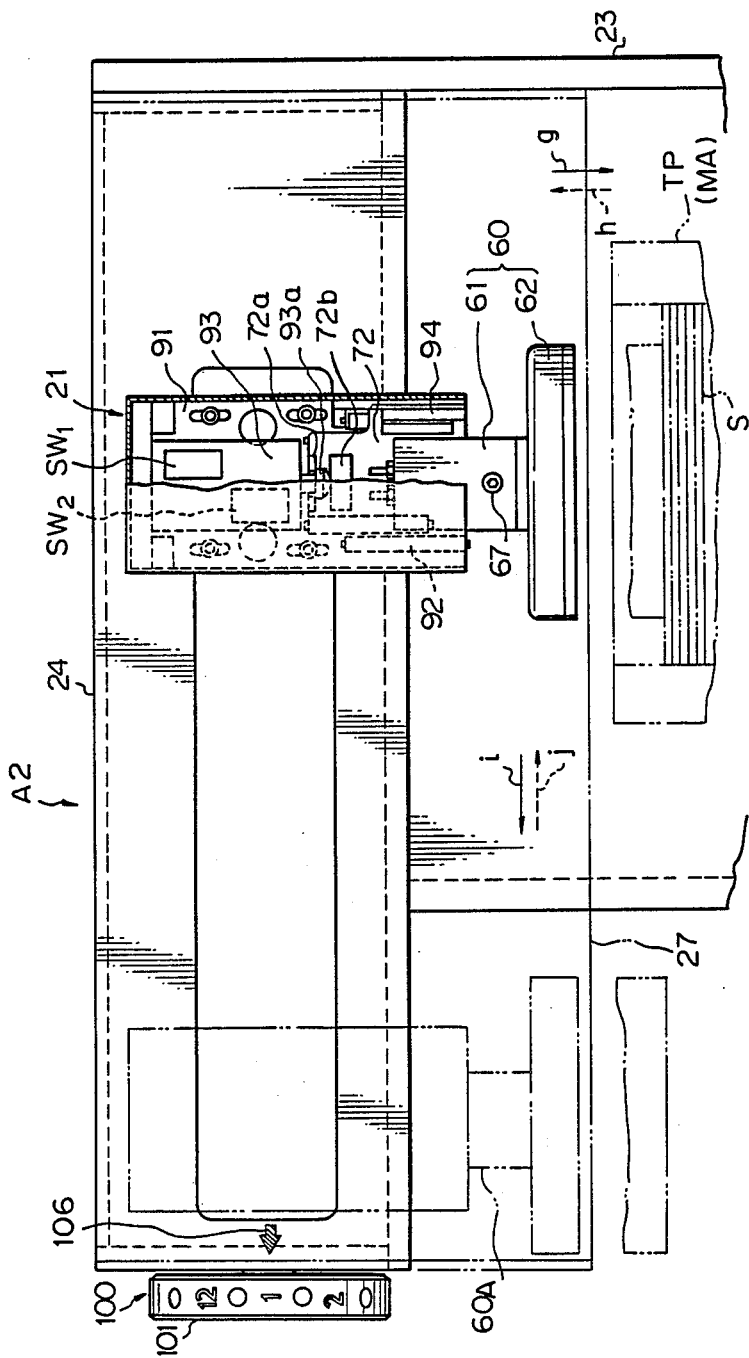
Figure 16:
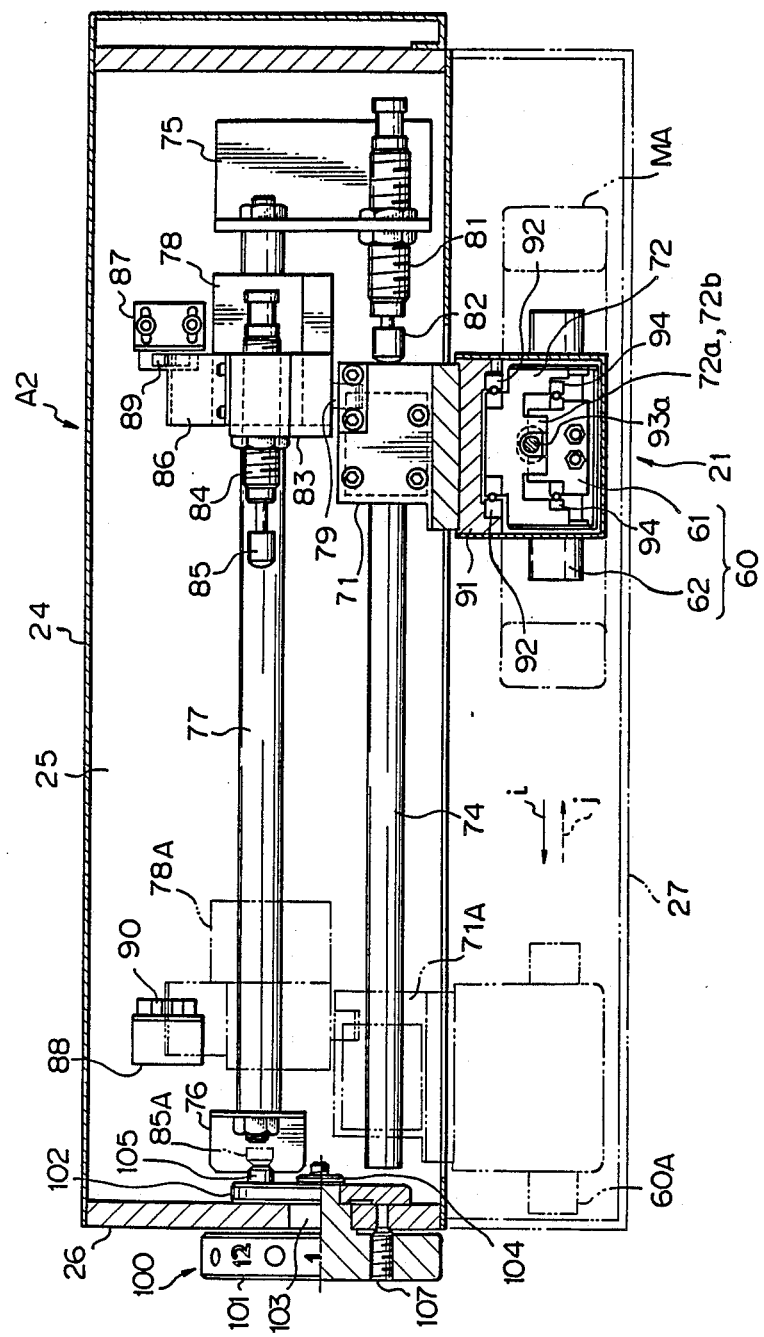
Figure 17:
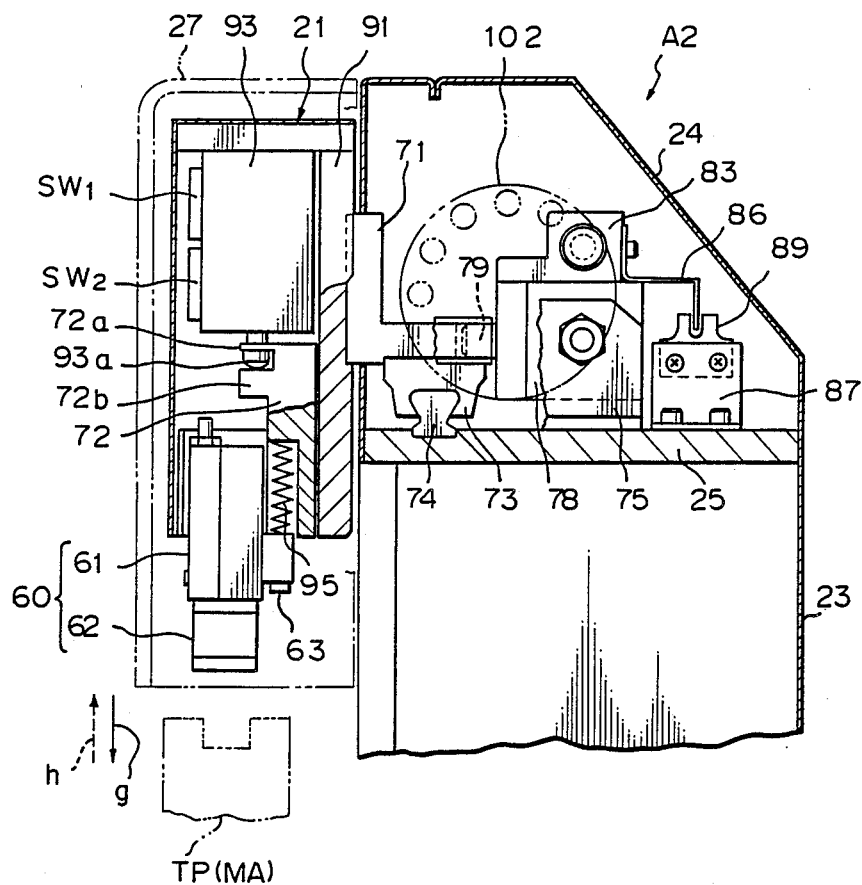

As shown in FIGS. 15 to 17, the IC sheet feeding head 21 is mounted on a horizontal box beam 24 on a column 23 of the IC sheet loader, and comprises an IC sheet suction head 60 for drawing the IC sheet S by suction, and a head feed mechanism for reciprocating the head 60 in the vertical and horizontal directions. These components will be described below in detail.

IC sheet suction head

Figure 18:
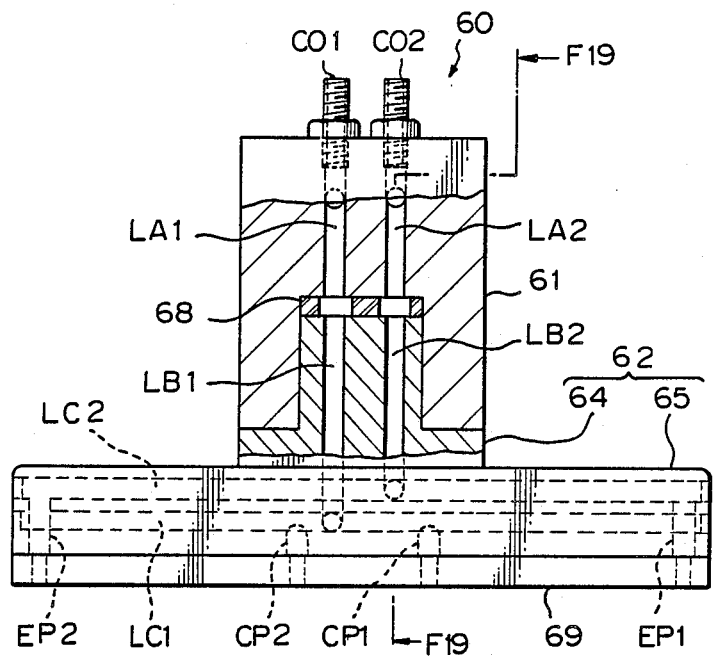
Figure 19:
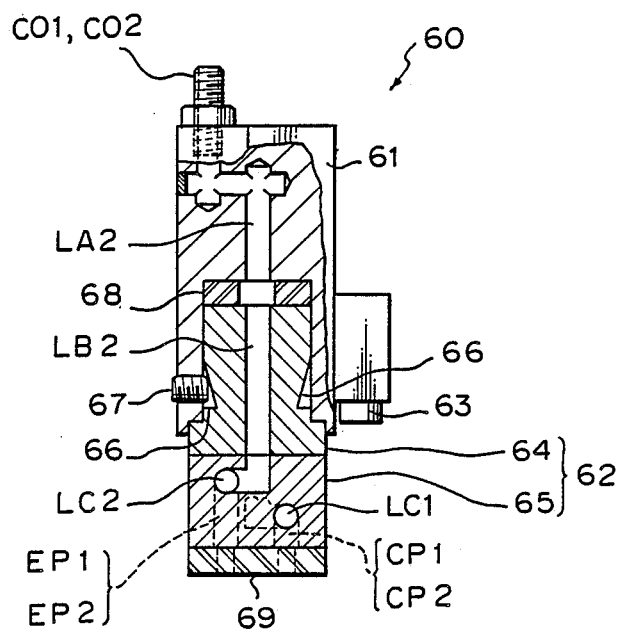

As shown in FIGS. 18 and 19, the IC sheet suction head 60 comprises a socket 61 and a head body 62. The socket 61 has a lower opening chamber, in which the head body 62 is detachably mounted. Two parallel vacuum pressure passages LA1 and LA2 are formed in the upper portion of the socket 61, and joints C1 and C2 are arranged on the upper end portion thereof. These joints are connected to a vacuum pump through flexible tubes (not shown). Note that a stopper 63 is fixed to the back surface of the socket 61. The stopper 63 is used by the cutting press B.

The head body 62 has an upper boss portion 64 and a lower suction portion 65. The boss portion 64 is detachably inserted in the socket 61, and is fixed thereto in such a manner that a fixing screw 67 is screwed in a tapered stepped portion 66 formed in the front and back surfaces of the boss portion from the front surface of the socket 61. Two vacuum pressure passages LB1 and LB2 are formed in the boss portion 64, and are respectively connected to the vacuum pressure passages LA1 and LA2 of the socket 61 through a packing 68.

Two vacuum pressure passages LC1 and LC2 and four suction ports EP1, EP2, CP1, and CP2 are formed in the suction portion 65. The vacuum pressure passage LC1 is connected to the vacuum pressure passage LB1 of the boss portion 64, and the central suction ports CP1 and CP2 of the suction portion communicate with the vacuum pressure passage LC1. The vacuum pressure passage LC2 is connected to the vacuum pressure passage LB2 of the boss portion 64, and the end suction ports EP1 and EP2 of the suction portion communicate with the vacuum pressure passage LC2. More specifically, the IC sheet suction head 60 has two independent vacuum suction lines, i.e., a first line including a connector C01, the vacuum pressure passages LA1, LB1, and LC1, and the central suction ports CP1 and CP2, and a second line including a connector C02, the vacuum pressure passages LA2, LB2, and LC2, and the end suction ports EP1 and EP2. The two vacuum suction lines are provided to prevent poor suction, since the IC sheet tends to be bent or curved vertically during manufacture and the suction head cannot be in satisfactorily tight contact with the entire surface of the IC sheet. More specifically, where the central suction ports CP1 and CP2 and the end suction ports EP1 and EP2 are included in different lines, when the IC sheet is curved to project upward, even if the end suction ports EP1 and EP2 provide poor suction, the IC sheet can be reliably drawn by the central suction ports CP1 and CP2. Conversely, when the IC sheet is curved to project downward, even if the central suction ports CP1 and CP2 provide poor suction, the IC sheet can be satisfactorily drawn by the end suction ports EP1 and EP2.

Note that a rubber or soft resin suction plate 69 is adhered to the lower surface of the suction portion 65 in order to improve contact with the IC sheet.

Various types of head bodies 62 are prepared in accordance with the types of IC sheet as well as the magazines. In this case, these head bodies 62 have boss portions 64 having the same dimensions to be mounted on the identical socket 61. The head bodies 62 are exchanged to provide compatibility with different types of IC sheets. Note that differences between different types of head bodies are the length and width of the suction portion 65, the number, location, and dimension of the suction ports, and the like. In particular, the suction ports are aligned to correspond to the IC arrangement interval of the IC sheets. In this case, the same head body can be commonly used in accordance with the types of the IC sheets.

Head feed mechanism

The head feed mechanism has a horizontal feed carriage 71 and a vertical feed carriage 72, as shown in FIGS. 15 to 17.

The horizontal feed carriage 71 is an L-shaped member, as shown in FIG. 17, and a linear movement bearing 73 is fixed to its bottom wall, so as to be horizontally reciprocal along a guide rail 74 fixed to a box beam bottom plate 25. As shown in FIG. 16, brackets 75 and 76 are fixed to two end portions of the box beam bottom plate 25 to fix an air cylinder 77 to be parallel to the guide rail 74. A permanent magnet piston is arranged in the air cylinder 77, around which a slider 78 of a magnetically soft material is fitted. The slider 78 is coupled to the horizontal feed carriage 71 through a pin 79. When air is supplied to the air cylinder 77 from its two end portions, the slider 78 magnetically reciprocates along the air cylinder 77 upon movement of the piston. Therefore, the horizontal carriage 71 reciprocates between a position (71) indicated by the solid line in FIG. 16 and a position (71A) indicated by the imaginary line.

As shown in FIG. 16, a screw shaft 81 is fixed to the bracket 75 by a nut, and a rubber or resin stopper 82 for defining the stop position of the carriage 71 at the position indicated by the solid line is arranged at the distal end of the shaft 81. When the fixing position of the screw shaft 81 is adjusted, the stop position of the carriage 71 can be adjusted. A block 83 is fixed to the upper portion of the slider 78, and a screw shaft 84 is screwed therein. A rubber or resin stopper 85 is arranged at the distal end of the shaft 84. The stopper 85 abuts against a dial stopper 100 (to be described later) when the slider 78 is moved to the position (78A) indicated by the imaginary line, thus defining the stop position of the slider 78 (i.e., of the horizontal feed carriage 71). When the fixing position of the screw shaft 84 is adjusted, the stop position of the slider 78 can be adjusted.

Dial stopper

Figure 20:
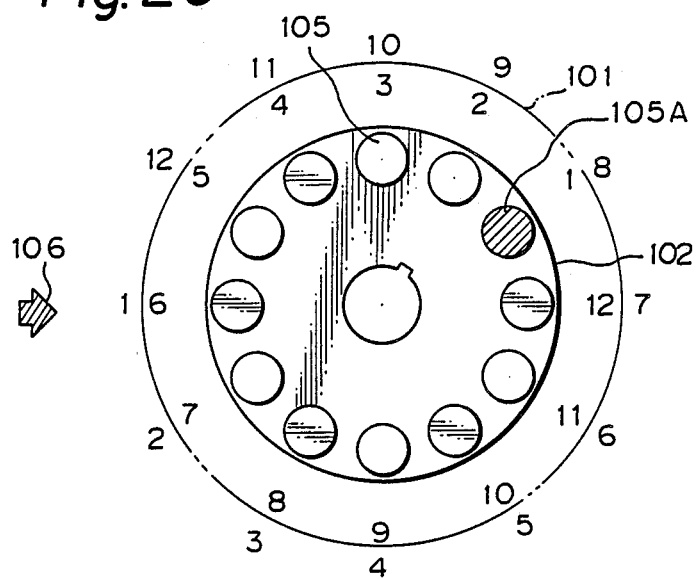
Figure 21:
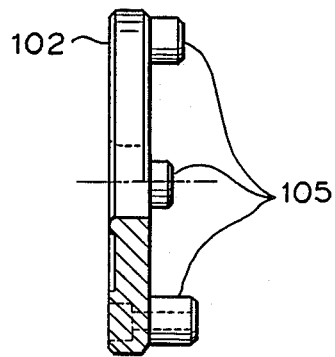

The dial stopper 100 is arranged on a left end plate 26 of the box beam 24, and comprises a dial 101 and a stopper disk 102. A boss 103 of the dial 101 extends through the left end plate 26, and the stopper disk 102 is fixed to the extending end of the boss 103 by a nut 104. As shown in FIGS. 20 and 21, a plurality of (12 in FIGS. 20 and 21) stoppers 105 having different heights are arranged and fixed to the peripheral edge portion of the outer surface of the stopper disk 102 at an equiangular interval of 30°. If the stoppers 105 are denoted by No. 1 to 12 (FIG. 20), numerals 1 to 12 corresponding thereto are printed on the outer periphery of the dial 101. When an arrow 106 (FIG. 15) printed on the front surface of the box beam 24 is adjusted to a given number printed on the dial 101, the corresponding stopper can be located at a position 105A shown in FIG. 20. The position 105A corresponds to the stopper 85 of the slider 78. Therefore, when the slider 78 reaches the position (85A) indicated by the imaginary line, the stopper 85 abuts against the corresponding stopper 105 to be positioned. Therefore, when the dial 101 is rotated to adjust the desired stopper 105 to the position 105A, the stop position of the slider 78 (in other words, the horizontal feed carriage 71) can be easily adjusted in a multistage manner.

Note that a screw ball click 107 (FIG. 16) is arranged on the dial 101, thereby holding the dial 101 at the adjusted position.

Since the multistage adjustable stopper is provided, an IC sheet feed position can be adjusted in the cutting press B in accordance with the types of IC sheet. Since the stopper is of dial type, this allows easy adjustment, resulting in a great practical advantage.

Returning to a description for the head feed mechanism, a tongue segment 86 which is obtained by bending a flat plate twice in an L shape is mounted on the slider 78, as shown in FIG. 17. As shown in FIG. 16, transmission type photosensors 89 and 90 are respectively mounted on brackets 87 and 88 arranged adjacent to the two end stop positions (78 and 78A) of the slider 78. When the tongue segment 86 of the slider 78 is inserted in the photosensor 89 or 90, it is detected that the slider 78 has reached the position (78) indicated by the solid line or the position (78A) indicated by the imaginary line, and an actuator (not shown) for driving the slider is stopped accordingly.

As shown in FIGS. 15 to 17, a base 91 is fixed to the front wall of the horizontal feed carriage 71, and the vertical feed carriage 72 is mounted on the base 91 by a pair of linear movement bearings 92 (FIGS. 15 and 16) for reciprocation in the vertical direction. An air cylinder 93 is mounted on the upper portion of the base 91 and faces downwardly, and a flange 93a on the distal end portion of a piston rod is engaged between front surface projections 72a and 72b of the carriage 72. Upon operation of the air cylinder 93, the carriage 72 is moved vertically. Note that the upper and lower stroke limits of the air cylinder 93 (i.e., the upper and lower stroke limits of the carriage 72) are defined by limit switches SW1 and SW2 arranged on the air cylinder 93.

The IC sheet suction head 60 is mounted on the vertical feed carriage 72. More specifically, the socket 61 of the head 60 is mounted on the carriage 72 through a pair of linear movement bearings 94 (FIGS. 15 and 16) to be slidable in the vertical direction, and is suspended by a spring 95 (FIG. 17). Therefore, the head 60 is supported in a floating state to be vertically movable with respect to the carriage 72.

(2) Lift

The lift 22 is arranged in the column 23 of the IC sheet loader A, as shown in FIG. 10, and is reciprocated in the vertical direction by a driving mechanism, e.g., a sprocket chain (not shown). The lift 22 has two pawls 22a projecting inside the stock section A1, and pushes up a stack of IC sheets S in a magazine MA at the IC sheet pickup position TP by the pawls 22a, as shown in FIG. 13. When the IC sheets are fed to the cutting press B (to be described later), the stack of IC sheets S is pushed up by the lift 22 as the number of IC sheets in the magazine MA decreases, so that IC sheet suction by the head 60 can be reliably performed.

The operation of the IC sheet feeding section A2 will now be described.

(i) First, the IC sheet feed head 21 is located above the IC sheet pickup position TP (at the position indicated by the solid line), as shown in FIGS. 15 and 16, and the lift 22 is located therebelow.

(ii) When the magazine MA is fed to the IC sheet pickup position TP, as described above, the air cylinder 93 of the IC sheet feed head 21 is operated, and the vertical feed carriage 72 and the IC sheet suction head 60 are moved downward in the direction indicated by arrow g (FIGS. 15 and 16) to be in tight contact with the uppermost IC sheet S in the magazine MA, thus drawing it by vacuum suction. In this case, even if the IC sheet S is bent, tilted, or roughened, since the head 60 is suspended by the carriage 72 through the spring 95 in the floating state and the flexible suction plate 69 is mounted on the suction portion, good suction is allowed. If the IC sheet is bent so as not to be compensated for the above arrangement, since the two vacuum suction lines are provided to the head 60, the IC sheet can be drawn by suction by some of the central suction ports CP1 and CP2 or the end suction ports EP1 and EP2 (FIG. 18). Note that the suction state of the IC sheet S is detected by a vacuum pressure sensor (not shown).

(iii) When the IC sheet S is drawn by suction, the air cylinder 93 is operated in the reverse direction, and the carriage 72 and the head 60 are moved upward in the direction indicated by arrow h, thus picking up the IC sheet S from the magazine MA.

(iv) Then, the carriage 71 is moved in the direction indicated by arrow i (FIGS. 15 and 16), as described above, and the head 60 is fed to a position 60A defined by the stopper 85 of the slider 78 and the corresponding stopper 105 of the dial stopper 100 where it is stopped. While the head 60 is held in this position, or after the head 60 is moved downward by operating the air cylinder 93 if necessary, vacuum suction is cancelled to release the IC sheet to be placed at the IC sheet feed position of the cutting press B.

(v) After the IC sheet feeding operation, the carriage 71 is returned in the direction indicated by arrow j, and the head 60 is returned to an initial position above the IC sheet pickup position TP.

(vi) The operations (i) to (v) are repeated until all the IC sheets S in the magazine MA are fed. In this case, as the number of the IC sheets in the magazine MA decreases, the stack of the IC sheets is pushed up by the lift 22, so that the uppermost IC sheet is always located at a predetermined level, thus allowing a smooth IC sheet pickup operation. Note that is all the IC sheets in the magazine MA have been fed and the magazine AAA is therefore empty, such condition is detected by a transmission type photosensor (not shown) arranged above the IC sheet pickup position TP for detecting whether or not sensor light emitted therefrom is transmitted through the magazine MA. For this purpose, a hole 58 is formed at a given position of the bottom plate of the magazine M. While an IC sheets S is present in the magazine MA, the sensor light is shielded by the IC sheet and is not detected. When the magazine becomes empty, the sensor light is detected through a hole 58 to detect that the magazine MA is empty (i.e., the IC sheet pickup operation is completed).

(vii) When all the IC sheets are fed from the magazine MA, the empty magazine is returned to the last position of the magazine array on the other end side of the stock section A1 by the magazine returning section A3 (to be described next). Meanwhile, the next magazine M in the stock section A1 is fed to the IC sheet pickup position TP and the IC sheet feed operation is started by the IC sheet feeding section A2.

Note that reference numeral 27 in FIGS. 15 to 17 denotes a safety cover covering exposed portions of the IC sheet feed head 21. Although not shown, the cover 27 is mounted on the box beam 24 through a hinge to be openable upward. A mechanism for stopping the operation of the IC sheet loader when the cover 27 is opened is provided to the loader A, thus assuring a safe operation.

(d) Magazine returning section

The magazine returning section A3 has first and second elevators 31 and 32 respectively arranged below the IC sheet pickup position TP and the last position of the magazine array, as shown in FIG. 10. The first elevator 31 is movable between upper and lower positions 31a and 31b, and is normally located at the upper position 31a to support the magazine at the IC sheet pickup position TP. The second elevator 32 is also movable between upper and lower positions 32a and 32b and is normally located at the upper position 32a to support the magazine at the last position of the magazine array.

The magazine returning operation by the magazine returning section A3 is performed as follows:

(i) When the magazine MA at the IC sheet pickup position TP is detected as being empty by the photosensor, as described above, the first elevator 31 is moved downward to the lower position 31b in the direction indicated by arrow k to move the magazine MA downward.

(ii) A magazine MA1 at the lower position is transferred from the first elevator 31 to a horizontal carrier (not shown) by an air cylinder or a hydraulic cylinder (not shown), and the first elevator 31 is then returned upward in the direction indicated by arrow 1 to the upper position 31a. The magazine array is then fed stepwise by the magazine feed mechanism in the stock section A1, as described above, and the next magazine is fed to the IC sheet pickup position TP on (iii) The second elevator 32 becomes empty by the stepwise feed operation of the magazine array, and is moved downward in the direction indicated by arrow m to the lower position 32b. Then, the horizontal carrier is moved in the direction indicated by arrow x to horizontally carry the magazine MA1, and places it on the second elevator 32, as indicated by reference symbol MA2. Thereafter, the horizontal carrier is returned in the direction indicated by arrow y.

(iv) The second elevator 32 which has received the magazine MA2 is moved upward in the direction indicated by arrow n to the upper position 32a, and causes the magazine MA2 to locate at the last position of the magazine array in the stock section A1 and supports it until the next stepwise feed operation in performed.

The above-described magazine returning operations (i) to (iv) are performed each time a magazine MA at the IC sheet pickup position TP becomes empty.

As described above, when a large number of magazines M storing the IC sheets S are stocked in the stock section A1 of the IC sheet loader A, the magazines M are circulated along a rectangular convey path, as indicated by arrows c, k, x, and n in FIG. 10, by the stepwise feed operation of the magazine array of the magazine feed mechanism and the empty magazine returning operation of the magazine returning mechanism. Therefore, the IC sheets can be continuously and automatically fed to the IC sheet cutting press B until all the magazines M become empty.

The stock section A1 vertically stocks the magazines to be parallel to each other, and can stock a large number of IC sheets, thus allowing an automatic, continuous operation for a long period of time. Therefore, unmanned operation in the middle of the night and an economical operation in which a single operator is in charge of a plurality of apparatuses, can be achieved. Note that for the latter operation, a means for signalling a need for refill of IC sheets when the remaining number of IC sheets becomes small can be advantageously provided. This can be easily achieved by the following arrangement. For example, as shown in FIG. 11, a hole 12a which coincides with the hole 58 (FIGS. 13 and 14) of the bottom plate 51 of the magazine M is formed in a position of the bottom wall 12 of the stock section A1 separated from the IC sheet pickup position TP by a distance equal to one arrangement interval Pm, and a reflection type photosensor (not shown) is arranged therebelow. With this arrangement, the presence/absence of the IC sheets in the magazine located above the hole 12a can be detected by the presence/absence of reflected sensor light. Therefore, when the last magazine storing the IC sheets is located at the IC sheet pickup position TP and the first empty magazine which has already been subjected to the IC sheet feed operation is returned to the position on the hole 126a, the photosensor detects that the magazine is empty, and an IC sheet refill alarm can be generated accordingly. If the operator exchanges the empty magazines in the stock section A1 with new magazines while the IC sheet feed operation is performed from the last magazine, the operation of the apparatus can be continued without being interrupted.

In the above embodiment, the stepwise feed type magazine feed mechanism is used only in the stock section A1, and the horizontal carrier for carrying the magazine one by one is used in the magazine returning section A3. However, if the same stepwise feed mechanism as that in the stock section A1 is used in the section A3, the stock number of magazines (i.e., the stock number of IC sheets) can be substantially doubled, and the automatic, continuous operation time can be doubled.

In addition, in the IC sheet loader described above, the magazine is fed to the predetermined IC sheet pickup position and an IC sheet is picked up from the upper entrance/exit port of the magazine to be fed to the IC sheet cutting press. Therefore, the IC sheet pickup and feed operations can be performed quickly, and an empty magazine can be replaced with a new magazine at the IC sheet pickup position, thus allowing high-speed IC sheet feed operation. In the above embodiment, since the IC sheet suction head has two independent vacuum suction lines, and IC sheet can be reliably and quickly drawn by suction even if it is bent. Since the suction head is fed simply in the vertical and horizontal directions and the head stop position can be aligned with high precision by the dial stopper, the IC sheet feed operation can be performed at 0.85 to 0.9 sec/sheet.

Since the magazines have a partially common exterior arrangement (in particular, their widths, heights, and guide rails at two sides thereof) regardless of the types of IC sheet, various magazines can be stocked in the magazine stock section. Since the IC sheet suction head is exchangeable with respect to the head feed mechanism and has a common detachable portion regardless of the types of head, various types of IC sheets can be handled simply by exchanging the IC suction head, resulting in compatibility.

Although not directly related to the present invention, the IC sheet loader described above can be used as an IC sheet unloader which receives processed IC sheets ejected from a certain type of IC sheet processing apparatus for stocking, e.g., an IC sheet unloader for a marking apparatus for printing various marks or symbols on IC sheets.

In this case, the operation and the arrangement of the IC sheet unloader are the same as those of the IC sheet loader, although the empty magazines are stocked in the stock section A1 and the IC sheet feeding section A2 is modified to serve as an IC sheet ejecting section. More specifically, in the IC sheet loader, the IC sheet feed head 21 picks up IC sheets at the IC sheet pickup position TP from the magazine and the IC sheet is cut by the IC sheet processing apparatus (cutting press B). In the IC sheet unloader, however, an IC sheet is drawn by suction by an IC sheet processing apparatus (marking apparatus) and is released at the IC sheet pickup position TP (in this case, an "IC sheet store position") to be stored in the magazine. When IC storage of sheets in the magazine is started, the lift 22 is located at its uppermost position, and is gradually moved downward as the number of IC sheets stored in the magazine increases. Detection of the magazine filled with IC sheets cannot be performed by a vertical transmission photosensor in the IC sheet loader, but can be performed by a horizontal transmission photosensor. The stepwise feed operation of the magazine array in the stock section A1 and the returning operation of the full magazine to the last position of the magazine array are the same as in the IC sheet loader. In this manner, IC sheets can be ejected from the marking apparatus to be stored in a magazine and a large number of full magazines can be stocked in the stock section.

III. IC sheet cutting press

Figure 23:
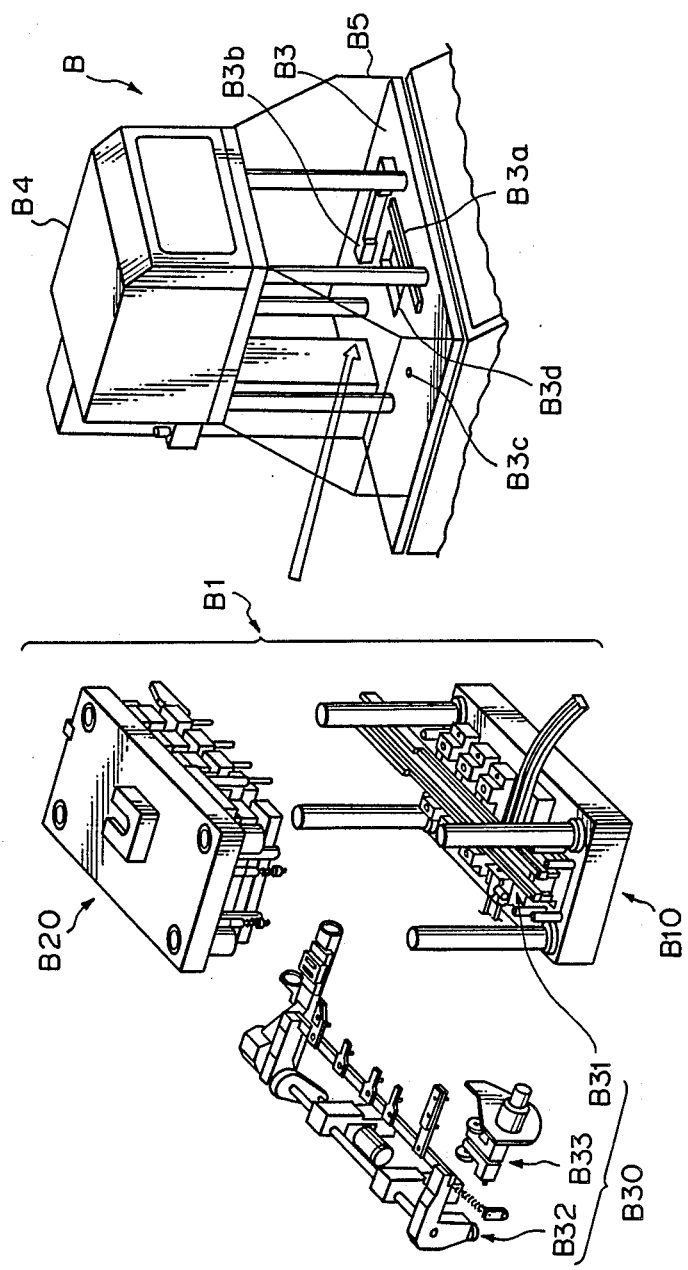

The IC sheet cutting press B has a press mold unit B1, as shown in FIG. 23. The press mold unit B1 is mounted on a table B3 of a press frame, and is driven by a press ram B2 (FIG. 4) mounted in a ram housing B4.

The press mold unit B1 comprises a lower mold B10, an upper mold B20, and an IC sheet feed mechanism B30, and performs a series of press machining operations to cut ICs from the IC sheet S (FIG. 5) by the upper and lower molds B10 and B20 while feeding the IC sheets S stepwise by the IC sheet feed mechanism B30. The arrangement and operation of the respective sections of the press mold unit B1 will be described hereinafter in detail.

(a) Lower mold

As shown in FIGS. 24 to 27, the lower mold B10 is arranged in such a manner that respective dies DE1 to DE5 for press molds for performing above-mentioned series of press machining operations (i.e., resin punching, dam bar cutting, lead cutting, tie bar pinch forming, and punching) are detachably mounted on a single common die holder 110.

Figure 24:
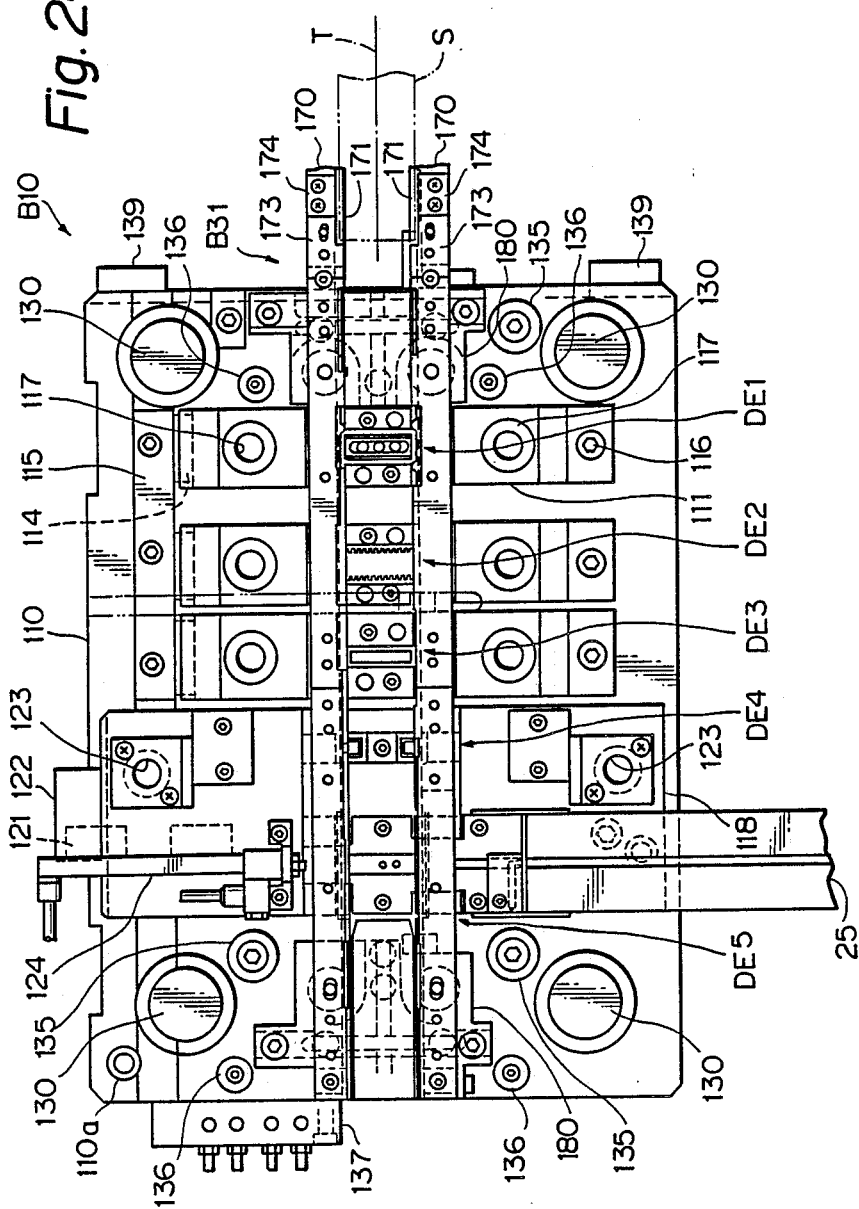
Figure 25:
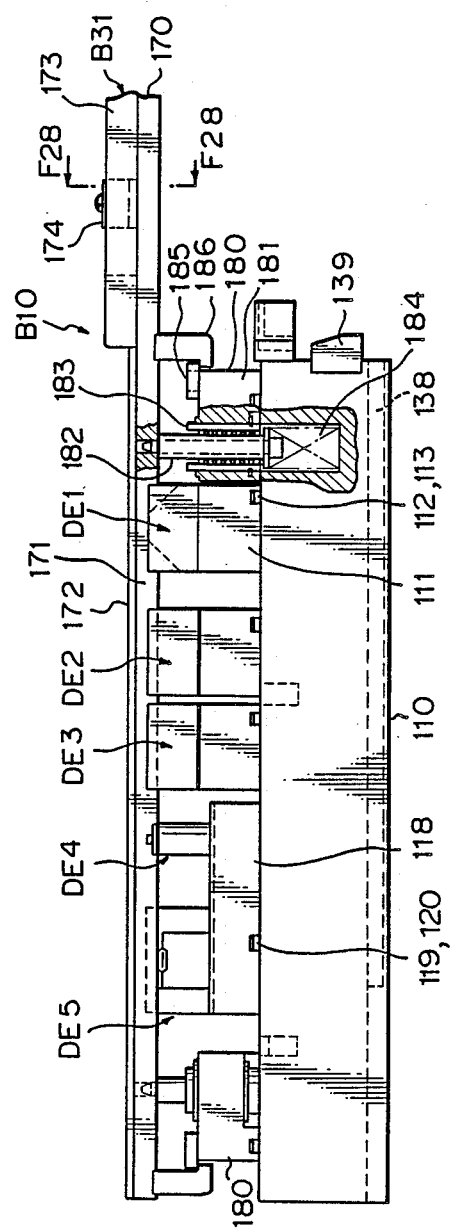
Figure 26:
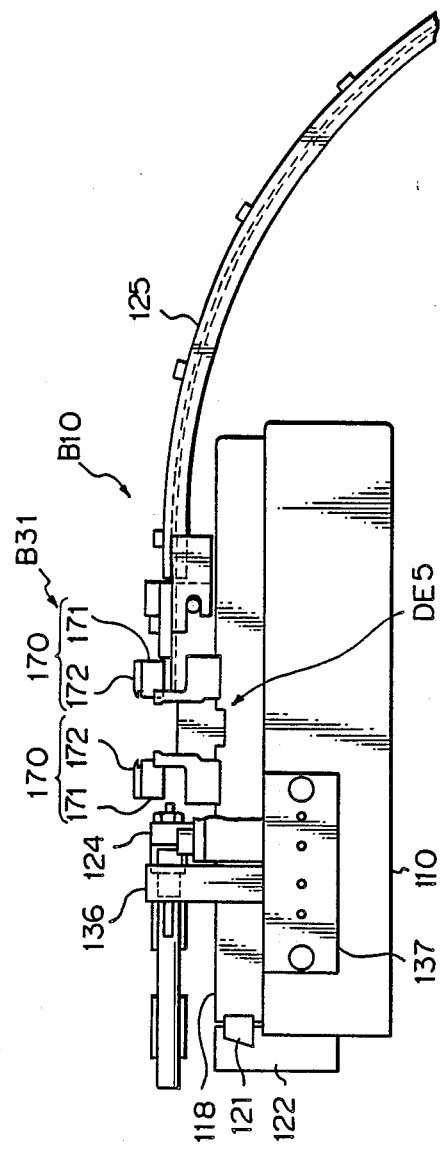
Figure 30:
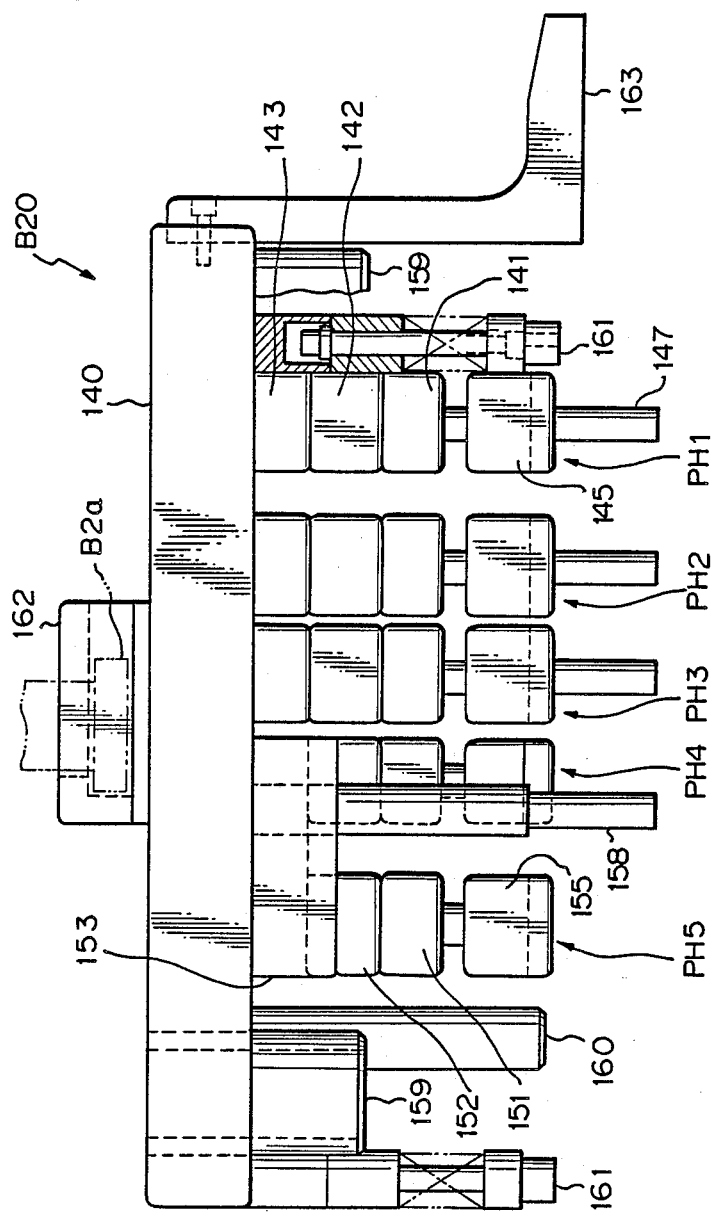
Figure 31:
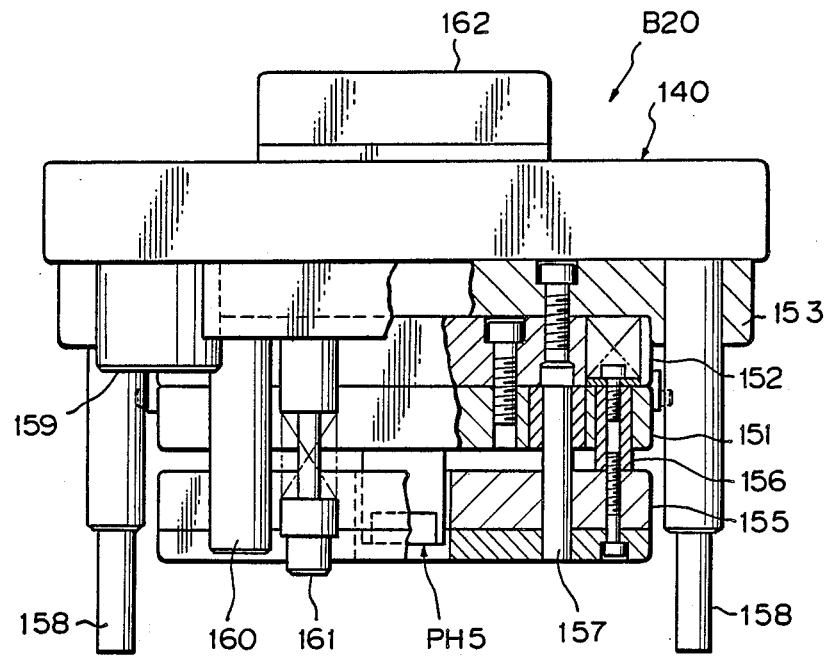
Figure 32:
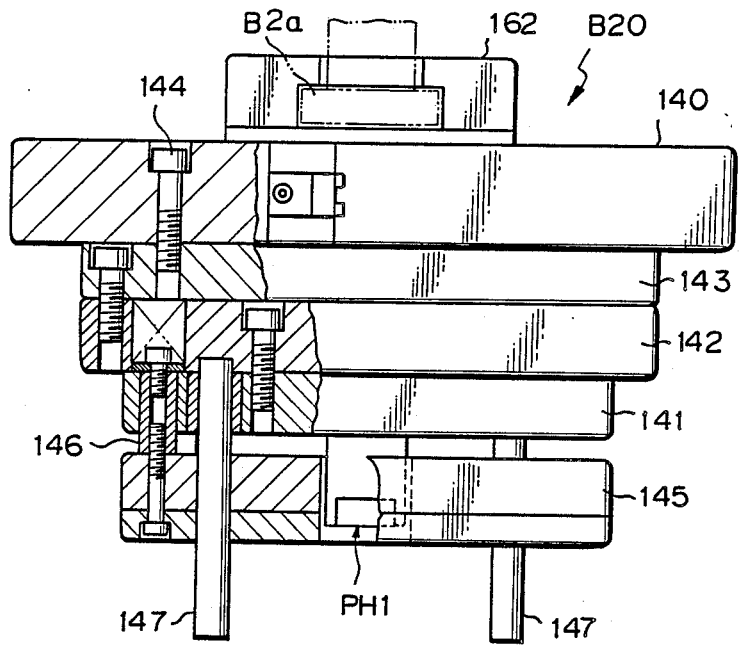

Since the three dies DE1 to DE3 at the former stage have substantially the same mounting structure, the resin punching die DE1 at the first stage will be exemplified below. As shown in FIG. 24 or 25, the die DE1 is mounted on a die plate 111. The die plate 111 is positioned by a key groove 113 in its bottom surface, a guide key 113 of the die holder 110 (FIG. 25), and a tapered metal member 114 and a fastening metal member 115 on one side of the die plate 111, and is fixed to the die holder 110 by a bolt 116 at its opposite end portion. Note that the fastening metal member 115 is common to the die plates of the dies DE1 to DE3, as can be seen from FIG. 24. As shown in FIGS. 24 to 27, a pair of dust-sealed guide bushings 117 are arranged on the die plate 111, and are engaged with pilot pins 147 (to be described later; FIGS. 30 and 32) of the upper mold B20. The two dies DE4 and DE5 at the latter stage are mounted on a common die plate 118, as shown in FIGS. 24 and 25. The die plate 118 is positioned by a key groove 119, a guide key 120 (FIG. 25), and a tapered metal member 121 and a fastening metal member 122 (FIGS. 24, 26, and 27) as in the die plate 111, and is fixed to the die holder 110 by a bolt. The die plate 118 has a pair of dust-sealed bushings 123 (FIG. 24) at its two end portions, which are engaged with pilot pins 158 of the upper mold B20 (to be described later; FIGS. 30 and 31). As shown in FIGS. 24 and 26, an air cylinder 124 and a guide rail 125 for feeding ICs cut from the IC sheet by the punching press mold (i.e., the die DE5 of the upper mold B10 and a punch PH5 of the upper mold B20) to the bending press C are arranged on the die plate 118 to be perpendicular to the IC sheet feed path T. Since the tie bar pinch forming die DE4 and the punching die DE5 are always used in this combination, they are mounted on the common die plate 118, thus allowing easy mounting and removal of these dies.

The dies DE1 to DE5 are arranged along the IC sheet feed path T at given intervals, i.e., 1.5p or 2p shown in FIG. 6.

Figure 27:
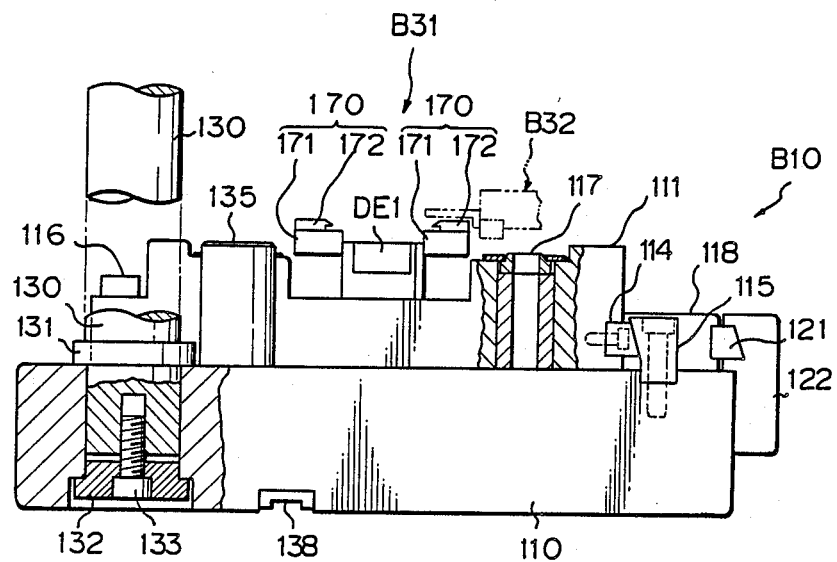
Figure 29:
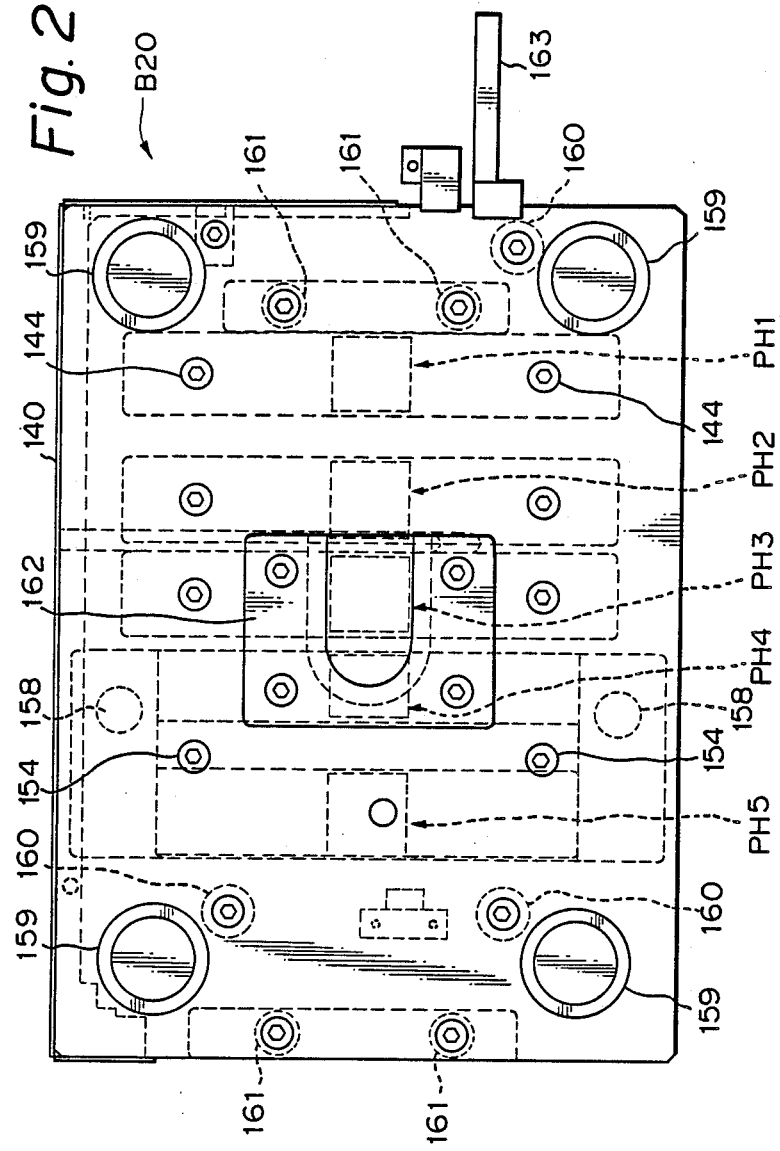

As shown in FIG. 24, four guide posts 130 are arranged on the die holder 110, and when they are engaged with guide bushings 159 of the upper mold B20 (to be described later; FIG. 29), the upper mold B20 is mounted on the lower mold B10 to be vertically movable. As shown in FIG. 27, the lower end portion of each guide post 130 is fitted in a hole of the die plate 110 and is fixed by a flange 131, a retainer plate 132, and a bolt 133. Stopper pins 135 are provided adjacent to the three guide posts 130. These pins 135 abut against stopper pins 160 (to be described later; FIGS. 30 and 31) of the upper mold B20 to define the lower dead point of the upper mold B20. Other stopper pins 136 are arranged adjacent to the guide posts 130. These pins 136 abut against spring-biased stopper pins 161 (to be described later; FIGS. 30 and 31) of the upper mold B20.

An air joint block 137 for supplying vacuum for drawing an IC cut by the punching die DE5 and compressed air to the air cylinder 124 for feeding ICs is arranged on one side (the left side in FIG. 24) of the die holder 110. Although a number of photosensors for detecting an IC sheet feed position are arranged on the die holder 110, a detailed description thereof will be omitted.

FIGS. 24 to 27 illustrate a state wherein a sheet guide assembly B31 of the IC sheet feed mechanism B30 (FIG. 23) is mounted on the die holder 110. The sheet guide assembly B31 will be described later.

The lower mold B10 is detachably mounted on the table B3 of the cutting press B. More specifically, as shown in FIGS. 24, 25, and 27, a key groove 138 is formed in the bottom surface of the die holder 110, and a pair of tapered metal members 139 are arranged on its one end side. As shown in FIG. 23, a guide key B3a and a fastening metal member B3b are fixed to the table B3 of the cutting press B to be perpendicular to each other. When the key groove 138 of the die holder 110 is engaged with the guide key B3a and the tapered metal member 139 is engaged with the fastening metal member B3b, the lower mold B10 can be positioned, and is fixed, such that a bolt (not shown) is screwed in a tap hole B3c of the table B3 from a bolt hole 110a (in the upper left corner in FIG. 24) of the die holder 110. Note that since the common fixing structure of the lower mold B10 with respect to the press table B3 is adopted, a compatibility with different press mold units B1 can be provided.

In FIG. 23, a hole B3d formed in the press table B3 is a dust collecting port corresponding to the dies DE1 to DE3 of the lower mold B10. The dust collecting port B3d communicates with a dust collector E through a hose or tube E1, as shown in FIG. 4, so that punched refuse or cutting dust produced by the dies DE1 to DE3 are collected through the dust collecting port B3d.

Note that the press B has a transparent safety cover B5. When the cover B5 is opened, not only the IC sheet cutting press B but also the entire IC sheet processing apparatus is automatically stopped.

(b) Upper mold

As shown in FIGS. 29 to 32, the upper mold B20 is arranged so that punches PH1 to PH5 for the respective press molds for performing the above-mentioned series of press machining operations are detachably mounted on a single common punch holder 140.

Since the punches PH1 to PH3 at the former stage have substantially the same mounting structure, the resin punch PH1 at the first stage will be exemplified below. As shown in FIG. 32, the punch PH1 is mounted on a punch plate 141, which is detachably mounted on the punch holder 140 by a bolt 144 through an intermediate plate 142 and a base plate 143. A sheet pressing plate (or a stripper plate) 145 is mounted on the punch plate 141 by a pair of spring-biased slide pins 146 to be vertically movable, and a pair of pilot pins 147 are fixed thereto. The pilot pins 147 are engaged with the guide bushings 117 of the die holder 111 for the dies DE1 to DE3 of the lower mold B10 described above (FIGS. 24 and 27). The punches PH4 and PH5 at the latter stage are mounted on a punch plate 151, as shown in FIG. 31, and the punch plate 151 is detachably mounted on the punch holder 140 by a bolt 154 (FIG. 29) through an intermediate plate 152 and a base plate 153. The base plate 153 is common to the punches PH4 and PH5, as shown in FIG. 30. This arrangement corresponds to that wherein the die plate 118 commonly used for the dies DE4 and DE5 of the lower mold B10. A sheet pressing plate (or a stripper plate) 155 is mounted on the punch plate 151 by a pair of spring-biased slide pins 156 and a pair of guide pins 157 to be vertically movable. A pair of pilot pins 158 are fixed to the common base plate 153, and are engaged with the guide bushings 123 of the lower mold B10 described above.

Four guide bushings 159, three stopper pins 160, and four spring-biased stopper pins 161 are arranged on the punch holder 140. As described above, the guide bushings 159 are engaged with the guide posts 130 of the lower mold B10, and the stopper pins 160 and 161 abut against the stopper pins 135 and 136 of the lower mold B10, respectively.

The punch holder 140 has a ram coupling member 162, which is engaged with the flange B2a (FIGS. 30 and 32) at the distal end portion of the piston rod of the press ram B2 (FIG. 4) of the cutting press B. Thus, the upper mold B20 is vertically moved by the press ram B2, and a sheet cutting operation is performed by the dies DE1 to DE5 and the punches PH1 to PH5.

An L-shaped lever 163 is fixed to one end portion of the punch holder 140. The lever 163 pushes down a sheet feed lever 220 (see FIG. 35) of the IC sheet feed mechanism B30 by utilizing downward movement of the upper mold B20, and will be described later.

Although the upper mold B10 also has a large number of photosensors for position detection during IC sheet feed, a detailed description thereof will be omitted.

(c) IC sheet feed mechanism

The IC sheet feed mechanism B30 comprises the sheet guide assembly B31 (illustrated in a stage wherein it is mounted on the lower mold B10), a feed rod assembly B32 for feeding the IC sheet along the sheet guide assembly, and an ejector B33 for ejecting a waste sheet after IC cutting, as shown in FIG. 23.

(1) Sheet Guide Assembly

Figure 28:
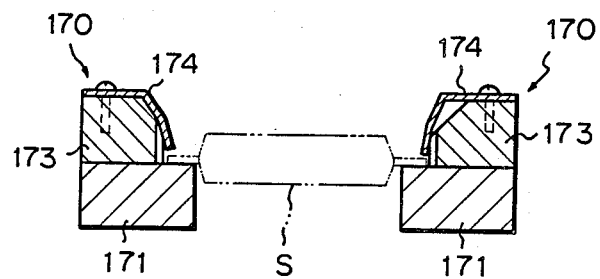

The sheet guide assembly B31 has a pair of guide rails 170 arranged on two sides of the IC sheet feed path T (FIG. 24), as shown in FIGS. 24 to 28. Each guide rail 170 has a supporting rail 171 having a rectangular section, and a cover plate 172 fixed to the upper surface of the rail 171 by a screw. The C1 sheet S is fed, with the right and left side edges of the lead frame F (FIG. 5) engaged with the guide grooves between the supporting rails 171 and the cover plates 172. The end portions on one side of the supporting rails 171 of the guide rails 170 extend from the lower-mold die holder 110, and constitute a sheet feed portion on which the IC sheet fed by the IC sheet feeding section A2 of the IC sheet loader A is placed. As shown in FIGS. 24, 25, and 28, guide blocks 173 are mounted on the extending end portions of the supporting rails 171, and the IC sheet S is inserted from above between the guide blocks 173 to be placed on the supporting rails 171 by the lead frame side edge portion. Two sheet pressing plates 174 (only one is shown) are arranged on each guide block 173. The sheet pressing plates 174 normally extend inwardly, and when the IC sheet S is inserted from above, they are extended outwardly to allow insertion of the IC sheet S. After insertion of the IC sheet, the plates 174 again extend inwardly to prevent the IC sheet S from being ejected. Note that the IC sheet S is often bent during its manufacture. However, the sheet pressing plates 174 suppress the bending of the IC sheet to hold it flat. The bending of the IC sheet is suppressed by the guide grooves of the guide rails 170 during the subsequent stepwise feed, thus allowing satisfactory press cutting.

As shown in FIGS. 24 and 25, the guide rails 170 are mounted on the lower-mold die holder 110 by lifters 180 at positions adjacent to their ends to be vertically movable. As shown particularly in the right portion of FIG. 25, each lifter 180 has a body 181 fixed to the die holder 110, and a lift pin 182 is mounted in the body 181 by a linear ball bearing 183 to be vertically movable. The upper end portion of the lift pin 182 is inserted in the hole of the corresponding supporting rail 171 of the guide rail 170, and the lower end portion thereof is inserted in the hole of the die holder 110, so that the guide rails 170 are biased upward by the action of a compression coil spring 184. A stopper plate 185 is fixed to the upper surface of the lifter body 181, and a pawl 186 fixed to the lower surface of the corresponding guide rail 170 is engaged with the lower surface of the stopper plate 185, thus defining the upper limit lift position (upper dead point) of the guide rail 170. As will be described later, the guide rails 170 are held at a level higher than that of the upper surface of the dies DE1 to DE5 in a non-press state wherein the upper mold B20 is located at its upper position. On the other hand, during the press process in which the upper mold B20 is moved downward, the guide rails 170 are pushed downward by the upper mold B20 to the level of the dies DE1 to DE5, thus performing IC sheet cutting. The lift operation of the guide rails 170 is associated with the IC sheet feed operation by the feed rod assembly B32.

Although not shown, a large number of sensor light transmission holes for detecting the IC sheet position are formed in the supporting rails 171 and the cover plates 172 of the guide plates 170. A large number of elongated holes are formed in the cover plates 172 so as to allow engagement of feed pins 196 (FIG. 33) of the feed rod assembly B32 with the feed holds of the IC sheets.

(2) Feed rod assembly

Figure 33:
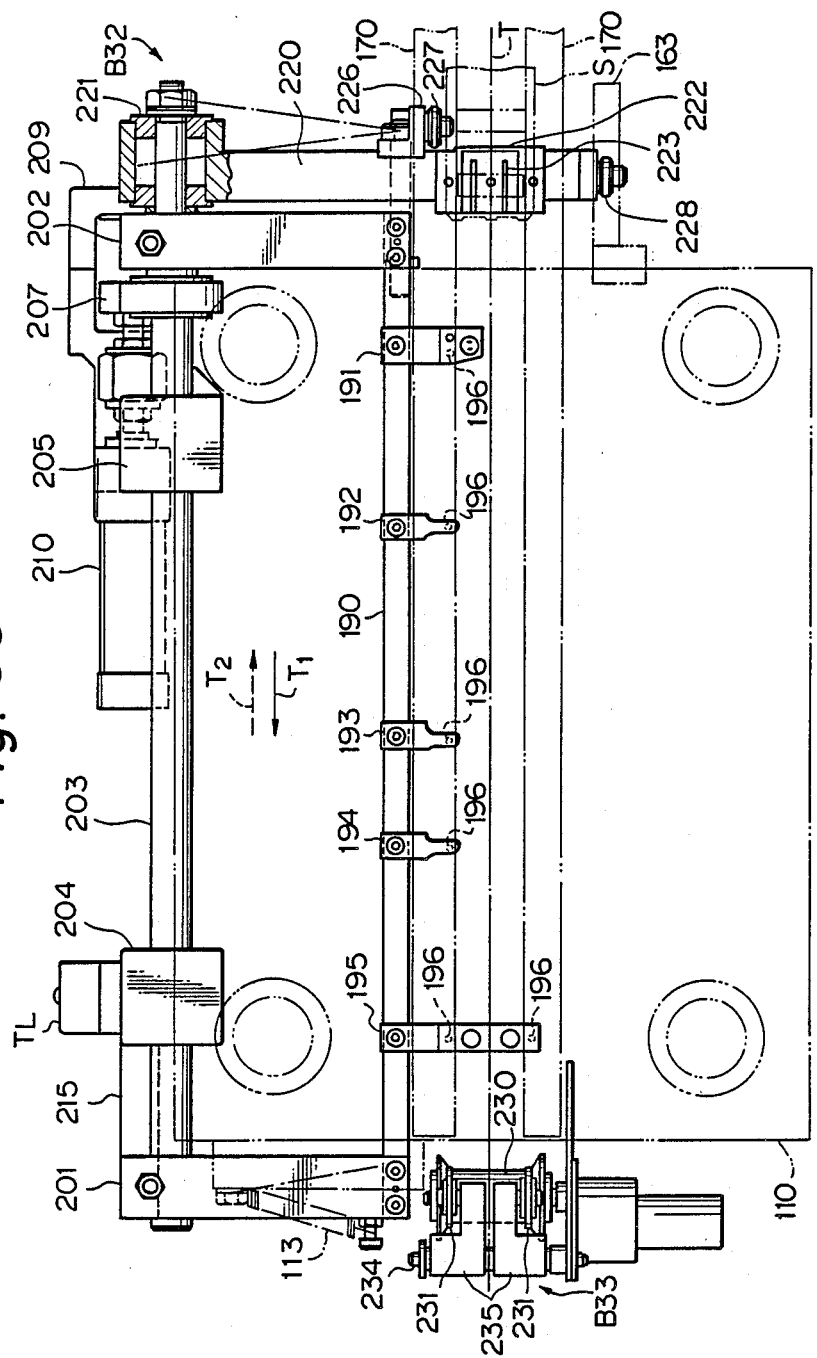

As shown in FIG. 33, the feed rod assembly B32 has a feed rod 190 extending parallel to the guide rails 170 (indicated by imaginary lines), and feed arms 191 to 195 are mounted on the feed rod 190 to be perpendicular thereto. One or two feed pins 196 extending downward are arranged on the lower surface of each feed arm. These feed pins 196 are engaged with the holes of the lead frame F of the IC sheet S (see FIG. 5) to perform the sheet feed operation.

The two end portions of the feed rod 190 are respectively fixed to free end portions of a double-arm lever 201 and a single-arm lever 202. These levers 201 and 202 are swingable about a supporting shaft 203 but are not movable in its axial direction. More specifically, the feed rod 190, the levers 201 and 202, and the supporting shaft 203 constitute a rectangular frame (to be referred to as "feed rod frame" hereinafter), in which the feed rod 190 is swingable about the supporting shaft 203.

Figure 34:
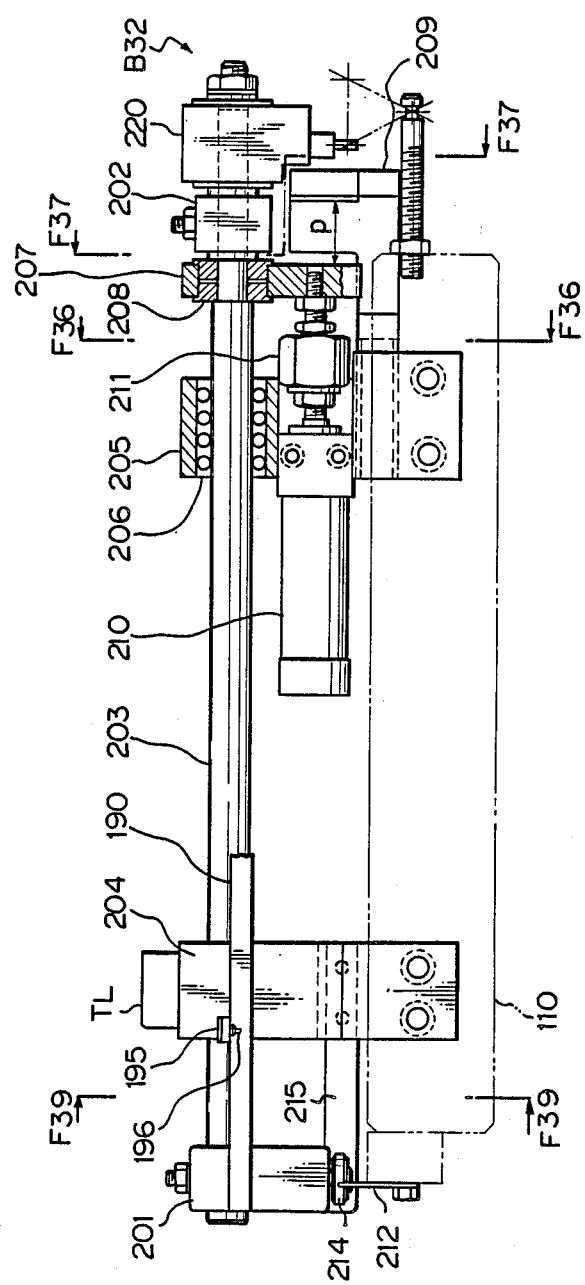
Figure 36:
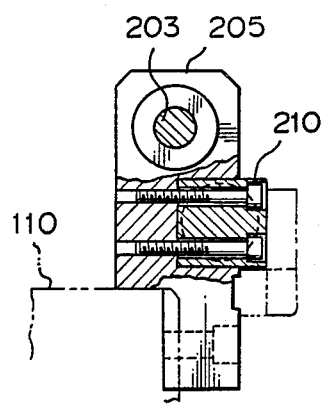
Figure 37:
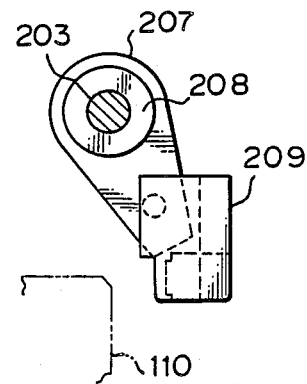

The feed rod frame is mounted on the lower-mold die holder 110 by a pair of bearings 204 and 205. These bearings 204 and 205 are fixed by their lower portions to the die holder 110, as shown in FIGS. 34 and 36, and support the supporting shaft 203 of the feed rod frame by the linear ball bearings 206 at their upper portions so as to be reciprocal in its axial direction. A driving rod 207 (see FIG. 37) is mounted on the supporting shaft 203 adjacent to the single-arm lever 202 by a pair of collar bearings 208 to be pivotal thereabout but not movable in the axial direction of the supporting shaft 203. A direct-mount type air cylinder 210 is mounted on the bearing 205 of the supporting shaft 203 (see FIG. 36), and its piston rod is coupled to one end of the driving rod 207 through a floating joint 211. When the air cylinder 210 is operated, the feed rod frame is reciprocated in the directions indicated by arrows T1 and T2 along the IC sheet feed path T, as shown in FIG. 33. A stopper plate 209 (FIGS. 33 and 37) is fixed to the bearing 205, so that the driving rod 207 abuts against the stopper plate 209 so as to define a movement stroke p (shown in the right side portion in FIG. 34) of the feed rod frame. This movement stroke p corresponds to the IC sheet feed interval, as described later.

Figure 38:
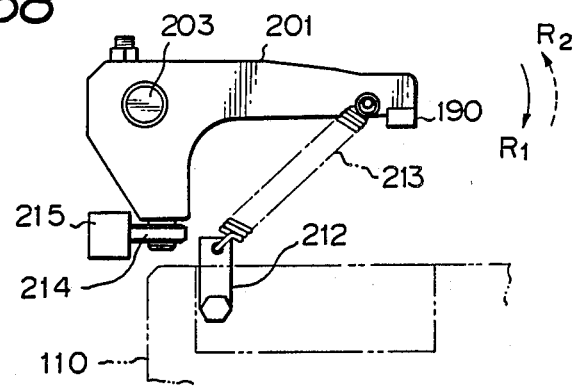

As clearly shown in FIG. 38, a tension coil spring 213 is extended between the horizontal arm of the double-arm lever 201 of the feed rod frame and a bracket 212 fixed to the lower-mold die holder 110, so that the feed rod frame is always subjected to a force for the rotation about the supporting shaft 203 thereof in the direction indicated by arrow R1 (FIG. 38). A roller 214 is pivoted to the lower end of the vertical arm of the double-arm lever 201 and abuts against the front surface of a horizontal stopper rail 215 (see FIGS. 33 and 34) fixed to the bearing 204 of the supporting shaft 203 so as to restrict the rotation of the feed rod frame in the direction indicated by arrow R1, thereby holding it in a normal horizontal position substantially as high as the level of the guide rails 170. When the feed rod frame is reciprocated in the directions indicated by arrows T1 and T2, the roller 214 is rotated, while abutting against the stopper rail 215.

Figure 39:
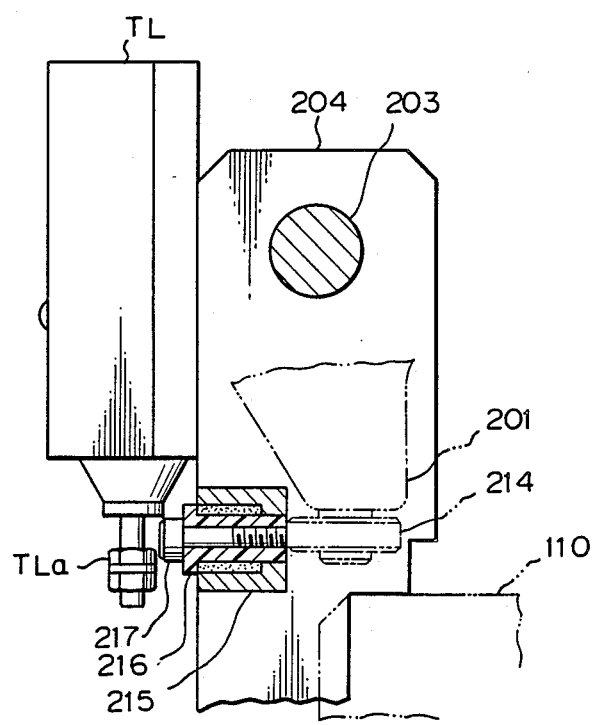

Further, as shown in FIG. 39, an insulating bushing 216 made of electrical insulator is studded in the stopper rail 215, and a screw-like contact terminal 217 formed of a conductor is screwed therein to extend to the roller abutting surface of the rail 215. A touch limit TL is fixed to the back surface of the bearing 204, and a terminal TLa thereof is connected to the terminal 217 through a lead wire (not shown). The roller 214 is formed of a conductor, and can be electrically connected to the touch limit TL through the lever 201, the supporting shaft 203, and the bearing 204. Therefore, when the roller 214 is in contact with the contact terminal 217, an electrically closed circuit is formed, thereby detecting that the roller 214 abuts against the rail 215, that is, the feed rod frame is held at a normal horizontal position. As will be described later, if the feed pins 196 of the feed rod 190 cannot be successfully inserted in the feed holes of the IC sheet and the feed rod frame is pushed up in the direction indicated by arrow R2, the roller 214 is released from the rail 215, i.e., the contact terminal 217 upon pivotal movement of the double-arm lever 201, and the electrical circuit is opened, thus detecting that the feed pins 196 and the feed holes of the IC sheet cannot be successfully engaged with each other.

Figure 35:
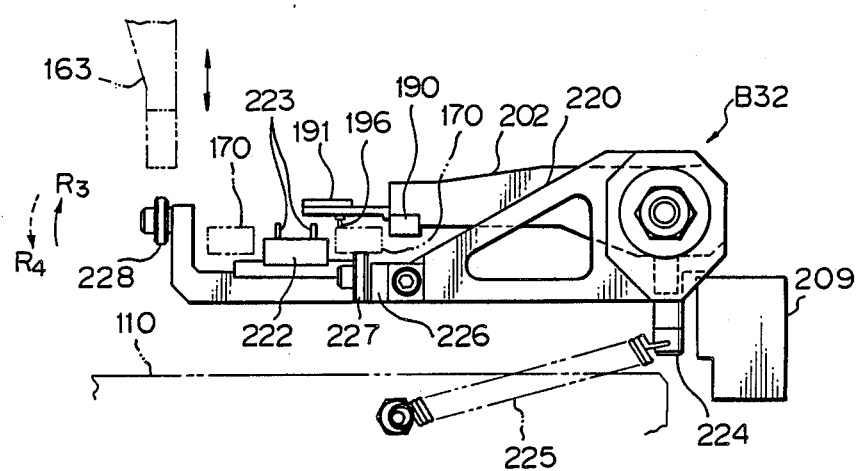

As shown in FIGS. 33 and 34, the supporting shaft 203 of the feed rod frame extends outwardly from the single-arm lever 202, and a sheet feed lever 220 is mounted on the extending portion of the feed rod frame by a pair of collar bearings 221 (see FIG. 33) to be pivotal but not to be movable in the axial direction of the supporting shaft 203. As shown in FIGS. 33 and 35, a bracket 222 is fixed near the distal end portion of the lever 220 to coincide with the IC sheet feed path T, and two sheet feed plates 223 are arranged on the upper surface of the bracket 222 to be parallel to each other. The sheet feed plates 223 are in frictional contact with the lower surface of an IC resin mold of the IC sheet S (FIG. 33) placed on the sheet feed portions of the guide rails 170. When the lever 220 is moved in the direction indicated by arrow T1 together with the feed rod frame as will be described later, the plates 223 serve to feed the IC sheet S.

As shown in FIG. 35, a tension coil spring 225 is extended between a bracket 224 fixed to the proximal end portion of the lever 220 and the lower-mold die holder 110, thereby applying to the lever 220 an upward force for the rotation in the direction indicated by arrow R3. As shown in FIGS. 33 and 35, a roller 227 is rotatably arranged on a bracket 226 fixed to the central portion of the lever 220, and abuts against the lower surfaces of the guide rails 170 to define a pivotal upper limit position of the lever 220. A roller 228 is rotatably arranged on the distal bent portion of the lever 220. The roller 228 is provided in correspondence with the lever 163 of the upper mold B20. When the roller 228 is pushed downward by the lever 163 during downward movement of the upper mold B20, the lever 220 is pivoted in the direction indicated by arrow R4. The rollers 227 and 228 respectively abut against the driving rod 207 and the guide rails 170 and are rotated when the lever 220 is moved in the directions indicated by arrows T1 and T2 together with the feed rod frame.

The operation of the sheet guide assembly B31 and the feed rod assembly B32 is now described.

(i) First, the feed rod frame of the feed rod assembly B32 and the sheet feed lever 220 are located at positions to which they are driven by the air cylinder 210 in the direction indicated by arrow T2 (i.e., the positions shown in FIGS. 33 and 34). In this state, when the upper mold B20 is held in its upper position (i.e., non-press position), the guide rails 170 of the sheet guide assembly B31 are lifted by the lifters 180 to a level as high as that of the feed rod 190, and the feed pins 196 of the feed arms 191 to 195 are engaged with the corresponding feed holes of the IC sheet S. Meanwhile, the sheet feed lever 220 of the feed rod assembly B32 is also pivoted to its upper position, and the sheet feed plates thereof are brought into frictional contact with the ICs of the IC sheet S placed on the sheet feed portions of the guide rails 170.

(ii) Next, the feed rod 190 and the feed lever 220 are driven by the air cylinder 210 in the direction indicated by arrow T1, and the IC sheet is fed by one interval p in the same direction.

(iii) After the IC sheet feed operation, the upper mold B20 is moved downward, thus performing a press machining operation. At this time, upon downward movement of the upper mold B20, the guide rails 170 are pushed downward, and the IC sheet S is released from the feed pins 196 of the feed rod 190. At the same time, the sheet feed lever 220 is pivoted downward, and the IC sheet feed plates 223 are released from the ICs. In this state, the air cylinder 210 is operated in the reverse direction, and the feed rod 190 and the feed lever 220 are driven in the direction indicated by arrow T2.

(iv) Thereafter, the upper mold B20 is moved upward to the non-press position, and upon this movement, the guide rails 170 and the feed lever 220 are also moved upward, so that the feed pins 196 are engaged with the feed holes of the IC sheet and the sheet feed plates 223 are in contact with the ICs, thus performing the next sheet feed operation.

In the above operation (iv), if the feed pins 196 cannot be successfully engaged with the feed holes of the IC sheet for any reason, the feed rod 190 is pushed upward about the supporting shaft 203 (in the direction indicated by arrow R2 in FIG. 38), and the roller 214 is released from the stopper rail 215. This state is then detected by the touch limit TL. Thus, not only the IC sheet cutting press B but also the entire IC sheet processing apparatus is stopped.

(3) Ejector

Figure 3:
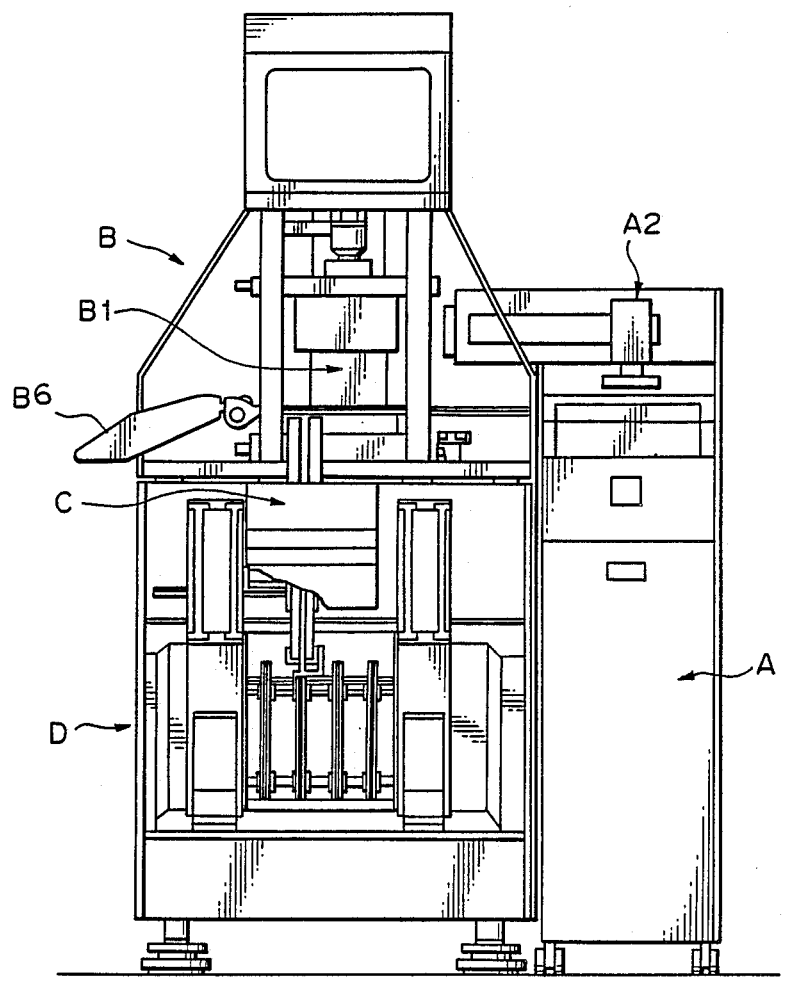
Figure 40:
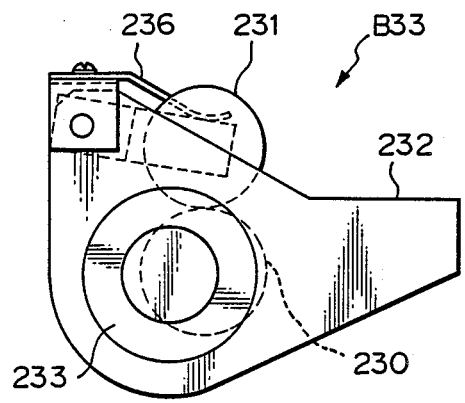
Figures 41A, 41B:
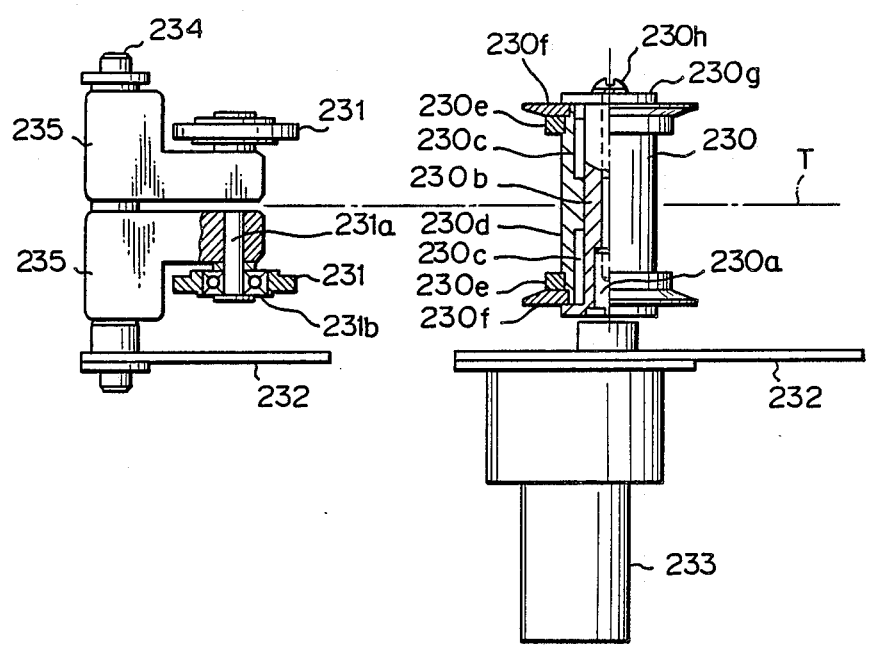
FIGS. 41A and 41B are exploded plan views of the ejector.

As shown in FIGS. 40, 41A, and 41B, the ejector B33 has an eject roller 230 and a pair of pressing rollers 231, which are vertically aligned. The eject roller 230 has a structure shown in FIG. 41B, wherein a sleeve 230b is mounted on a spindle 230a supported, through a cantilever bearing, by a bracket 232 fixed to the lower-mold die holder 110. A drum 230d is arranged on the sleeve 230b through two one-way clutches (shell-type roller clutches) 230c, a friction roller 230e and a guide flange 230f are respectively arranged at two end portions of the drum 230d, and a portion opposite to the spindle 230a is fixed by a pressing plate 230g and a screw 230h. When the spindle 230a is rotated at high speed by an electrical motor 233 with reduction gears, the drum 230d is rotated at high speed. Note that the one-way clutches 230c allow the drum 230d to be rotated in a forward direction (in the IC sheet eject direction) but not to be rotated in the reverse direction. The pressing rollers 231 are rotatably mounted, via shafts 231a and bearings 231b, on the distal end portions of a pair of swing arms 235 mounted on a supporting shaft 234 which is supported by the bracket 232 in a cantilever manner. As shown in FIG. 40, the pressing rollers 231 are urged against the friction rollers 230e of the eject roller 230 by a biasing force of a spring 236 fixed to the bracket 232. Thus, the lead frame F (waste sheet) left after the IC punching operation is clamped between the friction rollers 230e and the pressing rollers 231 and is quickly ejected to a waste sheet chute B6 (FIGS. 2 and 3).

IC sheet cutting operation

The IC sheet cutting operation by the IC sheet cutting press B described above is performed as follows.

(i) The press mold unit B1 is assembled into a unit, after the lower mold B10, the upper mold B20, and the IC sheet feed mechanism B30 are individually adjusted and preassembled in correspondence with IC sheets to be cut. Then, the press mold unit B1 is mounted on the press table B3. Upon mounting, the upper mold B20 is automatically coupled to the press ram B2. Then, the air joint block 137 is connected to air lines and vacuum pressure lines, and the electric wirings for the photosensors are connected to a connector (not shown), whereby the apparatus is ready for operation. First, the upper mold B20 is located at its upper position, i.e., the non-press position, and the feed rod frame (190, 201, 202, and 203) of the feed rod assembly B32 of the sheet feed mechanism B20 and the sheet feed lever 220 are located at positions to which they have been driven in the direction indicated by arrow T2 (note that the driving operation of the feed rod frame and the sheet feed lever will be referred to simply as "the driving operation of the feed rod assembly B32" hereinafter).

(ii) In operation, first, one IC sheet S is fed to the sheet feed position of the guide rails 170 of the IC sheet feed mechanism B30 by the IC sheet feeding section A2 from the IC sheet loader A. At this time, as described above, the IC sheet S is flattened by the sheet pressing plates 174 and thus undesirable ejection is avoided.

(iii) After the IC sheet is fed, the air cylinder 210 of the IC sheet feed mechanism B30 is operated, and the feed rod assembly B32 is driven in the direction indicated by arrow T1, so that the IC sheet S on the sheet feed portion is fed through one interval by the feed lever 220. Then, the upper mold B20 is moved downward by the press ram B2, so that the guide rails 170 and the sheet feed lever 220 are pushed downward. In this state, the feed rod assembly B32 is driven by the air cylinder 210 in the direction indicated by arrow T2 to its initial position. Thereafter, the upper mold B20 is moved upward, and the guide rails 170 and the feed lever 220 are moved upward. In the illustrated embodiment, the sheet feed portion of the guide rails 170 is apart by 2p from a position at which the feed pins 196 of the feed rod 190 are first engaged with the feed holes of the IC sheet S. Therefore, the feed operation by the feed lever 220 is performed twice.

(iv) After the two feed operations, the pins 196 of the first feed arm 191 are engaged with the feed holes of the IC sheet. In this state, the feed rod assembly B32 is driven in the direction indicated by arrow T1, and the IC sheet S is fed by the feed rod 190. After completion of the feed operation, the upper mold B20 is moved downward, and upon this downward movement, the guide rails 170 are moved downward, thus releasing the IC sheet S from the feed pins 196. In this state, the feed rod assembly B32 is driven in the direction indicated by arrow T2 to its initial position. Thereafter, when the upper mold B20 is moved upward, the guide rails 170 are also moved upward, and the next feed holes of the IC sheet S are engaged with the feed pins 196, to thus perform the next feed operation. As the IC sheet is fed stepwise, the feed pins 196 of the feed arms 192 to 195 perform the stepwise feed operation. In the illustrated embodiment, the feed start position of the feed rod 190 is apart by 2p from the resin punching position. Therefore, two more feed operations (four times from the sheet feed portion) are performed until the leading IC of the IC sheet S is fed to the resin punching position.

(v) When the leading IC has reached the resin punching position, the leaked resin is punched by the die DE1 and the punch PH1 during the press process of the upper mold B20, as shown in FIG. 6. Thereafter, each time the IC sheet is fed by 2p, 1p, 2p, and 2p, the dam bar cutting, lead cutting, tie bar pinch forming, and punching operations are performed by the dies DE2 to DE5 and the punches PH2 to PH5, thus separating the IC from the lead frame F. The separated IC is drawn by vacuum suction in the die DE5, is pushed onto the guide rail 125 by the air cylinder 124, and is then fed to the bending press C.

(vi) In this manner, the IC sheet S is progressively fed and cut, and when its trailing end is send out of the sheet feed portion of the guide rails 170, the next IC sheet is fed from the IC sheet loader. Then, this IC sheet is subjected to the IC cutting operation while being similarly fed stepwise.

(vii) The waste sheet (lead frame F) after all the ICs are separated is quickly ejected to the waste sheet chute B6 immediately after the last IC is separated (i.e., before the upper mold B20 is moved upward and the feed holes of the lead frame F are engaged with the feed pins 196).

During the IC cutting operation described above, confirmation of the IC sheet feed operation to the IC sheet feed portion (i.e., the presence/absence of the IC sheet), detection of the IC sheet feed position along the guide rails, the feed operation of the separated ICs to the bending press, and ejection of the waste sheet are performed by photosensors. Although these photosensors and various other sensors are not shown, almost all of them are installed in the press mold unit B1, and others which can be arranged at predetermined positions regardless of the types of IC sheet, i.e., the types of press mold unit are arranged on the table B3 of the press B or other portions.

The IC sheet cutting press according to the present invention has the following advantages.

Since a plurality of types of press molds (dies and punches) for performing a series of press machining operations and the IC sheet feed mechanism for feeding the IC sheet are integrated as a unit, when the press is converted for machining another type of IC sheet, the entire press mold unit can be exchanged with another unit. Therefore, various complex adjustments, e.g., alignment between respective press molds and alteration of sheet feed interval, can be omitted, and conversion can be easily performed in a very short period of time. In particular, as in the above embodiment, when different press mold units include a common structure for mounting on the press table and coupling with the press ram, exchange of press mold units is standardized, and can be easily performed by an unskilled operator.

The exchange of press mold units in a short period of time allows the down time of the press to be shortened and improves operating efficiency, thus high production capabilities are realized.

Easy conversion of the cutting press for machining another type of IC sheet, provides high flexibility to the press apparatus.

In the press mold unit, since the press molds and the IC sheet feed mechanism are individually and detachably mounted on the die set, with appropriate planning and combining, only a minimum number of necessary types of the press molds, the IC sheet feed mechanism, and die sets are needed to prepare and assemble a desired press mold unit. Therefore, a complete press mold unit need not be prepared for each type of IC sheet, resulting in great advantage in terms of manufacturing cost.

Note that detailed arrangements of the lower mold, the upper mold, and the IC sheet feed mechanism of the press mold unit are not limited to those shown in the drawings, and various modifications may be made. However, the embodiment shown in the drawings further has the following advantages.

Since the press mold unit performs the tie bar pinch forming operation before the punching operation during the IC sheet cutting process, the tie bar cutting operation is facilitated so that the formation of cutting burrs on the tie bar, and damage to IC packages can be prevented.

This aspect is now described below in detail.

Figure 44A:
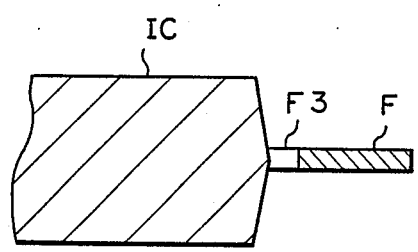
FIGS. 44A, 44B, and 44C show a tie-bar pinch forming step and a punching step, and are sectional views taken along directions indicated by arrows F44A, F44B, and F44C in FIG. 6, respectively.
Figure 44B:
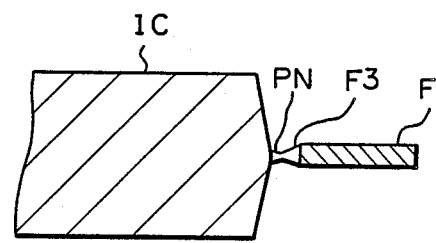
Figure 44C:
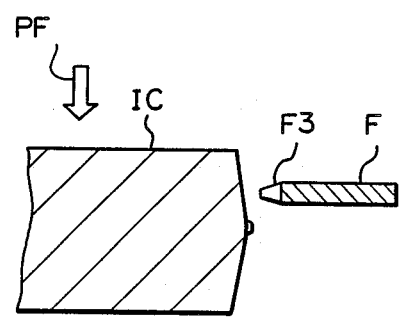

As shown in FIGS. 44A, 44B, and 44C, during the punching operation, a press force is applied to an IC to cut its tie bar F3 by a shearing force. However, the tie bar F3 has the same thickness as that of the lead frame and has a relatively large mechanical strength. Therefore, a considerably large press force is required. In addition, burrs may be formed on the cutting surface of the tie bar or IC mold packages may crack.

In the above embodiment of the present invention, the tie bar pinch forming press mold (DE4 an PH4) is arranged between the lead cut press mold (DE3 and PH3) and the punching press mold (DE5 and PH5), so that pinches are formed in tie bar cutting portions before the tie bar cutting operation by punching.

Figure 42:
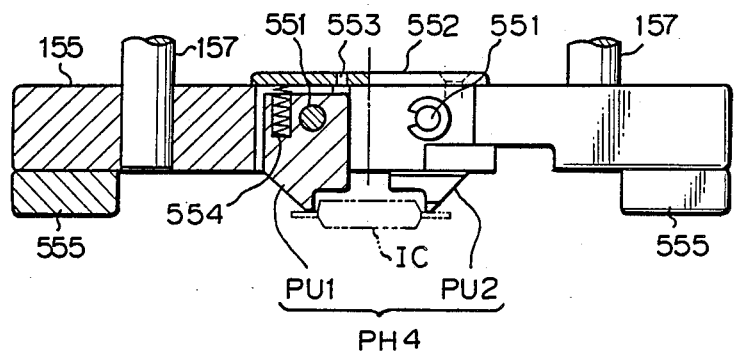
Figure 43:
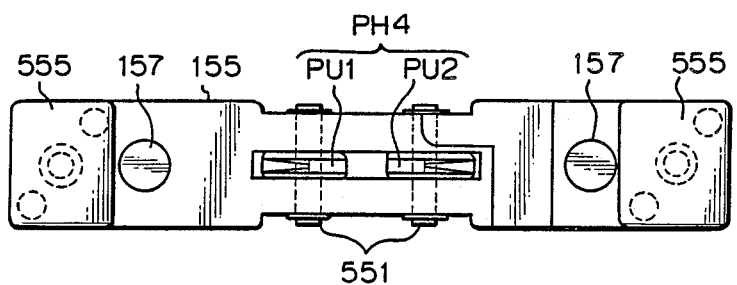

FIGS. 42 and 43 illustrate the main part of the punch PH4 for the tie bar pinch forming press mold. The punch PH4 has a pair of punches PU1 and PU2, and these punches are inserted in a central hole of the sheet pressing plate (stripper plate) 156, and are pivotally supported by pins 551 mounted on the plate 155. A cover plate 552 is fixed to the upper side of the central hole of the sheet pressing plate 155. A stop pin 553 arranged on the cover plate 552 restricts pivotal movement of the punches PU1 and PU2 during the pinch forming operation. A compression coil spring 554 is interposed between the punches PU1 and PU2 and the cover plate 552, so as not to move the punches PU1 and PU2 in the non-press state. Note that reference numeral 157 denotes guide pins for mounting the plate 155 to the punch plate 151 or the intermediate plate 152 to be vertically movable.

Although not shown, the die DE4 of the lower mold B10 facing the punch PH4 also has a pair of similar punches to those of the punch PH4. When the upper mold B20 performs the press operation, the tie bar F3 of the IC sheet S is pressed vertically by the distal end tips of the punches of the punch PH4 and the die DE4, thus forming a pinch PN, as shown in FIG. 44B. The pinch amount (pressed amount) of the pinch PN is defined by an adjusting plate 555 fixed to the lower surface of the plate 155. For example, if the tie bar F3 has a thickness of 0.43 mm, the distal end tips of the punches PU1 and PU2 of the punch PH4 are set to be offset from the lower surface of the adjusting plate 555 by 0.18 mm, and the same setting operation is performed for the die DE4. Then, the tie bar F3 is pressed from the both sides by 0.18 mm, so that the portion formed with the pinch PN has a thickness of 0.43 −(0.18×2)=0.07 mm. The portion having such a thickness can be cut by a very small press force.

As shown in FIG. 44C, the tie bar F3 can be easily cut by a small press force PF during the punching operation. Therefore, burning of the cutting surface of the tie bar and cracking of the resin mold package of the IC are avoided, thus improving the quality of ICs and manufacturing yield.

As for the sheet feed mechanism, the feed rod assembly is simply reciprocated along the IC sheet feed path, and the guide rails of the sheet guide assembly are moved vertically to engage or disengage the IC sheet and the feed pins. More specifically, since the IC sheet feed holes are simply moved with respect to the feed pins in their axial directions, engagement and disengagement therebetween can be smoothly performed. Therefore, an engagement error will rarely occur, and a highly reliable IC sheet feed operation can be realized. Smooth engagement or disengagement allows a high engagement precision between the feed holes and the feed pins. Therefore, the sheet feed operation can be performed with higher precision than in a conventional apparatus. Further, even if an engagement error occurs between the feed pins and the feed holes, the feed rod frame is moved upward, thus detecting the error by the touch limit.

The guide rails of the sheet feed mechanism and the sheet feed lever are driven by downward movement of the upper mold and the action by the spring. Therefore, a special driving mechanism is not required, and complete synchronization with the press machining operation can be obtained.

When an IC sheet is mounted on the press mold unit, in particular, the sheet feed mechanism, the IC sheet can be automatically flattened, and the IC sheet can be maintained in an unbent condition during the IC sheet cutting operation, thus allowing a satisfactory IC sheet cutting operation.

A waste sheet (lead frame) from which IC's have been separated is clamped between the eject roller and the pressing rollers of the ejector, for quick ejection. Therefore, even if the feed pins of the IC sheet feed mechanism have drifted from the feed holes of the waste sheet, waste sheet ejection can be reliably performed. Thus, the press operation is not hampered due to waste sheet jam, thus realizing a smooth and efficient IC cutting operation.

Note that the IC sheet processing apparatus described above is constituted by combining the IC sheet cutting press B with other devices A, C, and D. However, the IC sheet cutting press can be independently used as a matter of course.

IV. IC lead bending press

Figure 45:
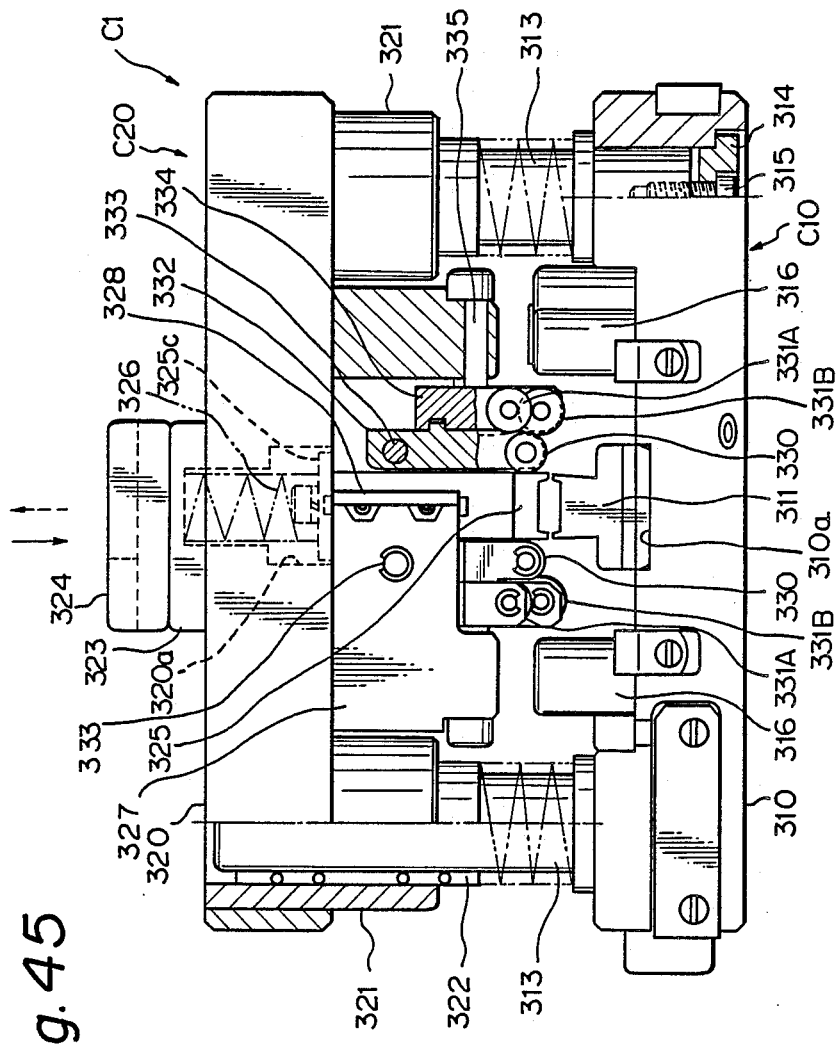
Figure 46:
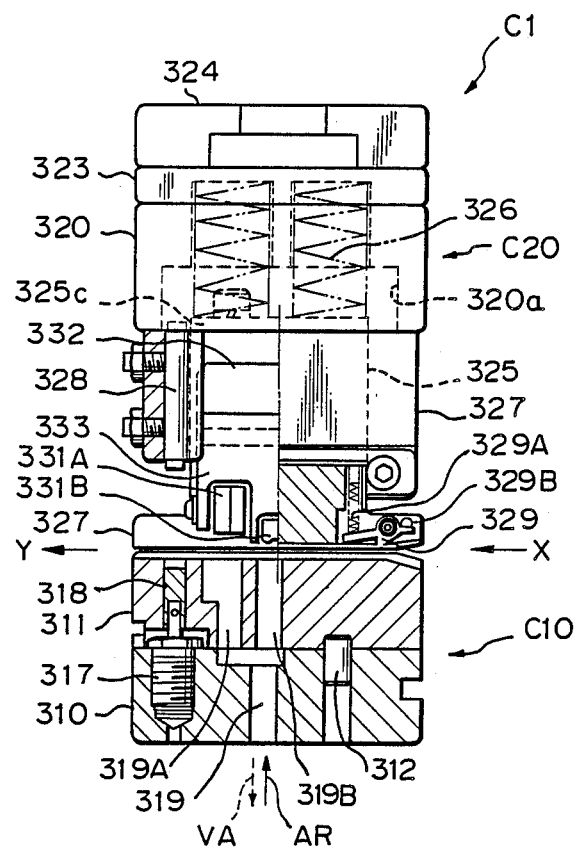

The IC lead bending press C has a press mold unit C1 as schematically illustrated in FIG. 4. The press mold unit C1 is mounted on a frame C2 and is driven by a press ram (not shown) arranged on the upper portion of the frame. The press mold unit C1 has a lower mold C10 and an upper mold C20, as shown in FIGS. 45 and 46. The arrangements of these components will be described hereinafter.

(a) Lower mold

Figure 48:
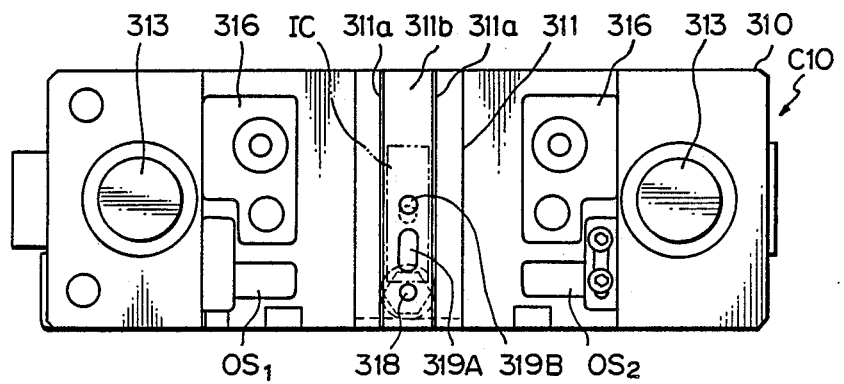
Figure 49:
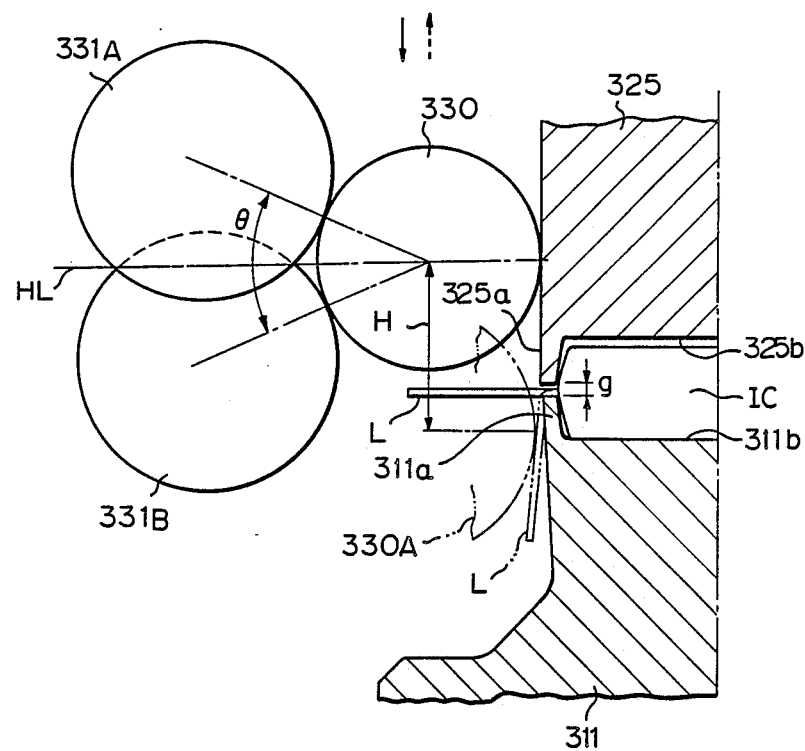
Figure 50:
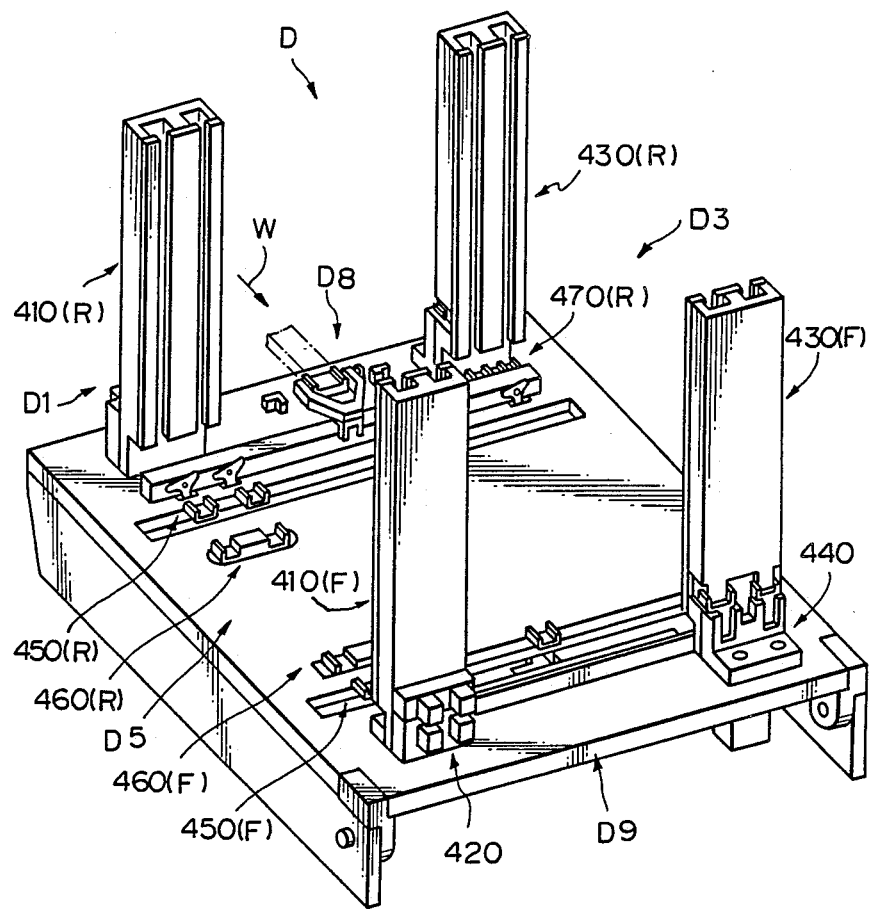
FIG. 50 is a schematic perspective view of the IC unloader.

As shown in FIGS. 45, 46, and 48, the lower mold C10 has a die holder 310. A groove 310a (FIG. 45) is formed in the central portion of the upper surface of the die holder 310, and a lower die 311 is fitted therein. The lower die 311 is positioned along the longitudinal axis by a parallel pin 312 (FIG. 46), and is then fixed to the die holder 310 by a bolt (not shown). As shown in FIG. 49, the lower die 311 has flanges 311a at two sides of its top portion, so that a resin mold package of an IC is fitted in a groove 311b between the flanges 311a.

Guide posts 313 are arranged on the two end portions of the die holder 310 and are fixed by retainers 314 and bolts 315 at their lower ends. These guide posts 313 are engaged with guide bushings 321 of the upper mold C20, as will be described later. Two stopper blocks 316 of the upper mold C20 are fixed to the upper surface of the die holder 310, and abut against stopper blocks 327 of the upper mold C20 to define the lower dead point of the upper mold C20.

IC positioning mechanism

The die holder 310 has a mechanism for positioning an IC fed from the cutting press B through an IC shoot G (FIG. 4) to a predetermined lead bending position. More specifically, a screw-in type small air cylinder 317 is mounted near the end portion on the IC exit side of the die holder 310 (the left side in FIG. 46). The piston rod of the air cylinder 317 is coupled to a stopper pin 318. The stopper pin 318 is slidably inserted in a hole formed in the lower die 311. When the air cylinder 317 is operated (ON), the upper end portion of the stopper pin 318 projects inside the top groove 311b of the lower die 311, and the leading end face of the resin mold package of the IC fed in the groove 311b from the direction indicated by arrow X abuts against the projected end portion of the stopper pin 318, thus stopping the IC at that position. When the stopper pin 318 is retracted inside the lower die 311, the IC after the lead bending operation can be ejected in the direction indicated by arrow Y.

Air passages 319, 319A, and 319B are formed in the die holder 310 and the lower die 311 at the position near and before the air cylinder 317 and the stopper pin 318. The air passage 319 of the die holder 310 is selectively connected to a vacuum pump and compressed air source (neither are shown) through a solenoid valve via an air passage (not shown) formed in the base plate of the frame C2 on which the press mold unit C1 is mounted. The lower ends of the air passages 319A and 319B of the lower die 311 communicate with the air passage 319 of the die holder 310, and upper ends thereof are open to the groove 311b. When an IC is to be stopped and held at the lead bending position, a vacuum VA is applied to the air passages 319A and 319B through the air path 319. A suction force then acts on the IC in the groove 311b of the lower die 311, so that impact produced when the IC abuts against the stopper pin 318 is reduced and a rebound after abutting is prevented. When the IC is ejected after the lead bending operation, compressed air AR is fed to the air passages 319A and 319B through the air passage 319, and the IC is discharged in the direction indicated by arrow Y by an air jet.

As shown in FIG. 48, a transmission type photosensor consisting of a light emitting element OS1 and a light receiving element OS2 is arranged at two sides of the IC stop position. The presence/absence of the IC at the IC stop position can be detected by the photosensor, and the operation of the air cylinder 317, a solenoid valve for switching vacuum and compressed air, and the press mold unit can be controlled accordingly.

(b) Upper mold

Figure 47:
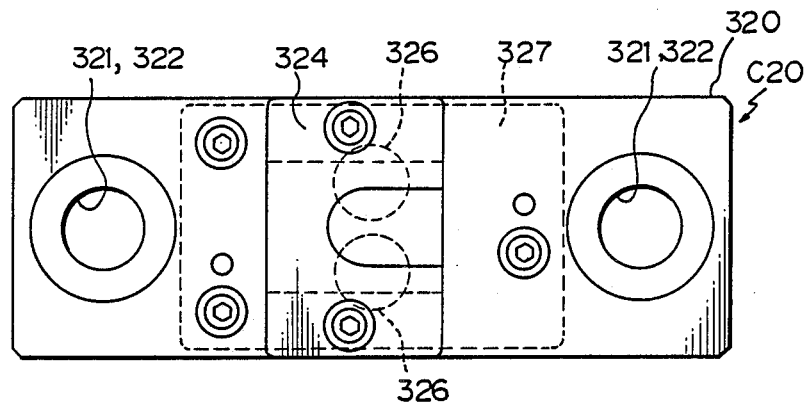

As shown in FIGS. 45 to 47, the upper mold C20 has a die holder 320, and guide bushings 321 are arranged at two end portions thereof. The guide posts 313 of the lower mold are engaged with the guide bushings 321 through roller bearings 322, thereby mounting the upper mold C20 on the lower mold C10 for vertical movement relative thereto. A cover plate 323 and a ram coupling member 324 are fixed to the upper surface of the die holder 320. The distal end of a piston rod (not shown) of the press ram arranged on the frame C2 is engaged with the ram coupling member 324, thereby vertically driving the upper mold C20 with respect to the lower mold C10 (press operation).

A hole 320a is formed in the central portion of the die holder 320, and an upper die 325 is suspended by a pair of springs 326 arranged in the hole 320a.

An annular stopper block 327 surrounding the upper die 325 is fixed to the lower surface of the die holder 320 by a bolt. A cross roller guide 328 is fixed to the inner surface of the front wall (the left wall in FIG. 46) of the stopper block 327 by a bolt, so that the upper die 325 is vertically guided by the cross roller guide 328. As shown in FIG. 49, the upper die 325 has flanges 325a at two sides of its lower end, so that the resin mold package of the IC is fitted in the groove 325b between the flanges. More specifically, the flanges 311a and the groove 311b of the lower die 311 and the flanges 325a and the groove 325b of the upper die 325 together constitute an IC feed guide and a holder. Note that the lower limit position of the upper die 325 when the upper mold C20 is at its upper dead point (non-press position) is defined by a stopper plate 325c fixed to the upper end of the upper die 325, so that a gap g between the flanges 311a of the lower die 311 and the flanges 325a of the upper die 325 becomes slightly larger than the thickness of the lead terminal L of the IC, e.g., about 0.5 mm. The lower dead point (press position) of the upper mold C20 is defined when the stopper block 327 of the upper block C20 abuts against the stopper block 316 of the lower mold C20. At this time, although not shown, the upper die 325 is retracted inside the die holder 320 against the biasing force of the springs 326, and presses and holds the lead terminals L of the IC against the flanges 311a of the lower die 311 by the reaction force of the springs 326.

As shown in FIG. 46, a lever 329 is pivotally supported at the IC entrance side of the upper die 325 of the upper mold C20, and is slightly biased downward by a spring 329A and is held at a predetermined position by a stopper pin 329B. The lever 329 allows passage of the IC in the direction indicated by arrow X but prevents the IC once entered in the press mold unit C1 from being ejected from the entrance thereof.

Bending roller and Backup roller

A pair of bending rollers 330 for bending the IC lead terminals L and backup rollers 331A and 331B for backing them up are arranged on the stopper block 327 of the upper mold C20.

The bending rollers 330 are pivotally supported on the lower end portion of a bracket 332, and the upper end portion of the bracket 332 is supported by the stopper block 327 by means of a supporting shaft 333. Upon vertical movement of the upper mold C20, the bending rollers 330 are rotated vertically along the outer surfaces of the upper and lower dies 325 and 311, and the IC lead terminals L extending out from the dies 311 and 325 are bent downward at a substantially right angle, as shown in FIG. 49.

The backup rollers 331A and 331B are offset vertically to be symmetrical about a horizontal axis HL (FIG. 49) passing through the center of the bending rollers 330 and are pivotally supported by a bracket 334 outside the bending rollers 330 (i.e., on the sides opposite to the dies 311 and 325). Note that as shown in FIG. 46, two upper backup rollers 331A are respectively arranged on the entrance and exit sides along the IC feed direction, and one lower backup roller 331B is arranged at the center. The bracket 334 is coupled to the roller bracket 332 by the projection and the groove, as shown in FIG. 45, and is vertically movable together with the bracket 332. Therefore, the backup rollers 331A and 331B are vertically moved together with the bending rollers 330, and are in rolling contact with the bending rollers 330. The rollers 331A and 331B back up the bending rollers 330 upon reception of the reaction force which is applied from the lead terminals L to the rollers 330 during the IC lead bending operation. The backup roller bracket 334 is backed up by a backup pin 335 arranged on the stopper block 327. Note that the backup pin 335 is set to have a small gap (about 0.01 mm) between the bracket 334 and itself.

The IC lead bending operation by the bending press C will now be described.

(i) An IC separated from the IC sheet S by the cutting press B is fed along the IC shoot G, and is inserted in the grooves 311b and 325b of the upper and lower dies 311 and 325 from the direction indicated by arrow X (FIG. 46). At this time, the stopper pin 318 of the lower die 311 projects inside the groove 311b, and a vacuum is applied to the air passages 319A and 319B of the lower die 311. Therefore, after the IC passes the lever 329 at the entrance, it is immediately braked by the suction force of the vacuum, and abuts against the stopper pin 318 to be stopped and positioned at the predetermined position.

Since the vacuum is utilized for stopping and positioning the IC, the IC which is fed along the IC shoot at high speed can be sufficiently decelerated to then abut against the stopper pin 318. Therefore, impact of the IC against the stopper pin 318 be reduced to a negligible level. As a result, damage to the resin mold package of the IC is prevented and rebound of the IC after abutting against the stopper pin can be avoided, thus allowing accurate and quick positioning.

Note that if an IC is very small and lightweight, its stop position can be accurately determined only by means of suction using the vacuum, and the stopper pin 318 can be omitted.

(ii) When the IC is located at the predetermined position (indicated by the imaginary line in FIG. 48), the IC is detected by the photosensor (OS1 and OS2), and the upper mold C20 is moved downward by the press ram (press operation).

Upon downward movement of the upper mold C20, the upper die 325 is moved downward together, and the lower end flanges 325a thereof urge the lead terminals L of the IC against the top flanges 311a of the lower die 311.

Thereafter, the upper die 325 is stopped upon contraction of the springs 326, and only the bending rollers 330 and the backup rollers 331A and 331B are moved downward. As shown in FIGS. 49, the lead terminals L extending out toward the two sides of the lower and upper dies 311 and 325 are bent downward by the bending rollers 330 at a substantially right angle. Note that in FIG. 49, reference symbol H denotes a vertical stroke of the bending rollers (i.e., press stroke of the upper mold C20).

During the lead bending operation, the bending rollers 330 are backed up by the backup rollers 331A and 331B. In this embodiment, since the backup rollers 331A and 331B are vertically arranged in two stages, even if the direction of the reaction force received by the bending roller 330 during the bending operation is changed, a satisfactory backup operation is allowed. Note that an opening angle $\theta$ of the backup rollers 331A and 331B with respect to the center of the bending rollers 330 is preferably set to fall within the range of 60° to 90°.

(iii) After the lead bending operation, the upper mold C20 is moved upward to the non-press position. Then, the stopper pin 318 of the lower die 311 is retracted and, at the same time, compressed air is blown from the air passages 319A and 319B of the lower die 311 upon switching of the solenoid valve. Then, the IC is ejected from the press mold unit C1 in the direction indicated by arrow Y and is fed to the IC unloader D. The ejection of the IC is detected by the photosensor (OS1 and OS2), and the bending press C then prepares for the next lead bending operation.

The IC lead bending press described above has the following advantages.

Since the bending rollers are in rolling contact with lead terminals friction between the lead terminals and the bending rollers will not occur, and thus peeling of a plating layer and scratches are prevented, and accordingly, a good product quality is assured.

Since the bending rollers are backed up by the backup rollers during the bending operation, displacement of the bending rollers can be prevented, and the bending operation can be accurately performed. Thereby, ICs with a high and uniform quality can be manufactured.

Since a vacuum and compressed air are utilized for positioning and ejecting the IC damage to the IC is prevented during positioning. In addition, since the IC can be quickly positioned and ejected, the lead bending operation can be performed with high efficiency.

Note that the IC bending press can be independently used as in the IC sheet cutting press described above.

V. IC unloader

The IC unloader D has an empty container stock section D1 for stocking empty containers in which ICs are to be stored, a full container stock section D3 for stocking full containers in which ICs are stored, a container conveying section D5, and an IC introduction section D8 for storing ICs in the empty container.

These sections D1, D2, D3, D5, and D8 are mounted on a common base D9 having a flat upper surface to constitute a single unit. The unit is mounted on a base frame of the apparatus to be inclined with respect to the horizontal plane so that the rear side (i.e., the IC introduction side adjacent to the lead bending press C) becomes higher than the front side, as shown in FIG. 4. ICs fed from the lead bending press C are stored in a cylindrical container CN shown in FIG. 51 by gravity. The respective sections of the IC unloader D will be described below.

(a) Container

Figure 51:
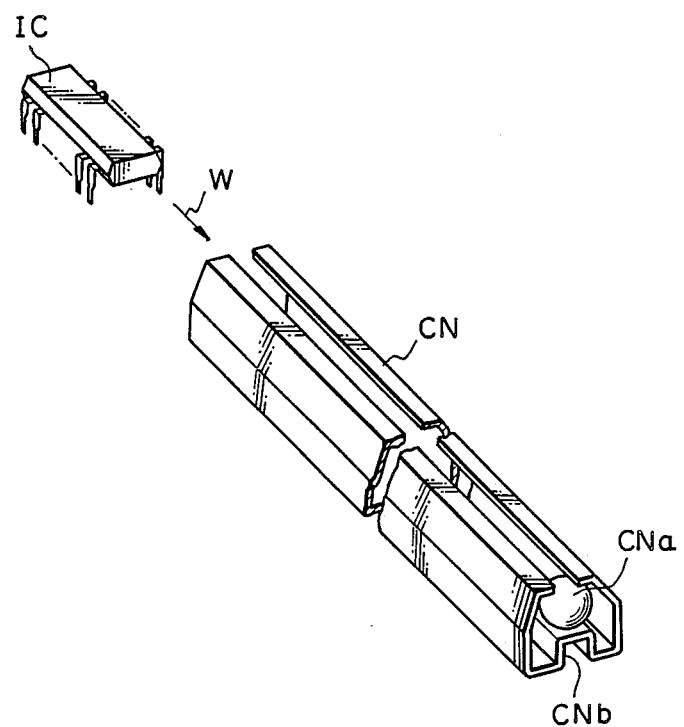
FIG. 51 is a perspective view of an IC and a container.

The container CN is a cylinder having a substantially U-shaped cross section corresponding to that of an IC and having openings at two ends, as shown in FIG. 51. The container CN can receive ICs from its end opening (IC entrance and exit port) and can store them in line. Note that in the illustrated IC unloader D, only one end opening of the container CN is used as an IC entrance, and an IC stopper CNa in the form of, e.g., a rubber ball, for stopping ICs therein is preliminary fitted in the opposite end opening thereof. Although not shown, a similar IC stopper is fitted in the end opening used as the IC entrance at an appropriate time after ICs are stored.

(b) Empty container stock section

As shown in FIGS. 50, 52A, 52B, 53, and 54, the empty container stock section D1 has a pair of columns 410 (in the figures, the column on the front side is denoted by adding reference symbol "F", and the column on the rear side is denoted by adding reference symbol "R"), which are respectively arranged on the front and rear sides along the direction parallel to the IC introduction direction W and are faced to each other. The two end portions of the container CN are held by these columns, so that a plurality of empty containers are stocked to be vertically stacked in at least one row (in the figures, two rows). The empty container stock section D1 has a gate mechanism 420 for successively feeding downward the empty containers from the lower portion, and a means for monitoring the remaining stock amount of empty containers. The respective components will be described below in detail.

Column

Regarding the columns 410, the front one 410(F) and the rear one 410(R) have substantially the same structure. Therefore, the columns will be explained below without being distinguished, except for their differences.

As shown in FIGS. 55 to 58, the column 410 has a groove member 412 in which two parallel guide grooves 411 are vertically formed, so that each guide groove 411 can slidably receive the end portion of the container. The width of each guide groove 411 is wider than that of the container, and band members 413 are arranged on the opening portions of each guide groove, thus defining the width of the guide groove suitable for that of the container. Therefore, another type of container having a different width can be used by exchanging the band members 413.

Figure 57:
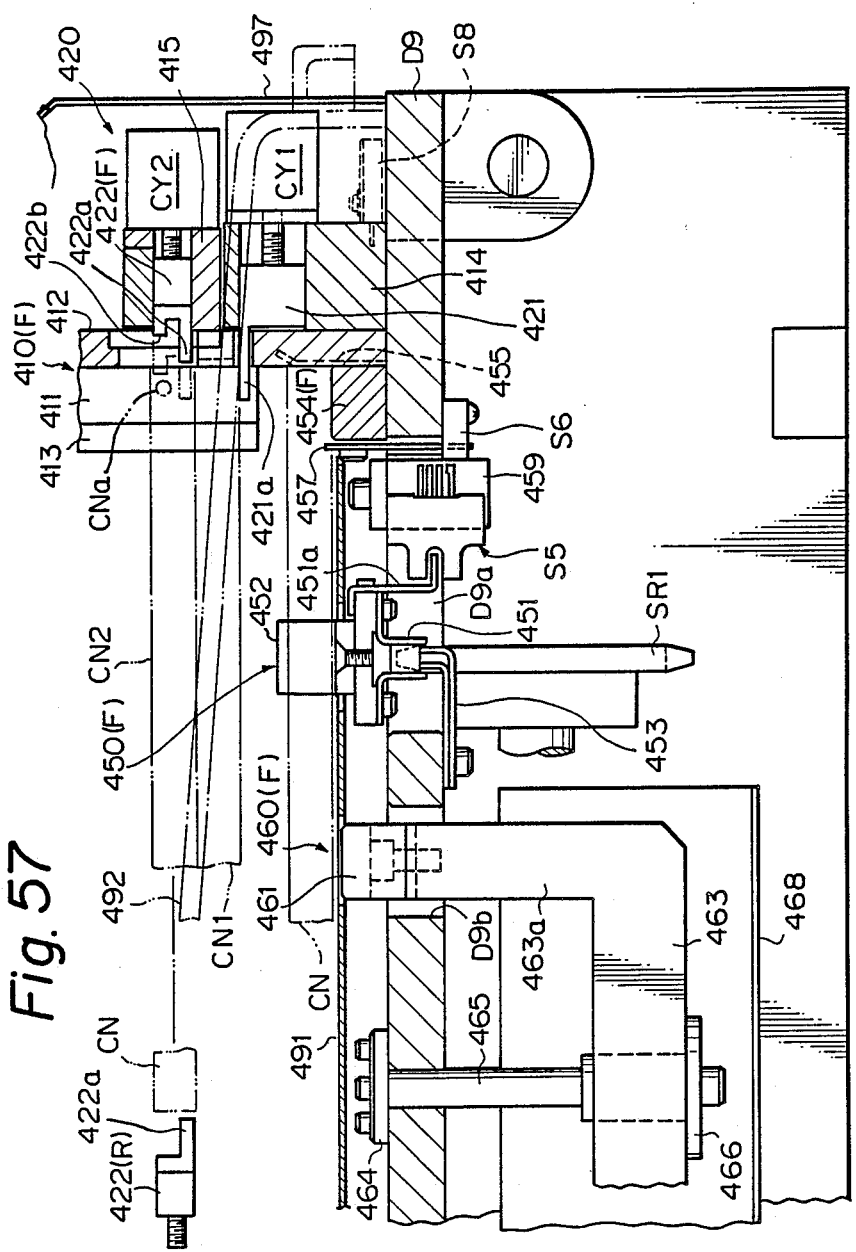
FIG. 57 is an enlarged view of a portion F57 in FIG. 53.

As shown in FIG. 57, the column 410 is vertically and detachably mounted on the base D9 such that the lower end portion of the groove member 412 is fixed to a fixing block 414 by a bolt and the fixing block 414 is in turn fixed to the upper surface of the base D9 by a bolt.

Gate mechanism

The gate mechanism 420 has two stoppers 421 and 422 which are vertically arranged near the lower end portion of the column 410. The lower stopper 421 is slidably arranged in the fixing block 414 of the column 410, and is driven by an air cylinder CY1 mounted on the fixing block 414, so that the tongue-like projection 421a thereof is projected in or retracted from the guide groove 411 of the column 410. The upper stopper 422 is slidably arranged in a block 415 fixed to the column 410 above the fixing block 414, and is driven by an air cylinder CY2 fixed to the block 415, so that a rod-like projection 422a is projected in or retracted from the guide groove 411 of the column 410.

The lower stopper 421 normally is projected in the guide groove 411, and supports the lowermost empty container (CN1) stocked in the guide groove by the bottom surface thereof.

The upper stopper 422 is normally retracted from the guide groove 411. When the stopper 422 projects in the guide groove 411, the projection 422a is inserted as a support in a bottom surface groove CNb of the second lowest container CN2 (FIG. 51).

In this state, when the lower stopper 421 is retracted from the guide groove 411, the lowermost empty container CN1 falls downward. This container CN is then conveyed by conveying section D5, as will be described later.

When the lower stopper 421 again projects in the guide groove 411 and, thereafter, the upper stopper 422 is retracted from the guide groove 411, the second lowest container and the containers thereabove fall and are supported by the lower stopper 421.

Upon operation of the gate mechanism 420 described above, the empty containers stocked in the columns 410 are fed downward one by one (a total of two containers) from the respective stacks of container.

Figure 56:
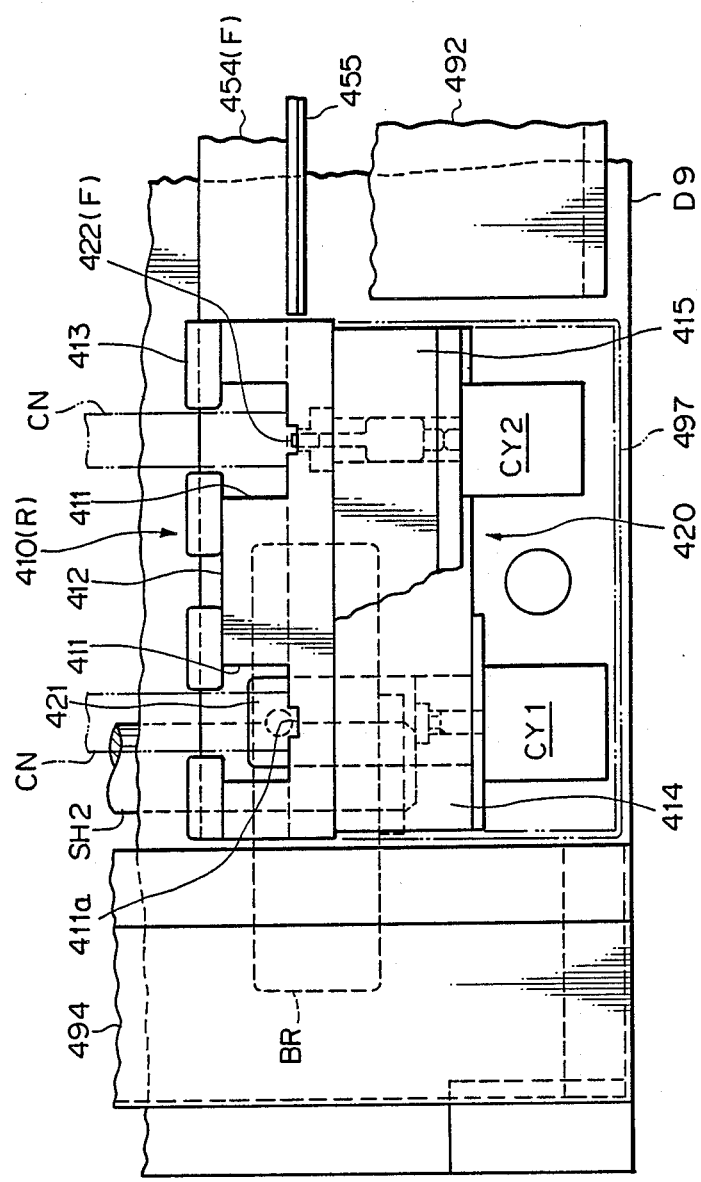
FIG. 56 is an enlarged view of a portion F56 in FIG. 52B.

The front column 410(F) and the rear column 410(R) have slightly different upper stoppers 422 in their gate mechanisms 420. More specifically, as shown in FIG. 57, the upper stopper 422(F) of the front column 410(F) has another small projection 422b above the projection 422a supporting the container. When the upper stopper 422(F) projects in the guide groove 411, the upper projection 422b is inserted in the container to satisfactorily push the IC stopper CNa (FIG. 51) fitted in the container end portion. In relation to this, it is usual that the stopper CNa is manually fitted in a container by a worker before the empty containers are stocked in the stock section. With this method, however, since the stopper CNa is formed of rubber, it cannot be fully fitted in the container but is sometimes left partially projecting therefrom, thus causing a problem in the subsequent container feed operation. The operation described above is carried out in order to solve the above problem. Note that projecting of the stopper CNa causes trouble in the downward movement of the containers along the guide grooves of the columns. This can be eliminated in such a manner that a stopper escape groove 411a is formed in the inner surface of each guide groove 411 of the column 410(F), as shown in FIG. 56.

Contrary to the above, as shown in the upper left corner of FIG. 57, the upper stopper 422(R) of the rear column 410(R) has only the projection 422a for supporting the container since an IC stopper is not fitted in the IC entrance side and the above-mentioned problem will not occur. For the same reason, a stopper escape groove is not formed in the inner surface of the guide grooves 411 of the rear column 410(R), as can be seen from FIG. 55.

Empty container remaining stock amount monitoring means

Figure 58:
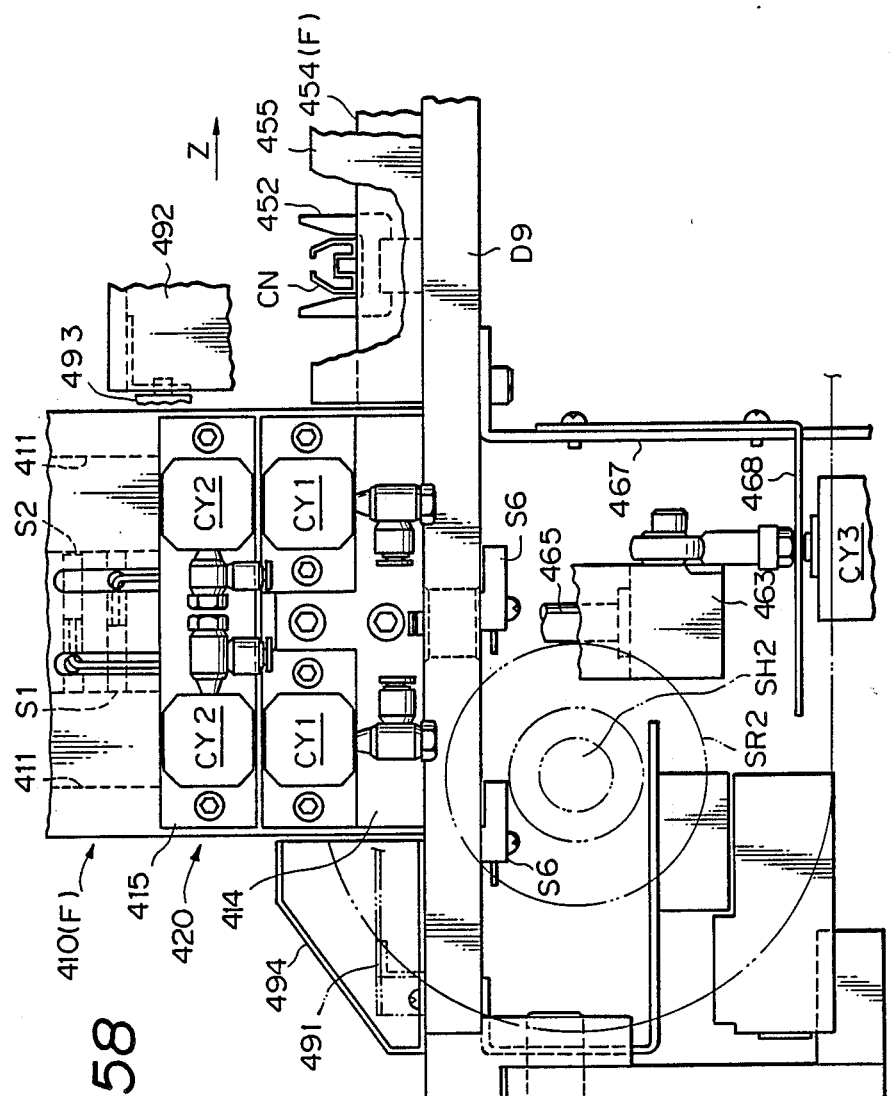
FIG. 58 is an enlarged view of a portion F58 in FIG. 54.

The monitoring means is constituted by, e.g., transmission type photosensors S1 and S2 (in FIG. 58, only light emitting elements are shown) arranged in the lower portion of the front column 410(F), as shown in FIG. 58. The photosensors S1 and S2 detect the presence/absence of the containers in the guide grooves 411. When the container remaining amount is decreased below the sensor position, an alarm device is operated to signal a need for refill of empty containers. In the illustrated embodiments, about 25 containers for each stack (a total of 50 containers) can be stocked in the guide grooves 411 of the columns. The photosensors S1 and S2 are arranged so that when the container remaining amount for each stack is decreased to about five (a total of 10 containers), an alarm is generated.

The photosensors S1 and S2 can be arranged to the rear column 410(R) to monitor the containers by both the columns. However, in practice, it is sufficient that only the front column 410(F) has a monitoring function.

(c) Full container stock section

As shown in FIGS. 50, 52A, 52B, 53, and 54, the full container stock section D3 has a pair of columns 430 (in the figures, the column on the front side is denoted by adding reference symbol F, and the column on the rear side is denoted by adding reference symbol R), which are respectively arranged on the front and rear sides along the direction parallel to the IC introduction direction W and are faced to each other, as in the empty container stock section D1 described above. The two end portions of the container CN are held by these columns, so that a plurality of full containers are stocked to be vertically stacked in at least one row (in the figures, two rows). The full container stock section D3 has a gate mechanism 440 for successively storing therein the full containers from the lower portion, and a means for monitoring the remaining stock amount of full containers. The respective components will be described below in detail.

Column

Regarding the columns 430, the front one 430(F) and the rear one 430(R) have substantially the same structure. Therefore, the columns will be explained below without being distinguished, except for their differences.

As shown in FIGS. 59 to 62, the column 430 has a groove member 432 in which two parallel guide grooves 431 are vertically formed, as in the columns 410 of the empty container stock section D1 described above, so that each guide groove 431 can slidably receive the end portion of the container. The width of each guide groove 431 is wider than that of the container, and band members 433 are arranged on the opening portions of each guide groove, thus defining the width of the guide groove suitable for that of the container. Therefore, another type of container having a different width can be used by exchanging the band members 433.

Figure 61:
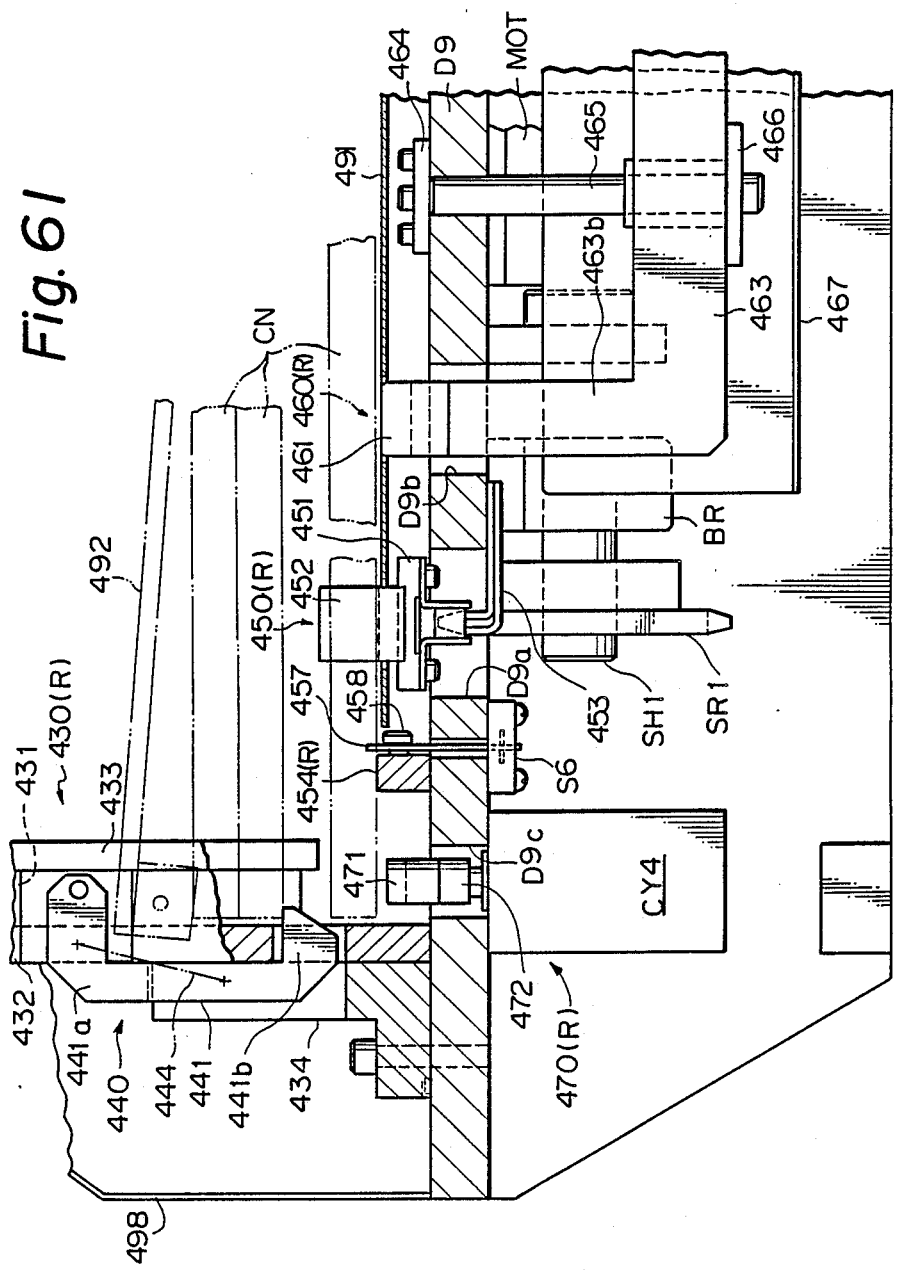
FIG. 61 is an enlarged view of a portion F61 in FIG. 53.

As shown in FIG. 61, the column 430 is vertically and detachably mounted on the base D9 such that the lower end portion of the groove member 432 is fixed to an L-shaped fixing block 434 by a bolt and the fixing block 434 is in turn fixed to the upper surface of the base D9 by a bolt.

Gate mechanism

Figure 62:
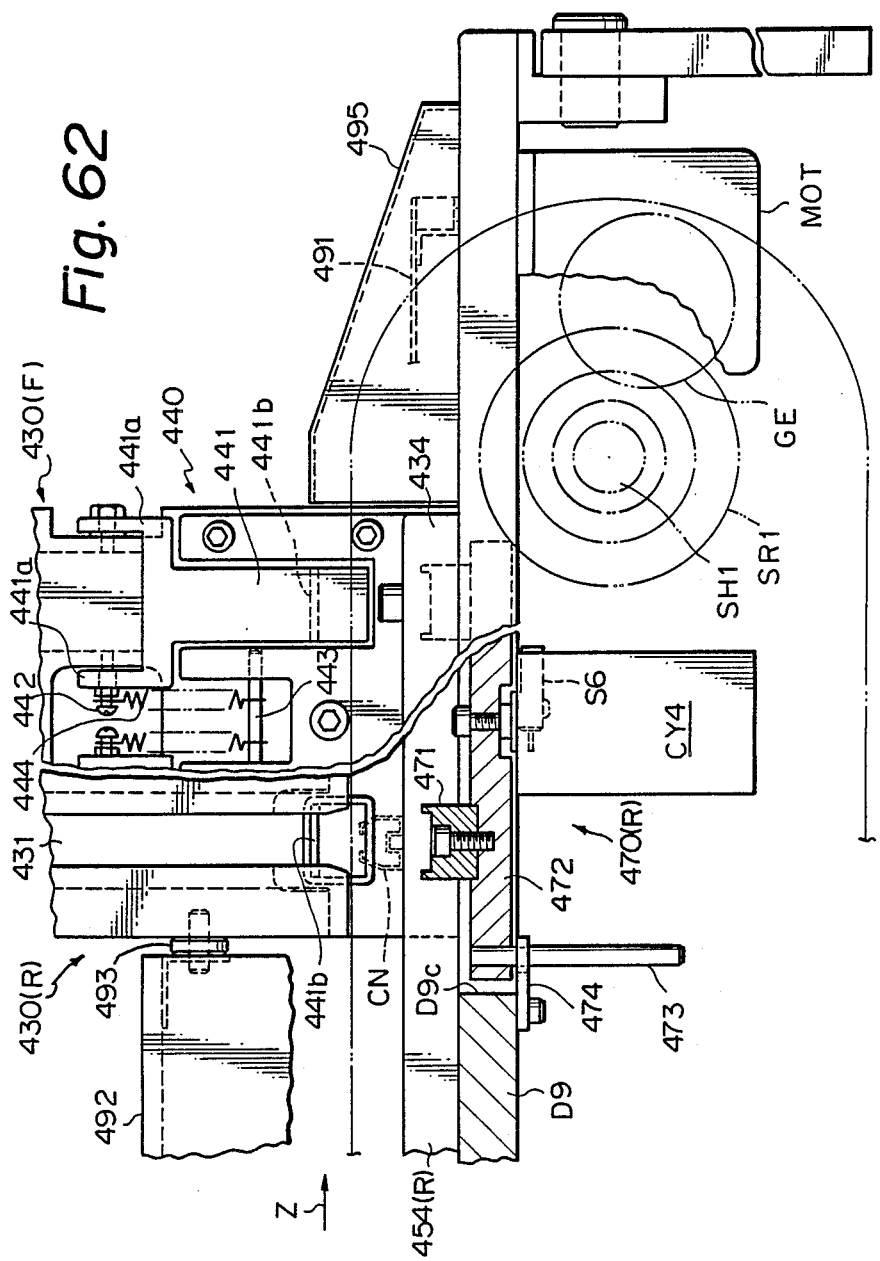
FIG. 62 is an enlarged view of a portion F62 in FIG. 54.

The gate mechanism 440 has pawl levers 441 arranged near the lower end portions of the column 430. Each pawl lever 441 is pivotally supported on the column 430 by right and left upper arms 441a, and a corresponding guide groove 431. As shown in FIG. 62, a tension coil spring 444 is extended between a bolt 442 threadably engaged with each arm 441a of the pawl lever 441 and a pin 443 fixed to the fixing block 434, so that the pawl 441b of the lever 441 is held projected in the guide groove 431 and supports the full container stored in the guide groove 431, as shown in FIG. 61.

When the full container CN is fed to the full container stock section D3 by the container conveying section D5 and is lifted, the pawl 441b of the lever 441 is pushed backward by the container and allows the container to pass therethrough. After the bottom surface of the container has passed the pawl 441b, the pawl 441b again projects in the guide groove 431 under the action of the spring 444 to support the container.

Full container stock amount monitoring means

The monitoring means is constituted by transmission type photosensors S3 and S4 arranged in the upper portion of the front column 430(F), as shown in FIG. 53. The photosensors S3 and S4 are vertically arranged along the guide grooves 431 to detect the presence/absence of the containers at their positions. The lower photosensor S3 detects a state wherein the container stock amount is almost full, and the upper photosensor S4 detects a state wherein the container stock amount is full, so that they operate alarm devices to generate an alarm. In the illustrated embodiment, about 25 containers for each stack (total of 50 containers) can be stocked in the guide grooves 431 of the columns. The lower photosensor S3 is arranged to generate an alarm when the container stock amount for each stack reaches 20 (a total of 40).

Note that the photosensors S3 and S4 can be arranged to the rear column 430(R) to monitor the containers by both the columns. However, in practice, it is sufficient that only the front column 430(F) has a monitoring function.

(d) Container conveying section

As shown in FIGS. 50, 52A, 52B, 53, and 54, the container conveying section D5 has conveyors 450 for carrying a plurality of containers CN arranged horizontally at equal intervals and conveying them from the empty container stock section D1 to the full container stock section D3 via the IC introduction section D8, elevators 460 for receiving empty containers fed from the empty container stock section D1 and loading them on the conveyor 450, lifters 470 for unloading the full containers from the conveyor 460 and storing in the full container stock section D3, and a means for monitoring the container feed operation. Note that two sets of the conveyors 450, the elevators 460, and the lifters 470 are arranged along the IC introduction direction W, and the front and rear sets are distinguished by adding reference symbols "F" and "R", respectively. These components will be described below in detail.

Conveyor

Regarding the conveyors 450, the front one 450(F) and the rear one 450(R) have substantially the same structure, and they will be explained without being distinguished, except their differences.

Figure 52A:
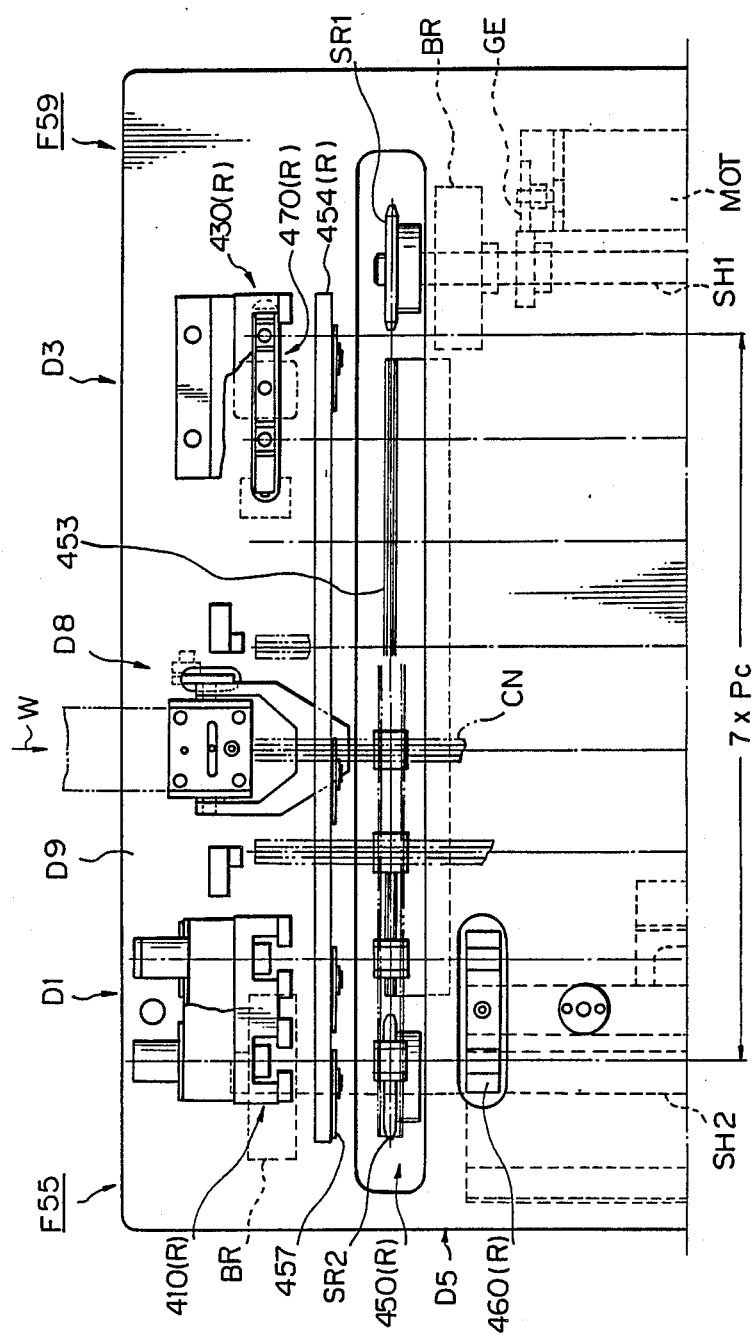
Figure 52B:
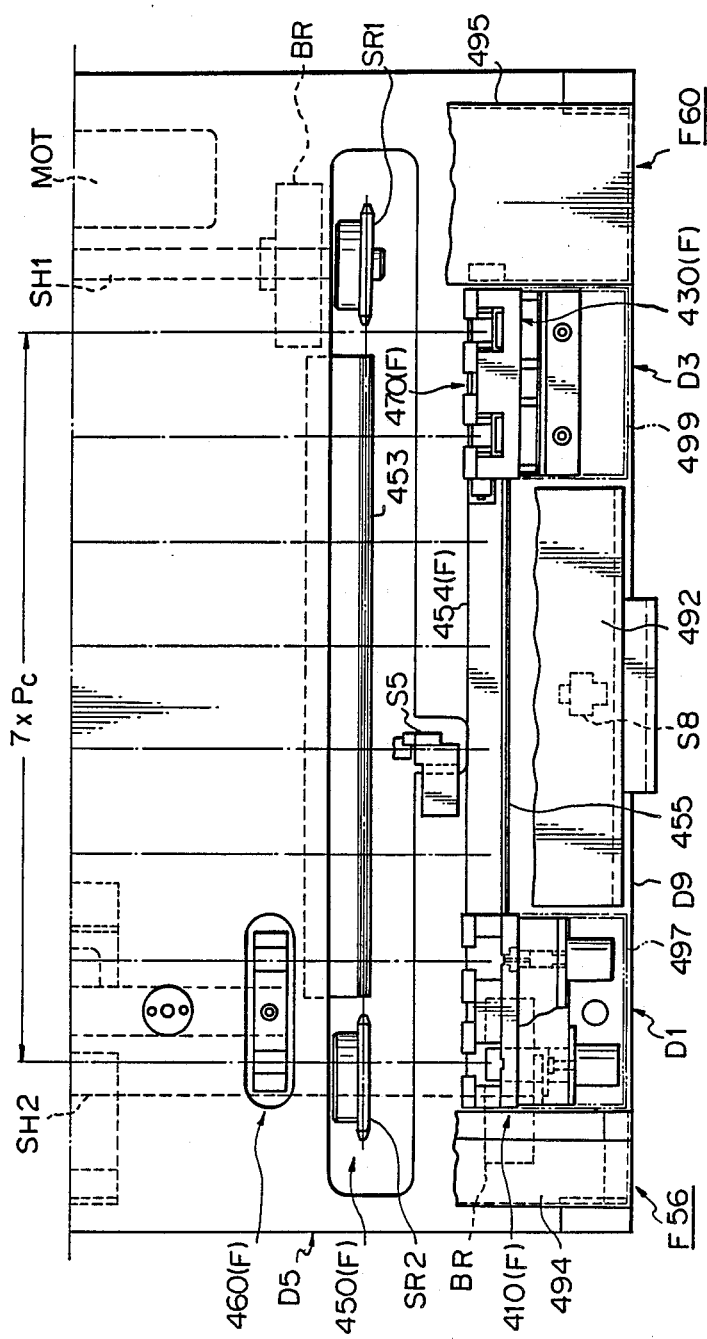

As shown in FIGS. 52A, 52B, 55, 57 to 59, and 61, in each conveyor 450, a chain 451 (see FIGS. 57 and 61) is wound around a pair of sprockets SR1 and SR2 arranged below the base D9, and a plurality of container carriers 452 are detachably arranged on the outer periphery of the chain 451 at equal intervals Pc. The arrangement interval Pc between adjacent container carriers 452 is the same as an interval between the guide grooves 411 or 431 of the columns 410 or 430 of the container stock section D1 or D3. Each container carrier 452 has a U-shaped cross section suited to the container width (FIG. 58). The container carriers 452 at the upper side portion of the chain 451 extend upward from holes D9a of the base 9D, and each carrier can carry one container. In the illustrated embodiment, as shown in FIGS. 52A and 52B, eight containers can be loaded on the conveyor 450 at the same time (six containers only are being during the conveying).

As shown in FIGS. 52A and 52B, the right sprockets SR1 of the front and rear conveyors 450(F) and 450(R) are coupled through a shaft SH1, and the left sprockets SR2 thereof are coupled through a shaft SH2. The shafts SH1 and SH2 are borne by bearings BR fixed to the lower surface of the base D9. When the right shaft SH1 is driven stepwise by a motor MOT through a gear GE, the conveyors 450(F) and 450(R) travel clockwise in FIG. 54 (i.e., the upper side portions of the conveyors 450 travel stepwise in the direction indicated by arrow Z) by the same interval Pc as the container carrier arrangement interval. The containers CN carried on the conveyors 450 are sequentially fed by the distance Pc from the empty container stock section D1 to the full container stock section D3 via the IC introduction section D8.

The stepwise conveying operation of the conveyors 450 (i.e., the stepwise driving operation of the motor MOT) is controlled using a sensor S5 shown in FIGS. 52B and 57. The sensor S5 is fixed to the base D9 through a bracket 459 at a position opposite to the IC introduction section D8 and beside the front conveyor 450(F). A detection plate 451a (FIG. 57) is arranged on the side portion of the chain 451 of the conveyor 450(F) in correspondence with the respective container carriers 452. When the detection plate 451a is detected by the sensor S5, the motor MOT is stopped, and the respective containers are stopped at predetermined positions.

The upper side portion of the chain 451 of each conveyor 450 is guided by guide rails 453 (FIGS. 57 and 61) mounted on the lower surface of the base D9, so as not to be swung horizontally.

The conveyors 450 do not convey the containers by supporting them by the container carriers 452 in practice. The containers are practically supported by container supporting rails 454(F) and 454(R) arranged parallel to the conveyors 450(F) and 450(R) on the upper surface of the base D9, and are carried by the container carriers 452 to slide on the upper surfaces of the rails 454(F) and 454(R).

The base D9 is inclined with respect to the horizontal plate, as described above, and the containers are conveyed in inclined state. Accordingly, a guide plate 455 is arranged on the front supporting rail 454(F) (i.e., on the lower side) between the front columns 410(F) and 430(F) of the container stock sections D1 and D3. When the containers CN are conveyed between these columns, the front end portions of the containers are supported by the guide plate 455 so as not to slide down.

Elevator

Figure 55:
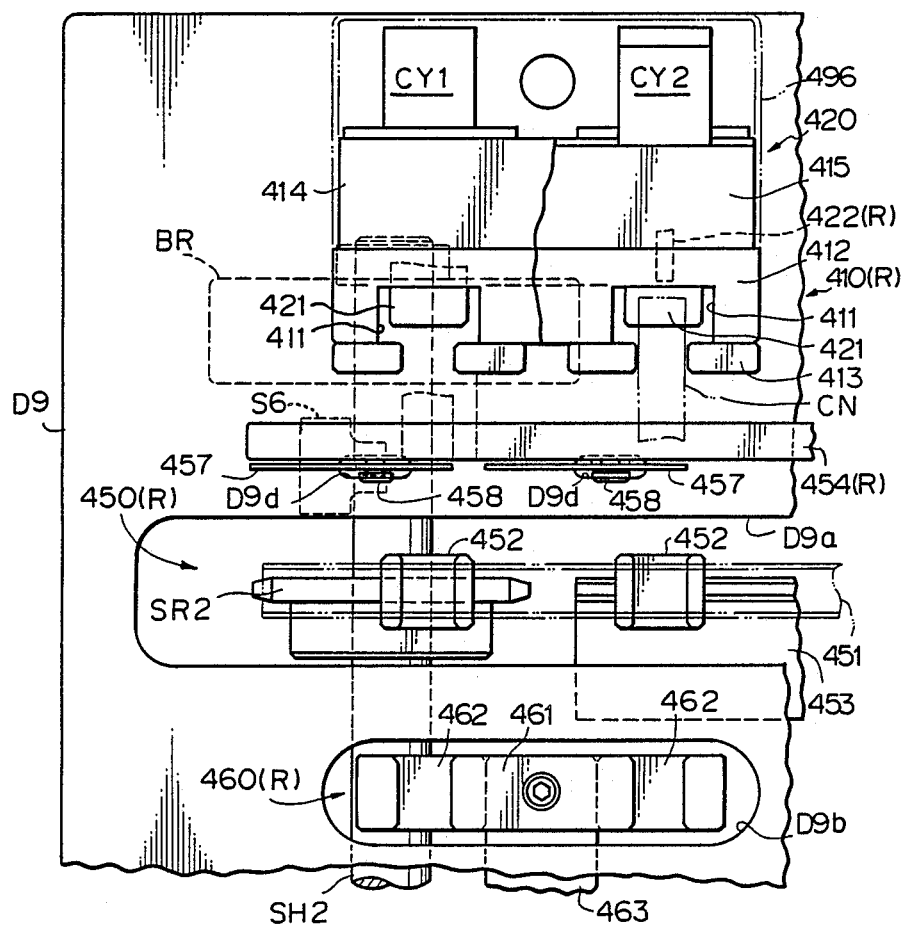
FIG. 55 is an enlarged view of a portion F55 in FIG. 52A.

As shown in FIGS. 55, 57, and 61, the elevators 460(F) and 460(R) have container receiving members 461 in each of which two parallel container receiving grooves 462 are formed. A distance between the container receiving grooves 462 is the same as the interval Pc of the guide grooves 411 of the column 410 of the empty container stock section D1 (i.e., the interval between adjacent container carriers 452 of the conveyor 450). The respective container receiving members 461 are detachably mounted on the upper ends of front and rear arms 463a and 463b of an U-shaped elevator arm 463 (FIG. 53) arranged below the base D9.

The elevator arm 463 is mounted on two guide rods 465 fixed to the base D9 through flanges 464 so as to be vertically movable, and is supported by fixed stoppers 466 at the lower ends of the guide rods 465. As shown in FIGS. 53 and 58, the piston rod of an air cylinder CY3 is coupled to the central portion of the elevator arm 463, and upon operation of the air cylinder CY3, the elevator arm 463, i.e., the container receiving members 461, moves vertically through holes D9b of the base D9. The air cylinder CY3 is mounted on a bracket 467 fixed to the lower surface of the base D9. Note that reference numeral 468 denotes a guard plate for the elevator arm 463.

The elevators 460(F) and 460(R) are arranged at positions corresponding to the columns 410(F) and 410(R) of the empty container stock section D1, and are normally located at their lower positions (in the states shown in the figures). The elevators 460(F) and 460(R) are moved upward immediately before the empty containers are fed from the empty container stock section D1. When the empty containers fall, the elevators receive them by the receiving grooves 462 of the container receiving members 461 and are then moved downward. During this downward movement, the containers are placed on the container supporting rails 454(F) and 454(R) described above, are mounted on the corresponding container carriers 452 of the conveyors 450(F) and 450(R), and are then released from the elevators 460(F) and 460(R).

Lifter

As shown in FIGS. 59 to 62, each of the lifters 470(F) and 470(R) has two container receiving members 471 (FIG. 62) having a groove suited to the container width in their upper portions. The container receiving members 471 are mounted on a common lift plate 472 at the same interval as the interval Pc of the guide grooves 431 of the columns 430(F) and 430(R) of the full container stock section D3 (therefore, the interval between adjacent container carriers 452 of the conveyor 450). The lift plate 472 is coupled to the piston rod of an air cylinder CY4 fixed to the lower surface of the base D9, and is moved vertically through a hole D9c of the base D9 upon operation of the air cylinder CY4.

The lifters 470(F) and 470(R) are arranged immediately below the front and rear columns 430(F) and 430(R) of the full container stock section D3, respectively, and are normally located at their lower positions shown in FIG. 61 or 62. When the full containers CN are conveyed to the position of the columns 430 by the conveyors 450, the lifters 470 are moved upward, push up the containers CN by the container receiving members 471 to a level higher than that of the pawls 441b of the pawl levers 441 of the gate mechanism 440, and are then returned to their initial positions. In this manner, the full containers CN are stored in the guide grooves 431 of the columns 430, and are held by the pawl levers 441.

As shown in FIG. 62, the lift plate 472 is guided by a guide pin 473 fixed on one end thereof to face downward and a guide plate 474 fixed to the lower surface of the base D9 so as not to be swung horizontally during the lift operation.

Figure 60:
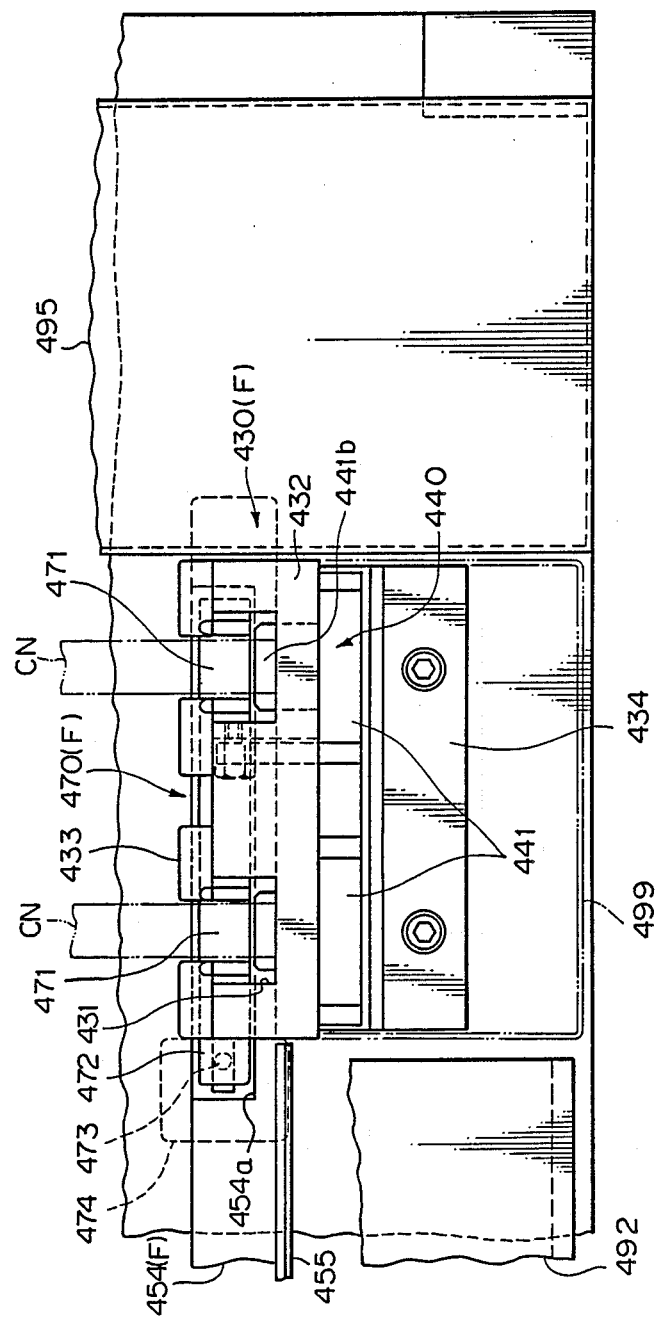
FIG. 60 is an enlarged view of a portion F60 in FIG. 52B.

As shown in FIG. 60, since the front lifter 470(F) overlaps the container supporting rail 454(F) vertically, a notch 454a is formed in the rail 454(F).

Container feed monitoring means

The monitoring means monitors the loading of empty containers to the conveyors 450 by the elevators 460, the conveyance of containers by the conveyors 450, and the storage of full containers by the lifters 470. As shown in FIGS. 52A, 55, 57, 59, 61, and 63, a plurality of substantially T-shaped levers 457 are arranged on the container supporting rails 454(F) and 454(R), and movement of the levers 457 is detected by a sensor S6 fixed to the lower surface of the base D9.

Figure 63:
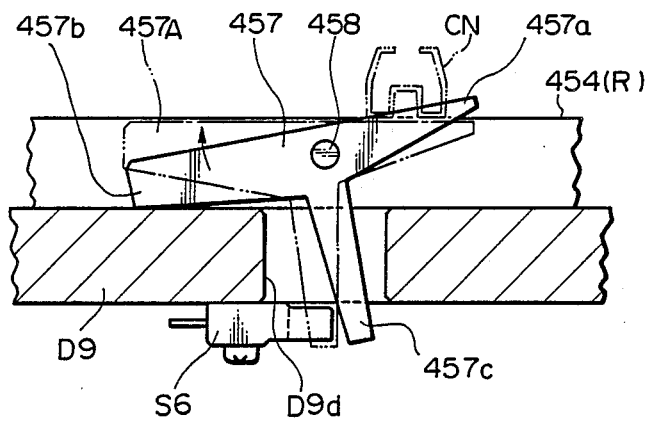
FIG. 63 is an enlarged view of a portion F63 in FIG. 54 showing a container feed monitoring means; and, FIGS. 64, 65, and 66 are, respectively, a plan view, a partially sectional left-side view, and a partially sectional rear view of an IC introduction section.

As shown in FIG. 63, each lever 457 has three arms 457a, 457b, and 457c, and is pivotally supported on the container supporting rail 454(F) or 454(R) by a pin 458, with the arm 457c extending downward through a hole D9d of the base D9. The upper second arm 457d is made heavier than the first arm 457a. Therefore, the lever 457 is normally placed in an inclined state wherein the second arm 457a falls down onto the base D9 and the distal end portion of the first arm 457a projects beyond the container supporting surface of the container supporting rail 454(F) or 454(R), as indicated by the solid lines. In this state, the third arm 457c is out of the sensor S6.

When the container CN rides on the distal end portion of the first arm 457a, as shown in FIG. 63, the lever 457 is pivoted to a horizontal state due to the weight of the container CN, as indicated by an imaginary line 457A. At this time, the third arm 457c is detected by the sensor D6, thus the presence of the container CN is detected.

Figure 59:
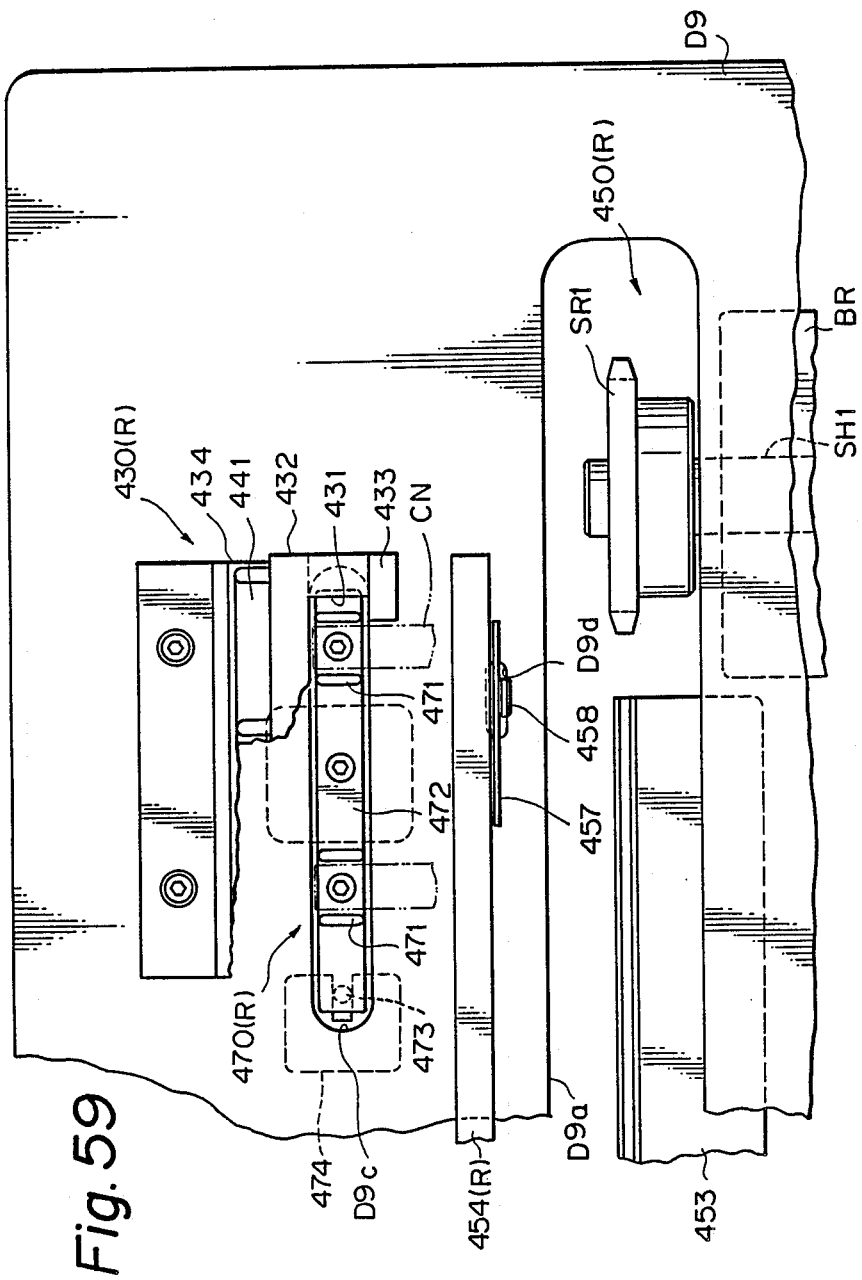
FIG. 59 is an enlarged view of a portion F59 in FIG. 52A.

As clearly shown in FIG. 52A, the levers 457 are arranged at positions corresponding to the two guide grooves 411 of the empty container stock section D1 (FIG. 55), a position corresponding to the IC introduction section D8, and a position corresponding to the right guide groove 431 of the full container stock section D3 (FIG. 59). With this arrangement, whether or not an empty container is loaded on the conveyors 450, whether or not an empty container is conveyed to the IC introduction section D8, and whether or not a full container is conveyed to the full container stock section D3, are detected.

(e) IC introduction section

The IC introduction section D8 is arranged between the empty container stock section D1 and the full container stock section D3, as shown in FIG. 52A, and comprises a chute 480 (indicated by two dotted lines) for feeding ICs from the bending press C, a gate mechanism for opening and closing the IC exit of the chute, and a means for monitoring IC clogging at the IC entrance of the container. These components will be described below in detail.

Chute

Figure 66:
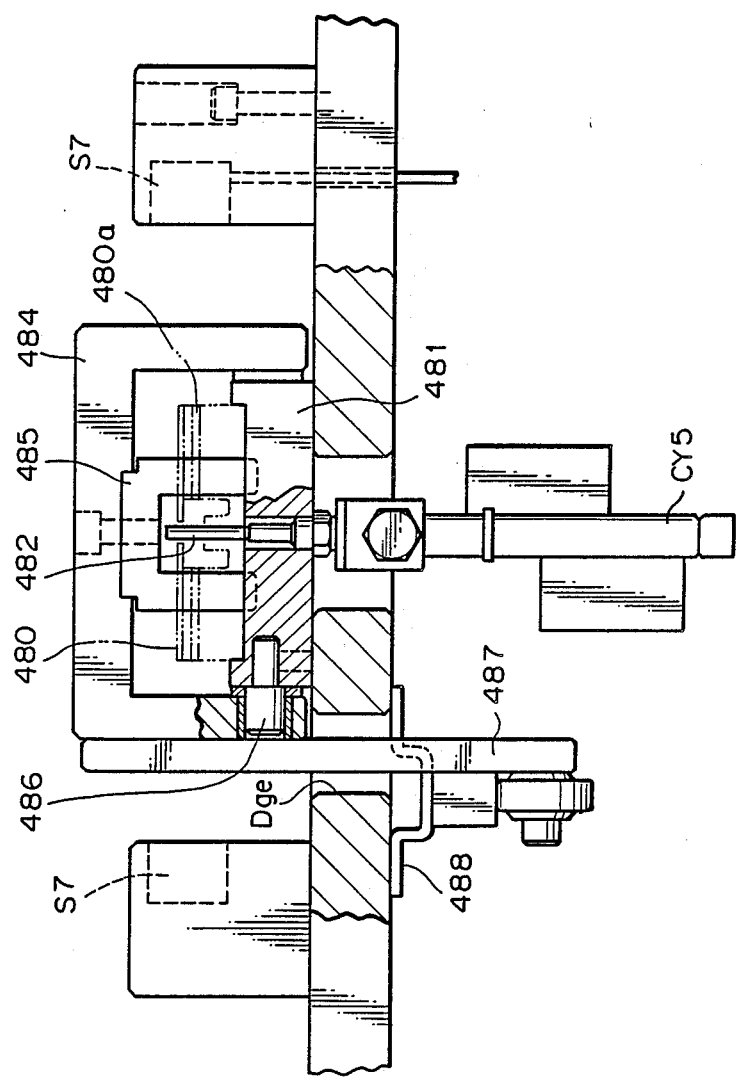

The chute 480 is a rail having a flat sectional shape, as shown in FIG. 66, and has an IC path therein to feed ICs by means of gravity. A base plate 481 is detachably mounted on the upper surface of the base D9 by a bolt, and the IC exit end portion of the chute 480 is fitted in the upper groove of the base plate 481 and is fixed by a screw.

Gate mechanism

Figure 64:
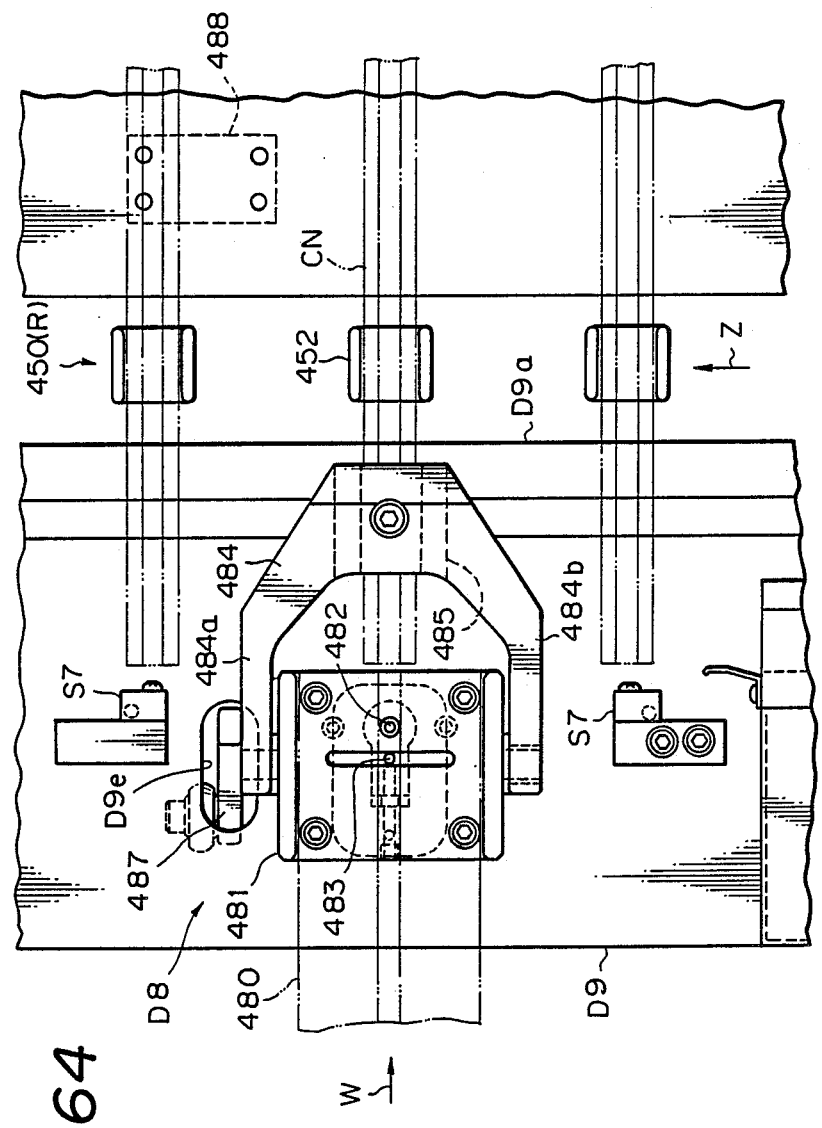

The gate mechanism has a stopper pin 482 extending through the bottom wall of the chute 480 and the plate 481, as shown in FIGS. 64 and 66. The stopper pin 482 is projected in or retracted from the IC path of the chute 480 by an air cylinder CY5 arranged below the base D9, so as to open the IC exit of the chute when the IC introduction into the container is started and close it when the IC storage is completed.

As shown in FIG. 64, an air hole 483 is formed in front of the stopper pin 482 of the base plate 481. The air hole is selectively connected to a compressed air source and a vacuum source through a solenoid valve (not shown). When the stopper pin 482 is projected in the chute 480 to close the IC exit, a vacuum is applied to the air hole 483, thus weakening impact of an IC against the stopper pin 482. On the other hand, when the IC exit is opened to restart IC storage compressed air is ejected from the air hole 483 to feed the IC.

Container positioning mechanism

Figure 65:
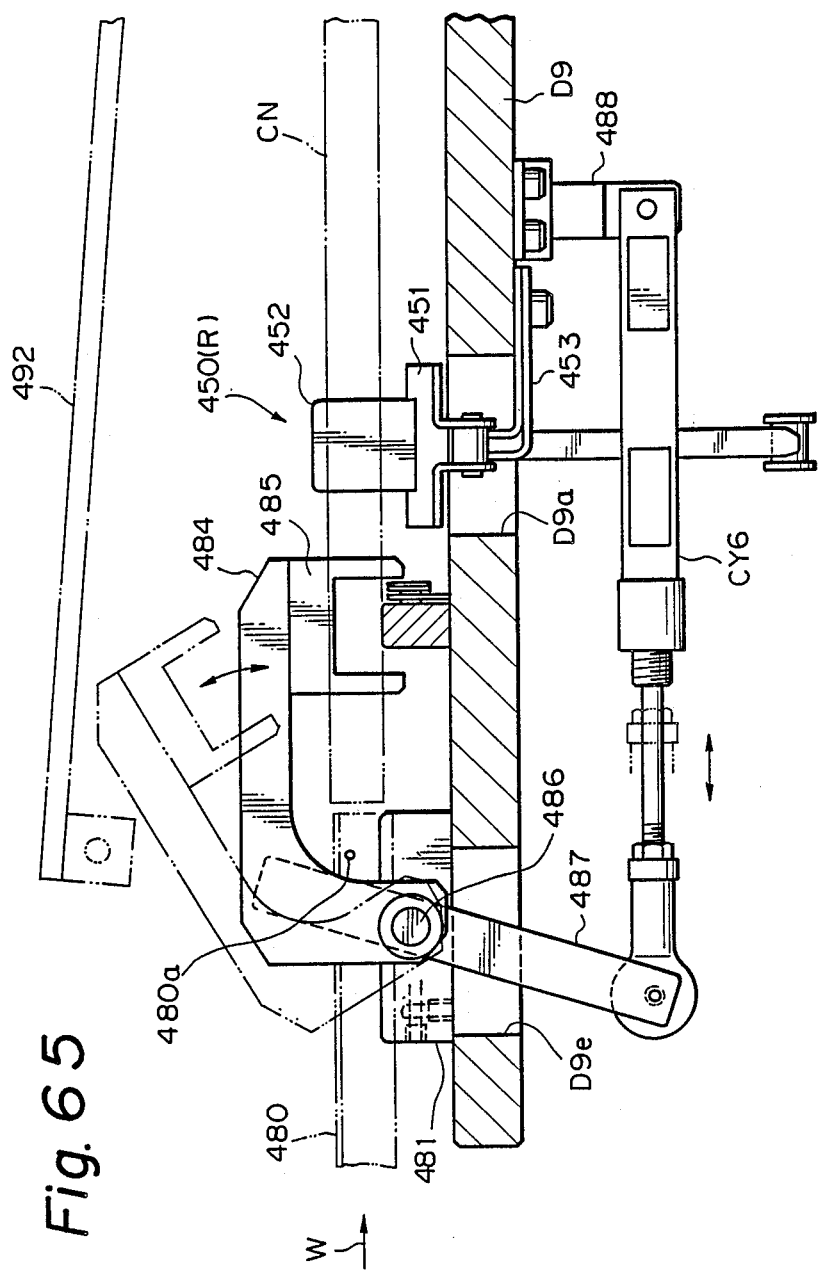

This mechanism has a U-shaped lever 484. Two arms 484a and 484b of the lever 484 are pivoted on the two side plates of the base plate 481 by pins 486 to be vertically rotatable, as shown in FIG. 65. One arm 484a of the lever 484 has a coupling plate 487 fixed thereto, the other end of which extends through a hole D9e of the base D9 and is coupled to the piston rod of an air cylinder CY6 supported by a bracket 488 below the base D9. Upon operation of the air cylinder CY6, the lever 484 is opened and closed between its upper position (indicated by the solid line) and its lower position (indicated by two dotted line).

A U-shaped container holding member 485 suited to the container width is detachably mounted on the lower surface of the distal end portion of the lever 484. The lever 484 is opened upward so as not to obstruct the container conveyance and is closed downward when the container has been conveyed to the IC introduction section D8 so as to hold the container from the above by its container holding member 485, thereby positioning the IC entrance of the container to coincide with the IC exit of the chute 480. Thus, when the gate mechanism (i.e., the stopper pin 482) is opened, ICs are introduced and stored from the chute 480 in the container.

IC clogging monitoring means

In this monitoring means, a light emitting section and a light receiving section of a transmission type photosensor S7 are arranged on two sides of the plate 481, and light emitted from the light emitting section passes through a hole 480a (FIG. 66) formed in the chute 480 near its IC exit and is received by the light receiving section. When ICs clog in the IC exit of the chute due to container drift, light of the sensor is shut off by the IC, thus detecting IC clogging.

The IC storage operation of the IC unloader D is performed as follows.

(i) Empty containers are inserted from the upper end opening portions of the guide grooves 411 of the columns 410(F) and 410(R) to be stocked in the empty container stock section D1. In this embodiment, 25 containers for each stack (a total of 50 containers) can be stocked.

(ii) The empty containers in the empty containers stock section D1 are fed downward by two (one from each pair of the guide grooves 411) by the gate mechanism 420, and are loaded on the container carriers 452 of the conveyors 450 by the elevators 460 of the container conveying section D5. The feeding operation of the empty containers from the empty container stock section D1 and the loading operation onto the conveyors 450 is performed once per two-step conveyance (2Pc) of the conveyors 450.

Whether or not the empty containers are loaded on the conveyors 450 is checked by the container feed monitoring means (the levers 457 and the sensor S6). Immediately before the empty container feed operation, the IC stopper CNa fitted in the front end portion of the container is pushed in by the upper stopper 422 of the gate mechanism 420. The stock remaining amount of the empty containers is monitored by the monitoring means (photosensors S1 and S2), and when the remaining amount reaches five for each stack, an alarm for signaling a need for refill of containers is generated.

(iii) The empty containers loaded on the conveyors 450 are conveyed stepwise by the distance Pc, and are sequentially conveyed to the IC introduction section D8.

(iv) When an empty container has been conveyed, the IC introduction section D8 closes the positioning mechanism (the lever 484 and the container holding member 485) to position the container with respect to the chute 480, and opens the gate mechanism (the stopper pin 482) to start IC introduction from the chute 480 into the container. After completion of IC storage, the section D8 closes the gate mechanism to stop IC introduction, and opens the positioning mechanism to release the container.

Note that IC clogging at the IC entrance due to container drift is detected by the monitoring means (sensor S7).

The feed operation of the empty containers from the empty container stock section and the loading operation thereof onto the conveyors are performed parallel to IC storage at the IC introduction section.

(v) Full containers storing ICs are conveyed stepwise by the conveyors 450 by the distance Pc and are sequentially conveyed to the full container stock section D3.

(vi) The full containers conveyed to the full container stock section D3 are lifted by the lifters 470 to be unloaded from the conveyors 450, and are stored in the guide grooves 431 of the columns 430(F) and 430(R) to be stocked in the columns by the action of the gate mechanism 440. The storage operation of the full containers is simultaneously performed for two containers once per two-step conveyance (2Pc) of the conveyors 450. In this embodiment, 25 full containers for each stack (a total of 50 containers) can be stocked. The stock amount of the full containers is monitored by the monitoring means (sensors S3 and S4) and alarms for signaling an almost full state and a full state are generated.

The full containers stocked in the full container stock section D3 can be taken out of the upper ends of the columns 430(F) and 430(R).

Note that the full container storage operation in the full container stock section is performed parallel to the IC storage operation (iv) in the IC introduction section.

Furthermore, the structure of the IC unloader D other than those described above is described below.

First, protection covers are provided to the principal operating portions of the sections D1, D3, D5, and D8. A protection cover 491 is provided for covering almost all the container conveyance region between the upper surface of the base D9 and the container conveyance plane (FIGS. 57, 58, 61, and 62). The cover 491 is fixed to the upper surface of the base D9, so that the level of the upper surface of the cover 491 is set to be slightly lower than that of the container supporting rails 454(F) and 454(R) to provide a small gap between itself and the bottom surface of the conveyed container. The cover 491 prevents the intrusion of foreign materials into the container conveyance region from below which will interfere with the container conveyance or damage the containers, and also prevents the intrusion of foreign materials from above which may cause problems in the operation of the respective mechanisms of the container conveying section.

A protection cover 492 is provided for covering the container conveyance region between the container stock sections D1 and D3 from above (FIGS. 52B, 53, 57, 58, 61, 62, and 65). As best shown in FIGS. 59 and 62, the cover 492 is pivotally supported on the rear columns 410(R) and 430(R) of the container stock sections D1 and D3 through pins 493 to be vertically openable and closable. A sensor S8 (FIGS. 52B and 57) for detecting opening and closing of the cover 492 is arranged on the front side of the base D9. When the cover 492 is opened, the IC unloader D and thus the entire IC sheet processing apparatus, is stopped.

Covers 494 to 499 are arranged on the surrounding portions of the lower portions of the containers stock sections D1 and D3 (FIGS. 52B, and 53 to 62).

Next, in the structure of the above embodiment, the components of the sections D1, D3, D5, and D8 associated directly with the shapes and dimensions of ICs and containers are exchangeable with other components. In the containers stock sections D1 and D3, the columns 410 and 430 can be exchanged with those whose guide grooves 411 and 430 have the widths suitable for the container width. In this case, since the columns 410 and 430 can be exchanged together with the gate mechanisms 420 and 440 and the sensors (S1 to S4), containers having a different height can be used. Note that if containers have a slightly different width, only the band members 413 and 433 of the columns 410 and 430 need be exchanged to change the guide groove width.

In the container conveying section D5, the container carriers 452 of the conveyors 450, the container receiving members 461 of the elevators 460, and the container receiving members 471 of the lifters 470 can be exchanged with those suitable for the container width.

In the IC introduction section D8, the chute 480 can be exchanged with one suitable for the dimensions of ICs, and the container holding member 485 of the container positioning mechanism with one suitable for the container width. Upon exchange of the chute 480, the position of the sensor S7 can be changed if necessary.

With the above-mentioned exchange of the respective components, the IC unloader can be used to store different types of ICs into different types of containers, thereby resulting in high compatibility.

In the above-mentioned exchangeable components, portions not related to the container dimensions, in particular, the mounting portions, are made common regardless of the types of containers and ICs. Therefore, the exchange operation can be standardized and can be quickly and easily carried out even by an unskilled operator.

The IC unloader described above has the following advantages.

Since the empty and full container stock sections have the structure in which containers are stocked to be vertically stacked, a large number of containers can be stocked, and the automatic operation of the IC unloader D (therefore, of the IC sheet processing apparatus) for a long period of time can be realized. Therefore, an unmanned operation, or a labour-saving operation in which a single operator manages a plurality of systems, are allowed, thus greatly improving productivity and labour-saving.

The operation of conveying empty containers to the IC introduction section, the operation of storing ICs into containers in the IC introduction section, and the operation of conveying full containers to the full container stock section can be efficiently and quickly performed in accordance with the specific structures and operations of the empty container stock section, the full container stock section, the container conveying section, and the IC introduction section. Therefore, a high-speed operation is allowed, thus realizing a high productivity. In particular, as described above, the operation of loading empty containers onto the conveyors in the empty container stock section, the operation of storing ICs into containers in the IC introduction section, and the operation of storing full containers in the full container stock section can be performed at the same time while the conveyors are stopped, thus minimizing down time, and resulting in a high efficiency.

In particular, with the structure shown in the figures, a compatibility with the storage of different types of ICs can be obtained by simply exchanging components, as described above. This is very advantageous in view of the cost for plant and equipment investment.

In the above embodiment, the IC unloader is used for storing ICs sent from the IC bending press. However, the IC unloader itself can be used for storing ICs sent from a different type of apparatus, e.g., an IC test apparatus.

We claim:

1. An IC sheet processing apparatus for performing a series of individual and different machining operations on an IC sheet comprising a plurality of ICs coupled to a lead frame, said apparatus comprising:
   a plurality of types of individual press molds for performing a series of individual and different machining operations, each said press mold including a punch and a die adapted for performing an individual, respective machining operation on an IC sheet;
   an IC sheet feed mechanism for feeding the IC sheet stepwise through the apparatus;
   a common die set holding structure for separately and detachably mounting the press molds and the feed mechanism to present the press molds and feed mechanism as a single press mold unit;
   a press table; and
   a press ram,
   said common die set holding structure including a die holder and a punch holder, said dies being detachably mounted in the die holder to present a lower mold and said punches being detachably mounted on the punch holder to present an upper mold, said upper mold being disengageably coupled to the press ram and said lower mold being detachably fixed to said press table, said IC sheet feed mechanism being detachably mounted on the lower mold;
   said press ram being operable for moving the upper mold vertically toward and away from the lower mold, said IC sheet feed mechanism comprising,
   an IC sheet guide extending along an IC sheet feed path for horizontally supporting and guiding the IC sheet as it moves through the apparatus, said IC sheet guide being mounted on the lower mold for vertical movement upon vertical movement of the upper mold, and
   a feed rod arranged above the IC sheet guide and having a feed pin which is engageable and disengageable with a feed hole in the IC sheet, said feed rod being reciprocal for a distance equal to an IC sheet feed interval in a direction parallel to the IC sheet feed direction.

2. An IC sheet processing apparatus as set forth in claim 1 wherein said feed rod is swingable upwardly from a predetermined position in which the feed pin is engaged in a feed hole of the IC sheet, said IC sheet mechanism further comprising an electrical detection circuit for detecting that the feed rod has swung upwardly from said predetermined position.

3. An IC sheet processing apparatus for performing a series of individual and different machining operations on an IC sheet comprising a plurality of ICs coupled to a lead frame, said apparatus comprising:
   a plurality of types of individual press molds for performing a series of individual and different machining operations, each said press mold including a punch and a die adapted for performing an individual, respective machining operation on an IC sheet;
   an IC sheet feed mechanism for feeding the IC sheet stepwise through the apparatus; and
   a common die set holding structure for separately and detachably mounting the press molds and the feed mechanism to present the press molds and feed mechanism as a single press mold unit,
   said IC sheet feed mechanism comprising a waste sheet ejector for ejecting a waste sheet from which ICs have been separated, said waste sheet ejector comprising an eject roller in contact with one surface of the waste sheet, a pressing roller which is in contact with the other surface of the waste sheet to urge the waste sheet against the eject roller, and a motor for rotating said eject roller at high speed.

4. An IC sheet processing apparatus for performing a series of individual and different machining operations on an IC sheet comprising a plurality of ICs coupled to a lead frame on which terminals and tie bars are formed, said apparatus comprising:
   a plurality of types of individual press molds for performing a series of individual and different machining operations, each said press mold including a punch and a die adapted for performing an individual, respective machining operation on an IC sheet;
   an IC sheet feed mechanism for feeding the IC sheet stepwise through the apparatus; and
   a common die set holding structure for separately and detachably mounting the press molds and the feed mechanism to present the press molds and feed mechanism as a single press mold unit.

at least one of said press molds being adapted for finally punch cutting the tie bars to separate ICs from the lead frame, and at least another of said press molds being positioned ahead of the tie bar cutting press mold and being adapted for forming pinches in corresponding cutting portions of the tie bars.

* * * * *

UNITED STATES PATENT AND TRADEMARK OFFICE
CERTIFICATE OF CORRECTION

PATENT NO. : 4,972,572                    Page 1 of 3

DATED     : November 27, 1990

INVENTOR(S) : TATSUO KIMURA et al.

It is certified that error appears in the above-identified patent and that said Letters Patent is hereby corrected as shown below:

ON TITLE PAGE: [57] ABSTRACT

Line 15, "aboved" should be --above--.

Col. 1,    line 15, change "process" to --procedure--;
line 16, change "of" (first occurrence) to --for--;
line 22, change "through" to --using--;
lines 41 and 42, change "for changing feeding intervals" to --changing of intervals--.

Col. 2,    line 8, delete "has".

Col. 5,    lines 17 and 18, change "invents" to --prevents--;
line 28, change "p" to --$\underline{p}$--;
line 59, change "p" to --$\underline{p}$--.

Col. 6,    line 3, delete "an".

Col. 7,    line 10, change "a and b" to --$\underline{a}$ and $\underline{b}$--;
line 12, change "d and f" to --$\underline{d}$ and $\underline{f}$--;
line 13, change "c" to --$\underline{c}$--;
line 14, change "e" to --$\underline{e}$--;
line 18, change "c" to --$\underline{c}$--.

Col. 11,    line 2, change "g" to --$\underline{g}$--;
line 20, change "h" to --$\underline{h}$--;
line 23, change "i" to --$\underline{i}$--;
line 33, change "j" to --$\underline{j}$--;
line 42, change "is" to --if--;
line 43, change "AAA" to --MA--.

UNITED STATES PATENT AND TRADEMARK OFFICE
CERTIFICATE OF CORRECTION

PATENT NO. : 4,972,572

DATED : November 27, 1990

INVENTOR(S) : TATSUO KIMURA et al.

It is certified that error appears in the above-identified patent and that said Letters Patent is hereby corrected as shown below:

Col. 12, line 23, change "k" to --$\underline{k}$--;
line 29, change "l" to --$\underline{l}$--;
line 33, after "on" insert --the first elevator 31 to be supported thereby--;
line 37, change "m" to --$\underline{m}$--;
line 38, change "x" to --$\underline{x}$--;
line 42, change "y" to --$\underline{y}$--;
line 45, change "n" to --$\underline{n}$--;
line 56, change "c, k, x" to --$\underline{c}$, $\underline{k}$, $\underline{x}$--, change "n" to --$\underline{n}$--.

Col. 13, line 1, change "can be" to --is--;
line 20, change "126a" to --12a--;
line 31, change "magazine" to --magazines--.

Col. 18, line 54, change "p" to --$\underline{p}$--;
line 56, change "p" to --$\underline{p}$--.

Col. 20, line 23, change "p" to --$\underline{p}$--;.

Col. 26, line 48, change "g" to --$\underline{g}$--.

Col. 32, line 9, change "441a, and the" to --441a and the lower pawl 441b is projected in or retracted from the--.

UNITED STATES PATENT AND TRADEMARK OFFICE
CERTIFICATE OF CORRECTION

PATENT NO. : 4,972,572

DATED : November 27, 1990

INVENTOR(S) : Tatsuo Kimuir, et al.

It is certified that error appears in the above-identified patent and that said Letters Patent is hereby corrected as shown below:

Col. 40, line 26, after "1" insert --,--.

Signed and Sealed this

Eighteenth Day of August, 1992

Attest:

DOUGLAS B. COMER

*Attesting Officer*   *Acting Commissioner of Patents and Trademarks*